(12) United States Patent
Nakano

(10) Patent No.: US 9,184,286 B2
(45) Date of Patent: Nov. 10, 2015

(54) SEMICONDUCTOR DEVICE HAVING A BREAKDOWN VOLTAGE HOLDING REGION

(75) Inventor: Yuki Nakano, Kyoto (JP)

(73) Assignee: ROHM CO., LTD., Kyoto (JP)

(*) Notice: Subject to any disclaimer, the term of this patent is extended or adjusted under 35 U.S.C. 154(b) by 71 days.

(21) Appl. No.: 13/983,157

(22) PCT Filed: Feb. 1, 2012

(86) PCT No.: PCT/JP2012/052285
§ 371 (c)(1),
(2), (4) Date: Aug. 1, 2013

(87) PCT Pub. No.: WO2012/105609
PCT Pub. Date: Aug. 9, 2012

(65) Prior Publication Data
US 2013/0313635 A1 Nov. 28, 2013

(30) Foreign Application Priority Data

Feb. 2, 2011 (JP) .................................. 2011-020731
Oct. 11, 2011 (JP) .................................. 2011-224119

(51) Int. Cl.
*H01L 29/66* (2006.01)
*H01L 29/78* (2006.01)
(Continued)

(52) U.S. Cl.
CPC ........ *H01L 29/7827* (2013.01); *H01L 21/8213* (2013.01); *H01L 29/41766* (2013.01);
(Continued)

(58) Field of Classification Search
CPC ............ H01L 2924/00; H01L 29/2003; H01L 29/1608; H01L 2924/00014; H01L 2924/13091; H01L 2224/73265; H01L 29/66462; H01L 2224/32225; H01L 2224/48227; H01L 2924/00012; H01L 2924/12032; H01L 29/872
See application file for complete search history.

(56) References Cited

U.S. PATENT DOCUMENTS

| 5,614,749 | A | 3/1997 | Ueno |
| 5,621,234 | A | 4/1997 | Kato |
| 5,693,569 | A | 12/1997 | Ueno |
| 2004/0217358 | A1 | 11/2004 | Kaneko |
| 2005/0218472 | A1* | 10/2005 | Okada et al. .................. 257/471 |

(Continued)

FOREIGN PATENT DOCUMENTS

| JP | H02-082580 | 3/1990 |
| JP | H05-102487 | 4/1993 |

(Continued)

*Primary Examiner* — Robert Bachner
(74) *Attorney, Agent, or Firm* — Rabin & Berdo, P.C.

(57) ABSTRACT

A semiconductor device of the present invention is a semiconductor device having a semiconductor layer comprising a wide band gap semiconductor, wherein the semiconductor layer includes: a first conductivity-type source region, a second conductivity-type channel region and a first conductivity-type drain region, which are formed in this order from the surface side of the semiconductor layer; a source trench lying from the surface of the semiconductor layer through the source region and the channel region to the drain region; a gate insulating film formed so as to contact the channel region; a gate electrode facing the channel region with the gate insulating film interposed therebetween; and a first breakdown voltage holding region of a second conductivity type formed selectively on the side face or the bottom face of the source trench, and the semiconductor device includes a barrier formation layer, which is joined with the drain region in the source trench, for forming, by junction with the drain region, a junction barrier lower than a diffusion potential of a body diode formed by p-n junction between the channel region and the drain region.

13 Claims, 39 Drawing Sheets

(51) Int. Cl.
*H01L 21/82* (2006.01)
*H01L 29/417* (2006.01)
*H01L 29/06* (2006.01)
*H01L 29/10* (2006.01)
*H01L 29/16* (2006.01)
*H01L 29/45* (2006.01)
*H01L 29/47* (2006.01)
*H01L 29/20* (2006.01)

(52) U.S. Cl.
CPC .... *H01L29/66045* (2013.01); *H01L 29/66068* (2013.01); *H01L 29/66727* (2013.01); *H01L 29/66734* (2013.01); *H01L 29/7806* (2013.01); *H01L 29/7813* (2013.01); *H01L 29/0619* (2013.01); *H01L 29/0623* (2013.01); *H01L 29/0696* (2013.01); *H01L 29/1095* (2013.01); *H01L 29/1602* (2013.01); *H01L 29/1608* (2013.01); *H01L 29/2003* (2013.01); *H01L 29/45* (2013.01); *H01L 29/47* (2013.01); *H01L 2224/0603* (2013.01)

(56) References Cited

U.S. PATENT DOCUMENTS

| | | |
|---|---|---|
| 2007/0262324 A1 | 11/2007 | Kaneko |
| 2009/0256197 A1 | 10/2009 | Nakazawa et al. |
| 2010/0193796 A1 | 8/2010 | Nakano et al. |
| 2010/0193799 A1* | 8/2010 | Nakano et al. ............... 257/77 |
| 2011/0024831 A1 | 2/2011 | Nakano |

FOREIGN PATENT DOCUMENTS

| | | |
|---|---|---|
| JP | H08-204179 | 8/1996 |
| JP | 2003-017701 | 1/2003 |
| JP | 2003-318398 | 11/2003 |
| JP | 2005-285913 | 10/2005 |
| JP | 2007-258465 | 10/2007 |
| JP | 2009-253139 | 10/2009 |
| JP | 2009-260253 | 11/2009 |
| JP | 2010-109221 | 5/2010 |
| JP | 2010-171417 | 8/2010 |
| JP | 2010-171418 | 8/2010 |

* cited by examiner

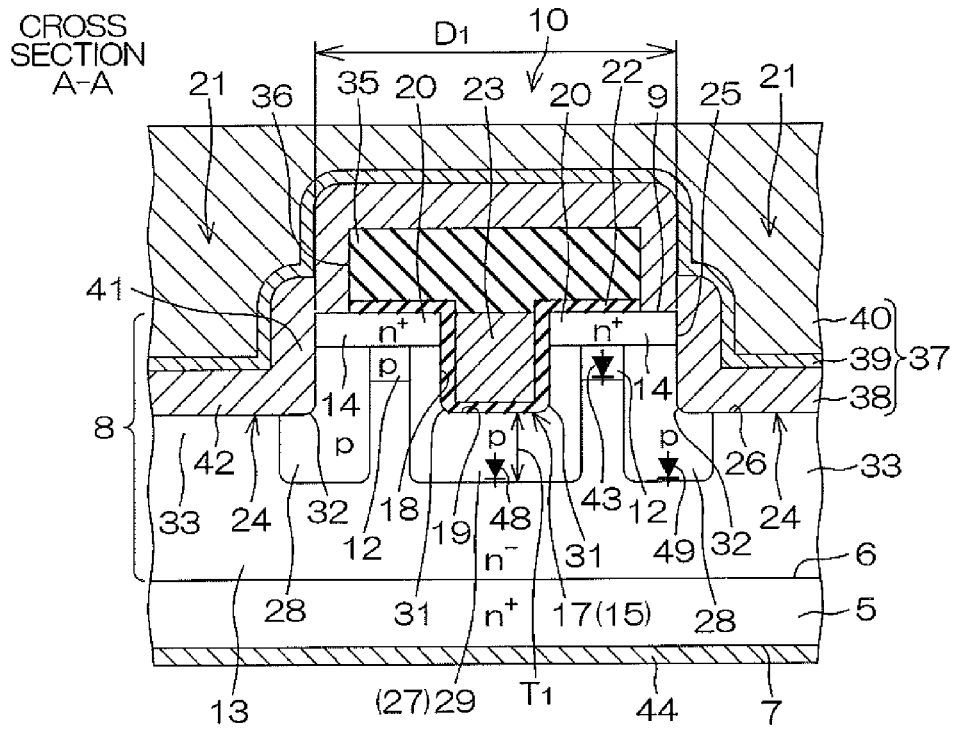
FIG. 2
CROSS SECTION A-A
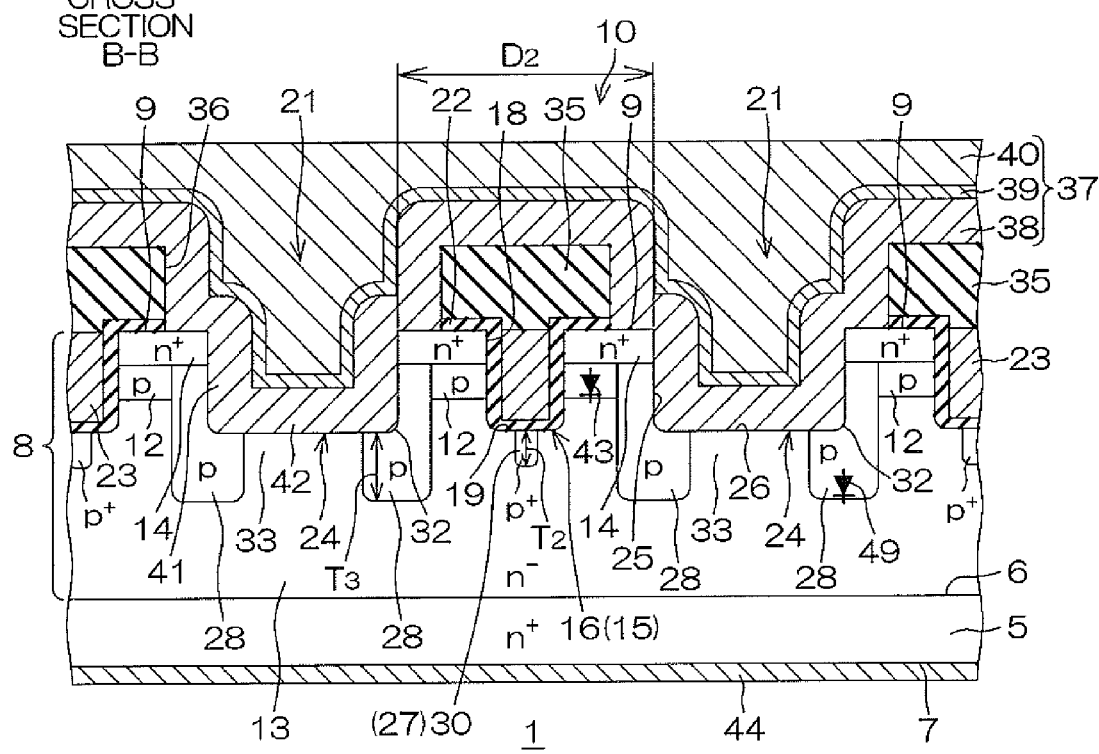
CROSS SECTION B-B

FIG. 3A
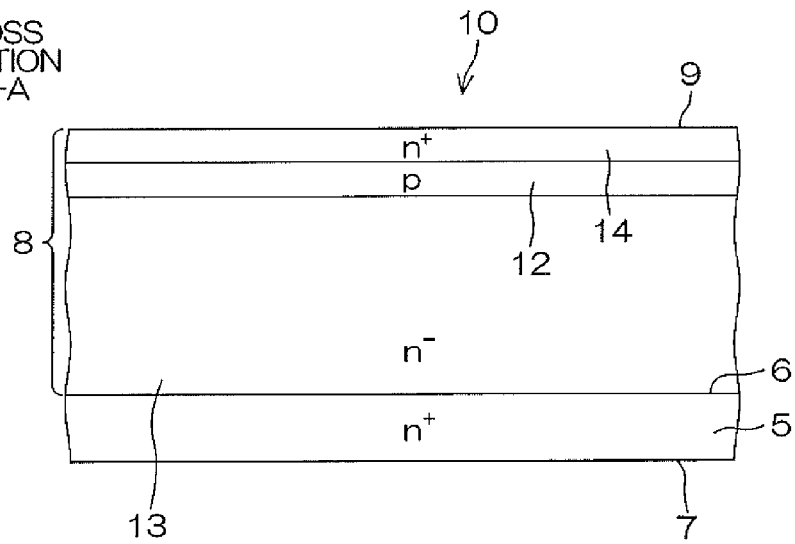
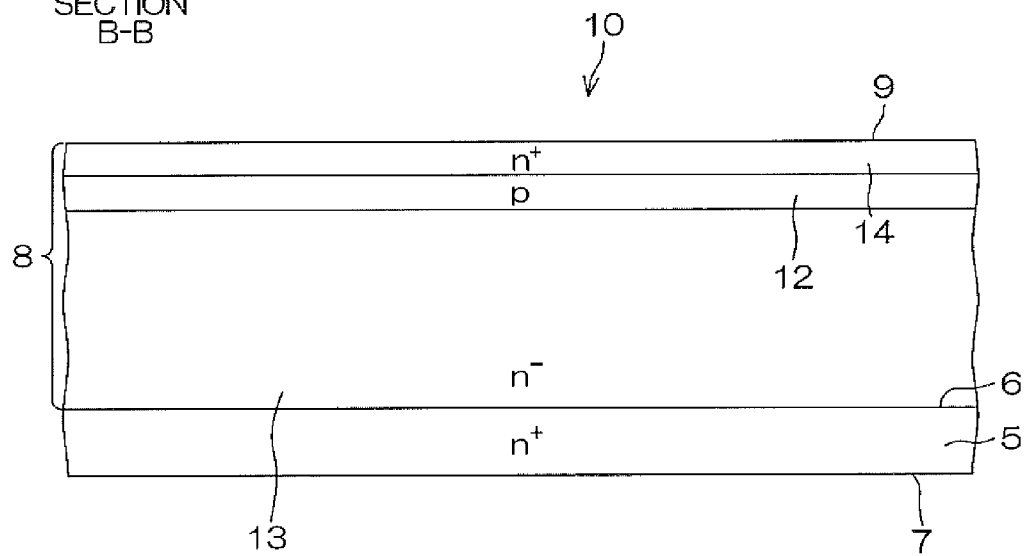

FIG. 3B
CROSS SECTION A-A
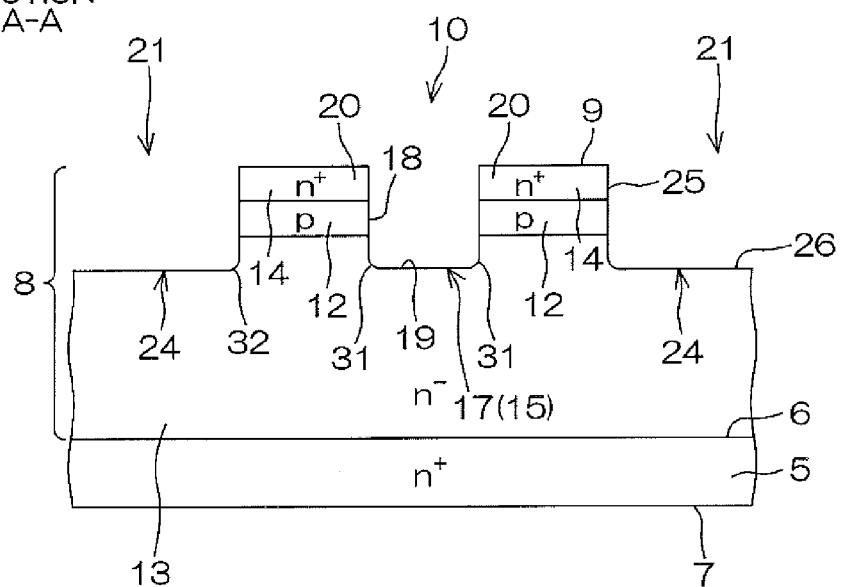
CROSS SECTION B-B
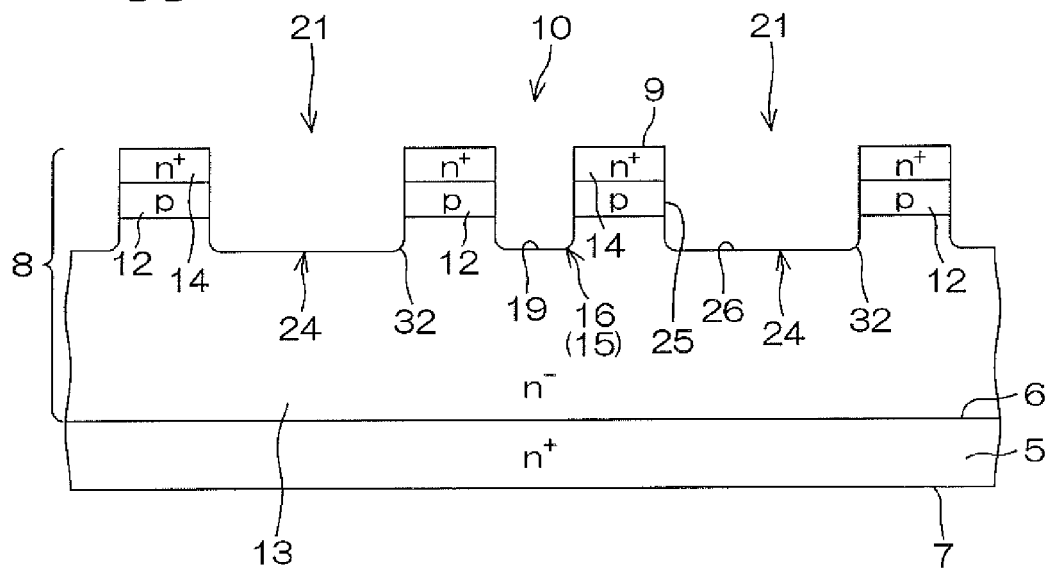

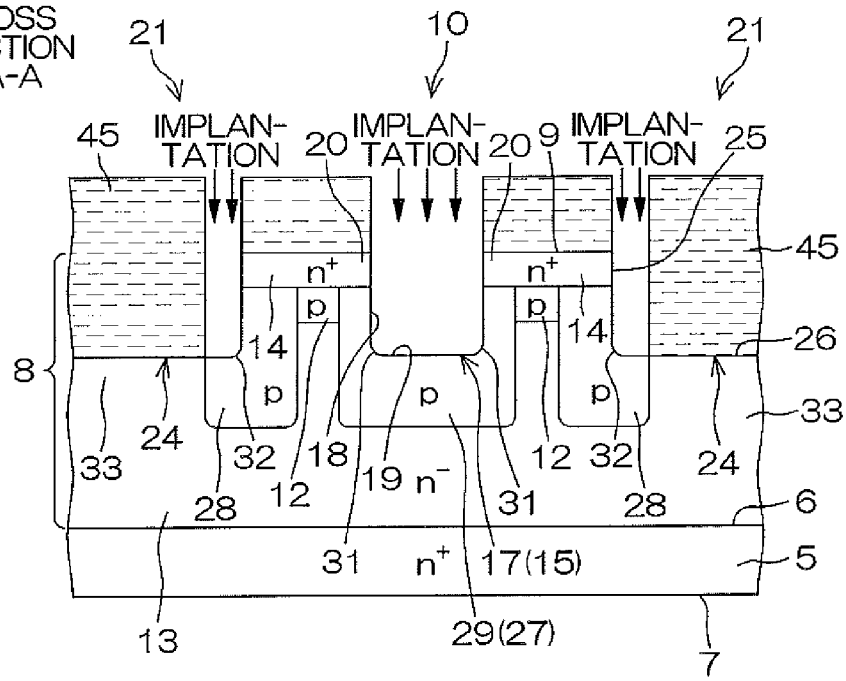
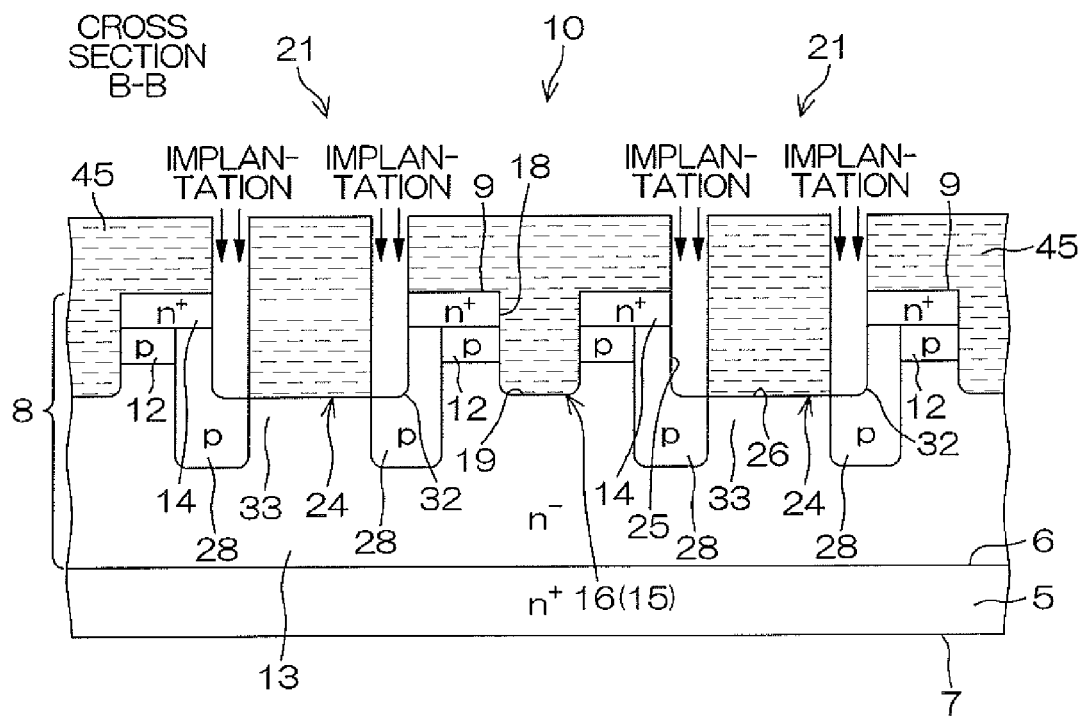

FIG. 3D
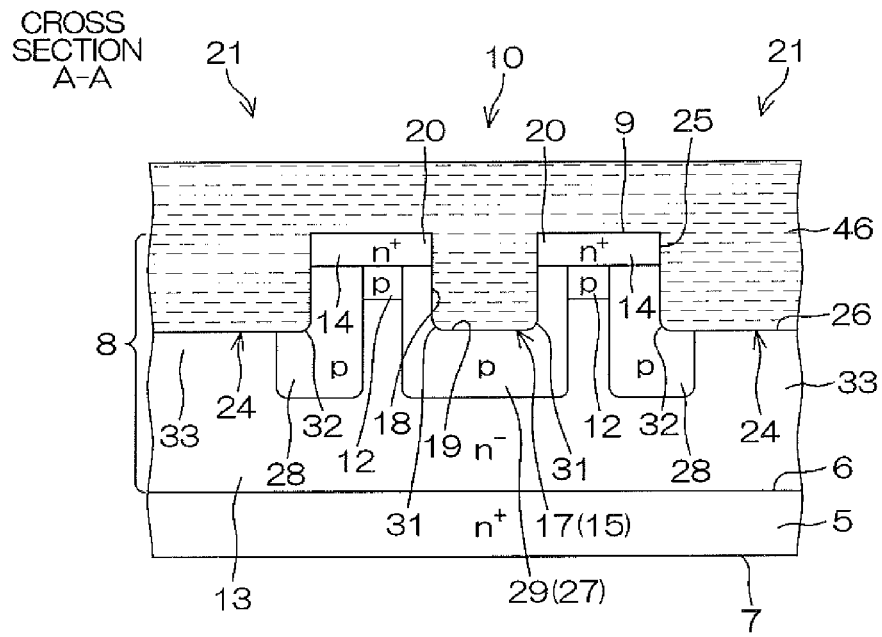
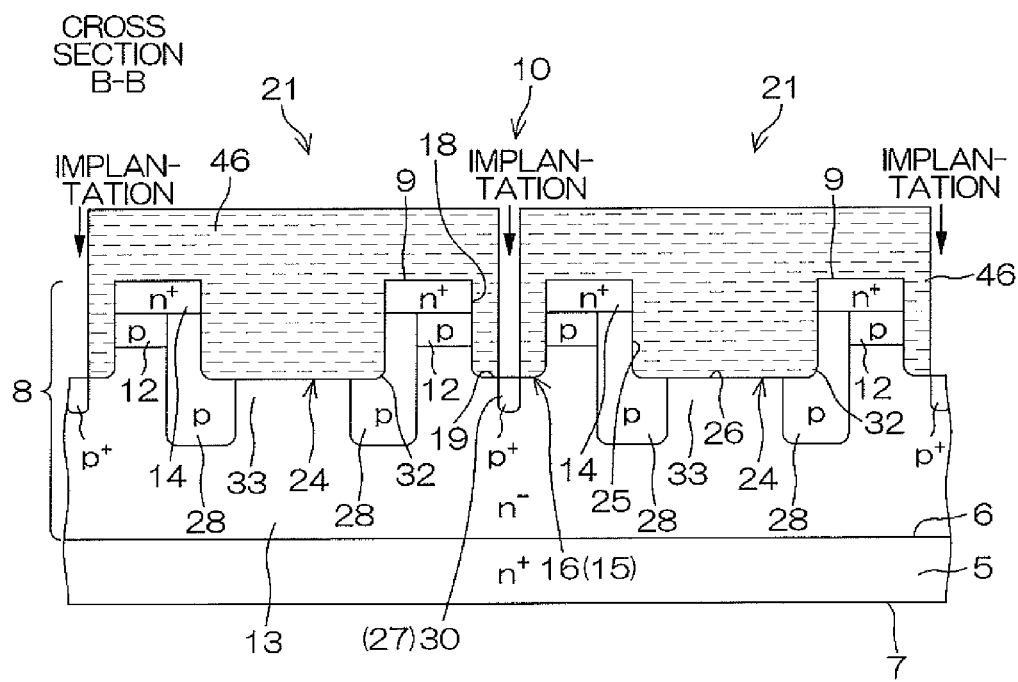

FIG. 3E
CROSS SECTION A-A
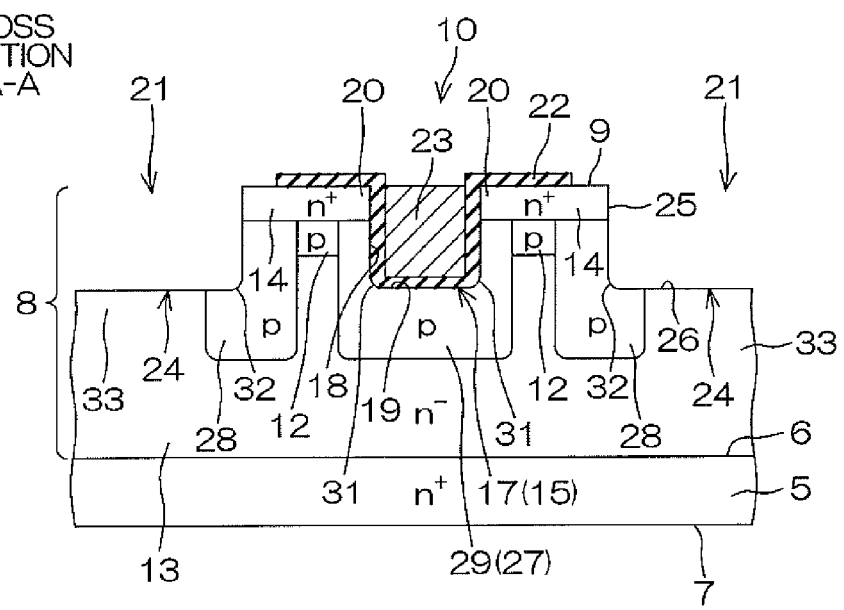
CROSS SECTION B-B
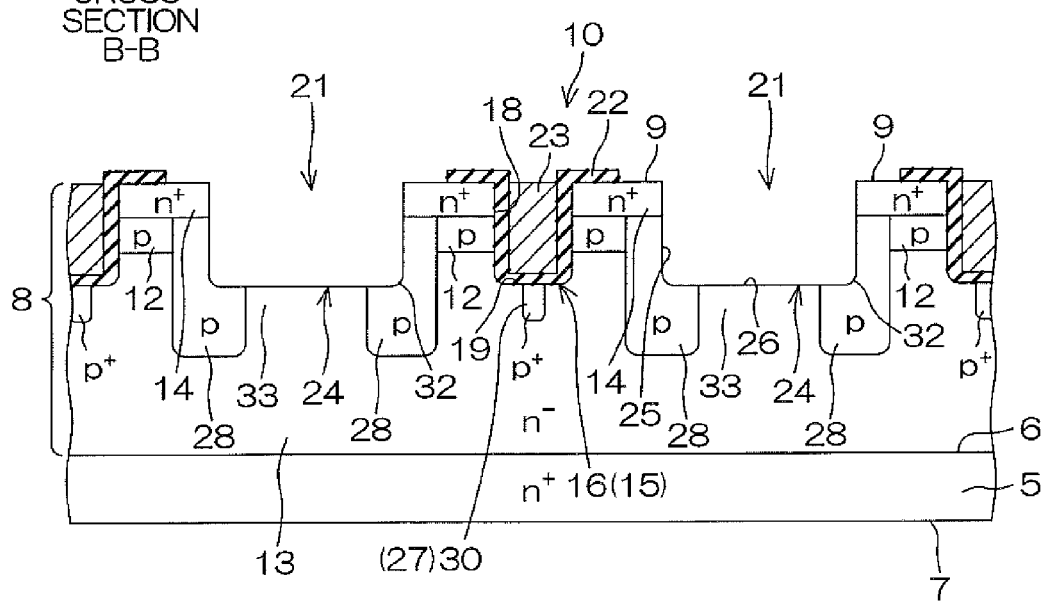

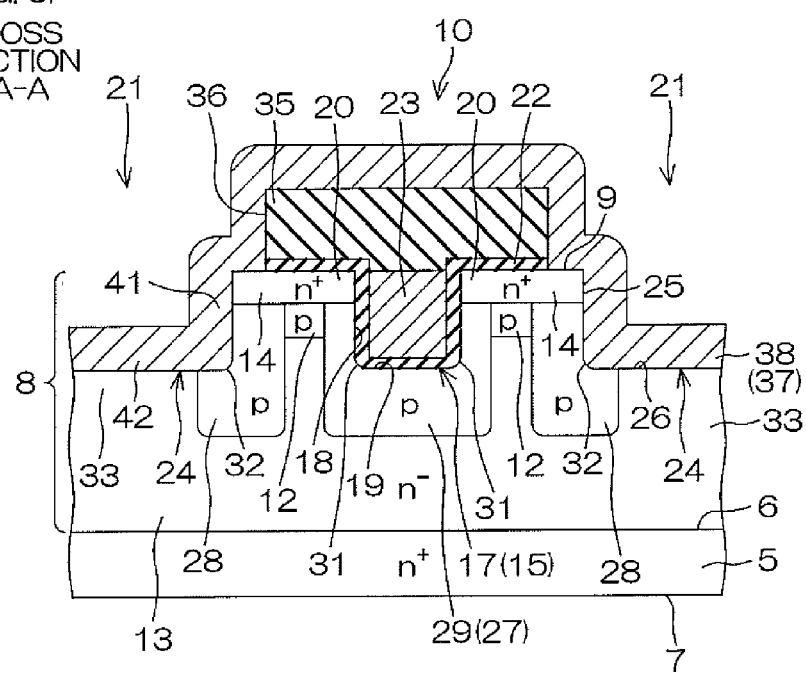
FIG. 3F CROSS SECTION A-A
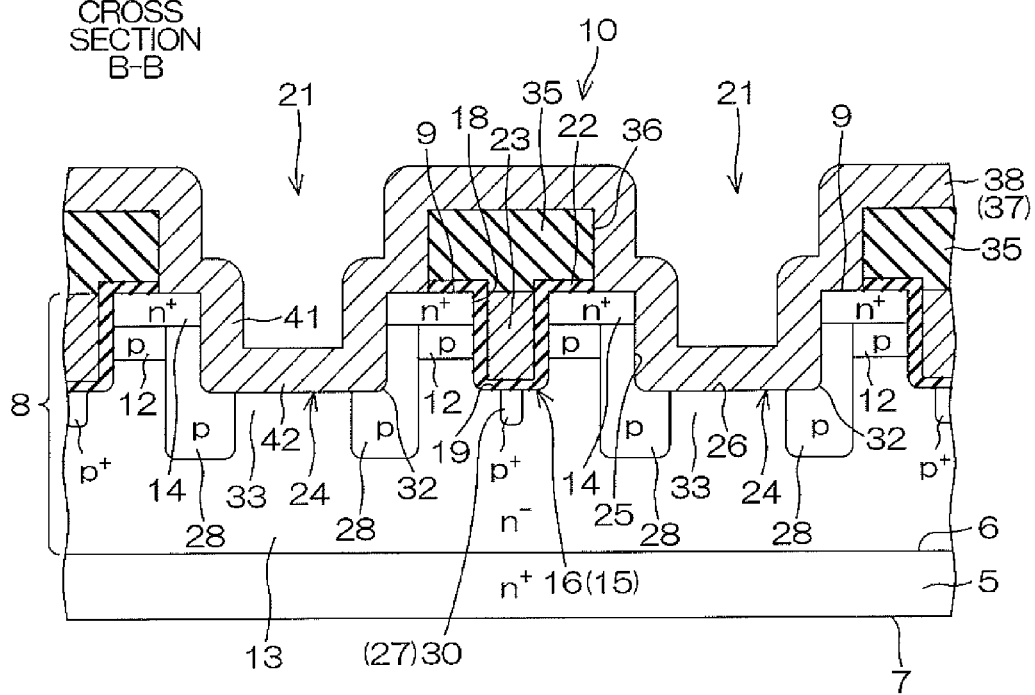
CROSS SECTION B-B

FIG. 6
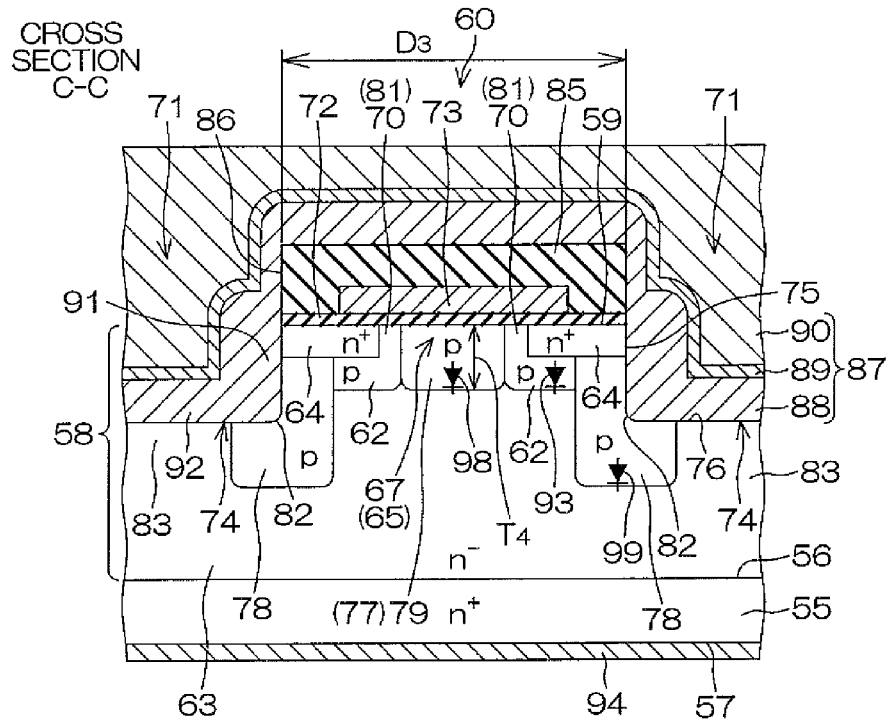
CROSS SECTION C-C
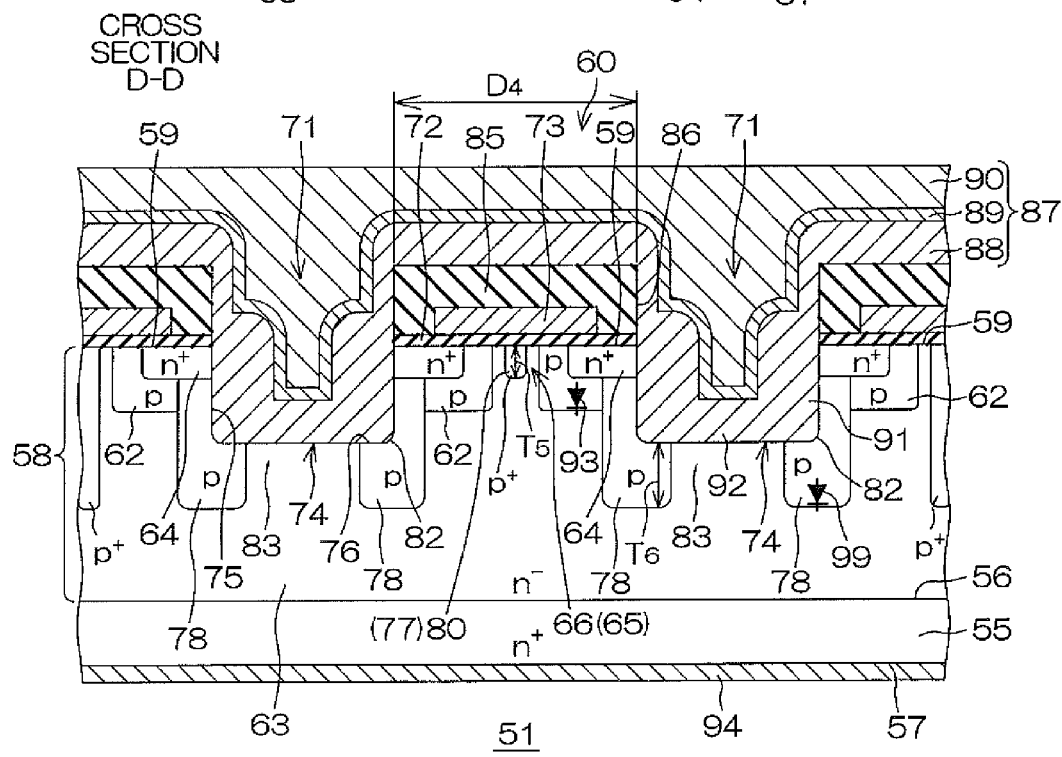
CROSS SECTION D-D

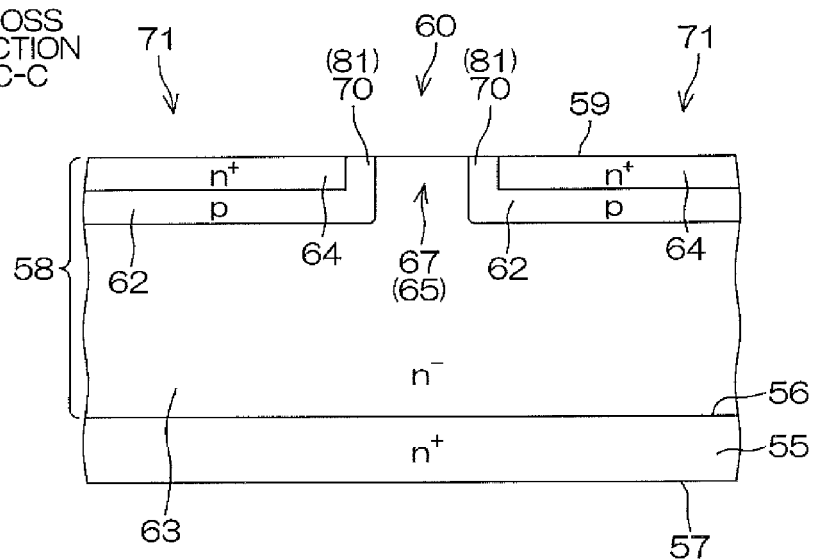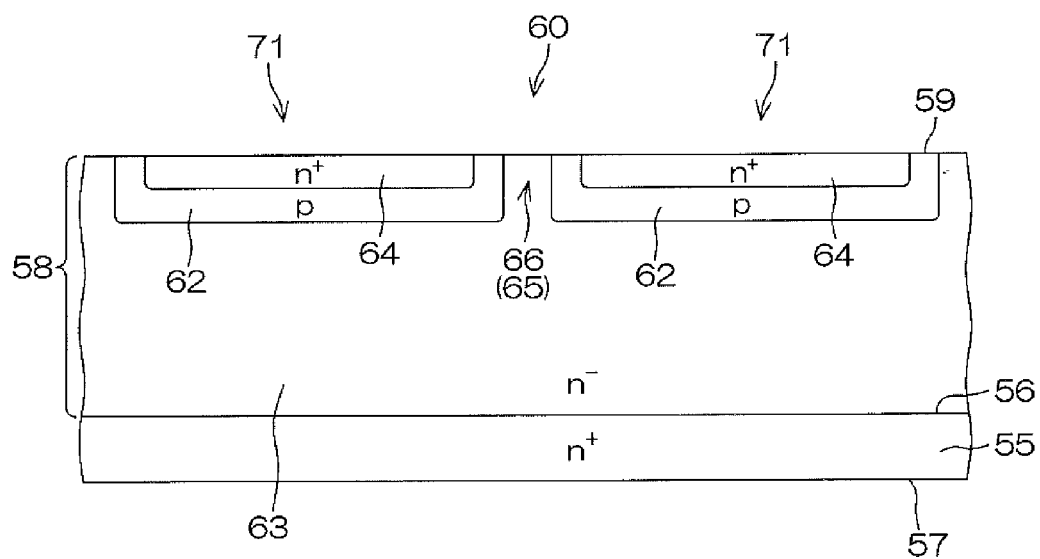

FIG. 7B
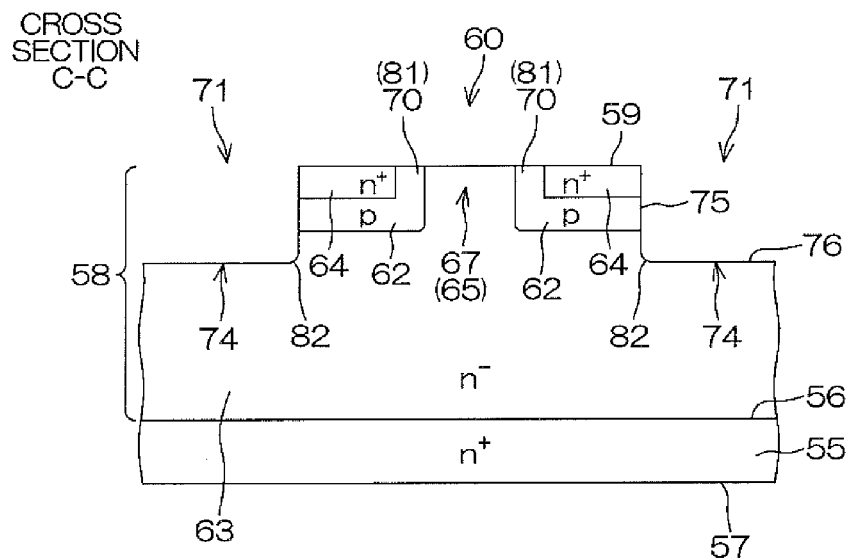
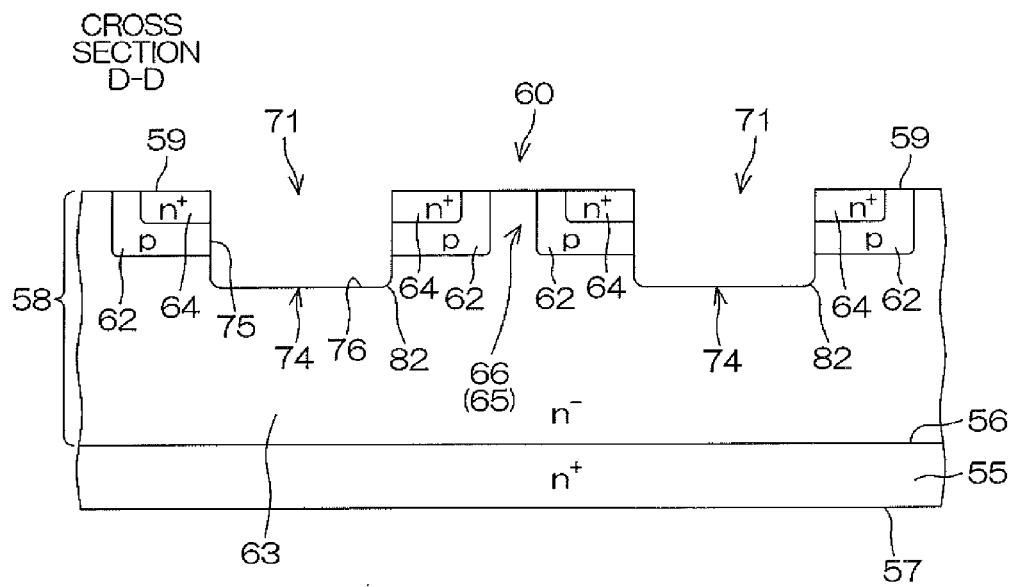

FIG. 7C
CROSS SECTION C-C
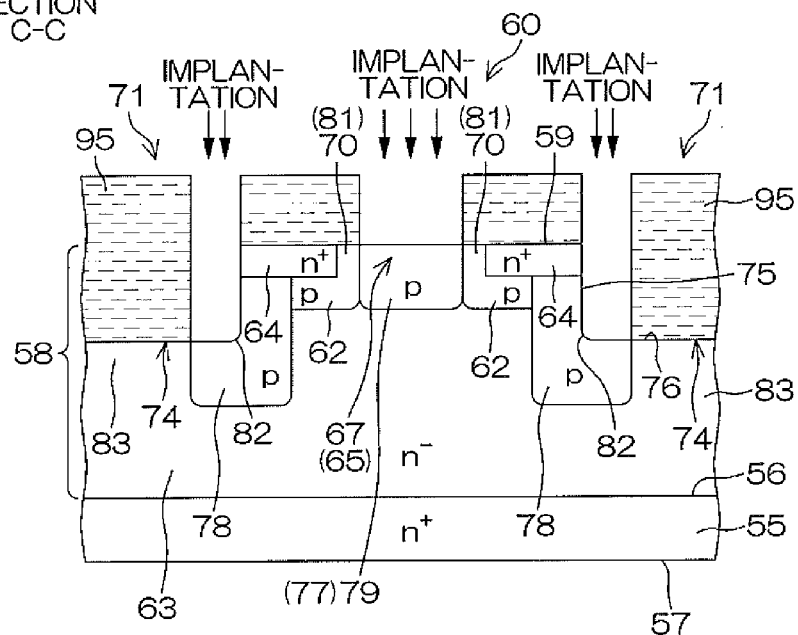
CROSS SECTION D-D
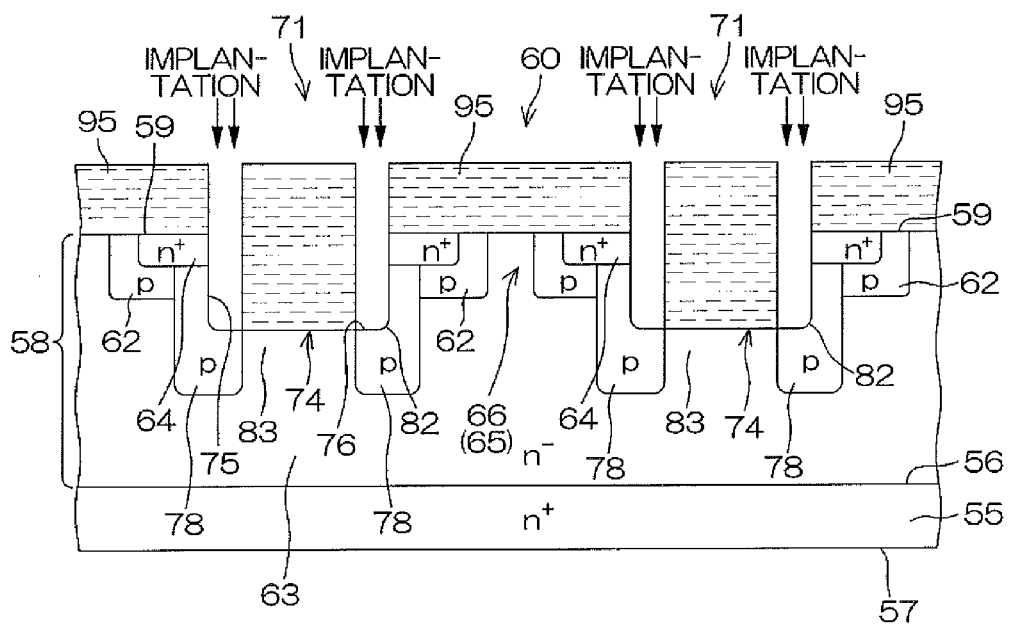

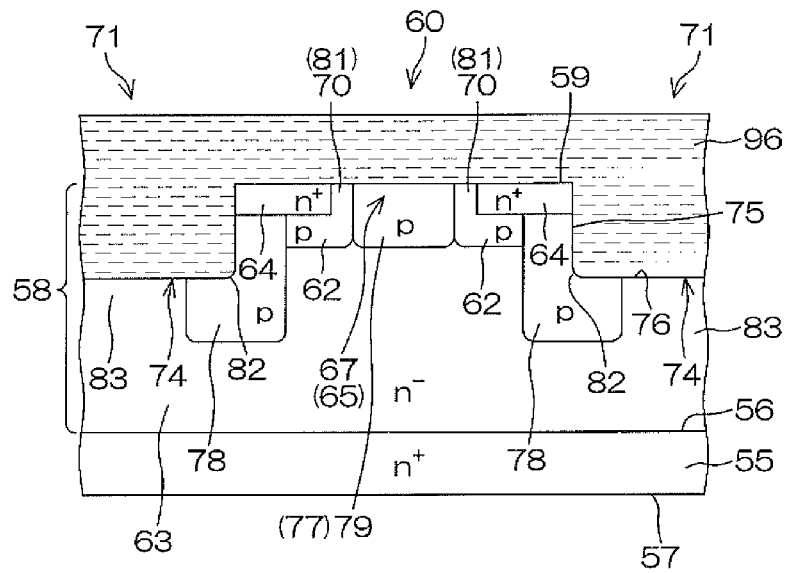
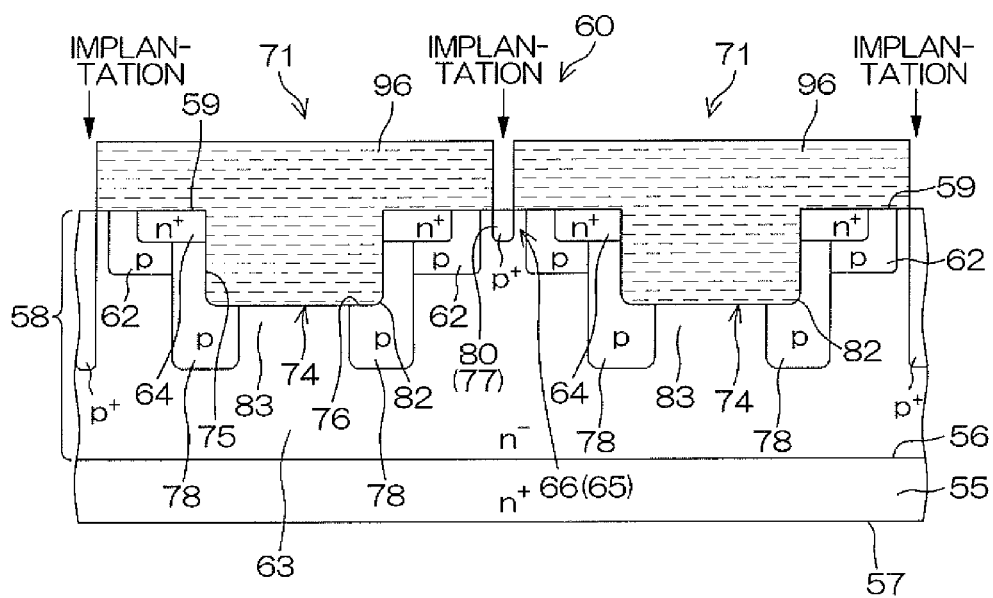

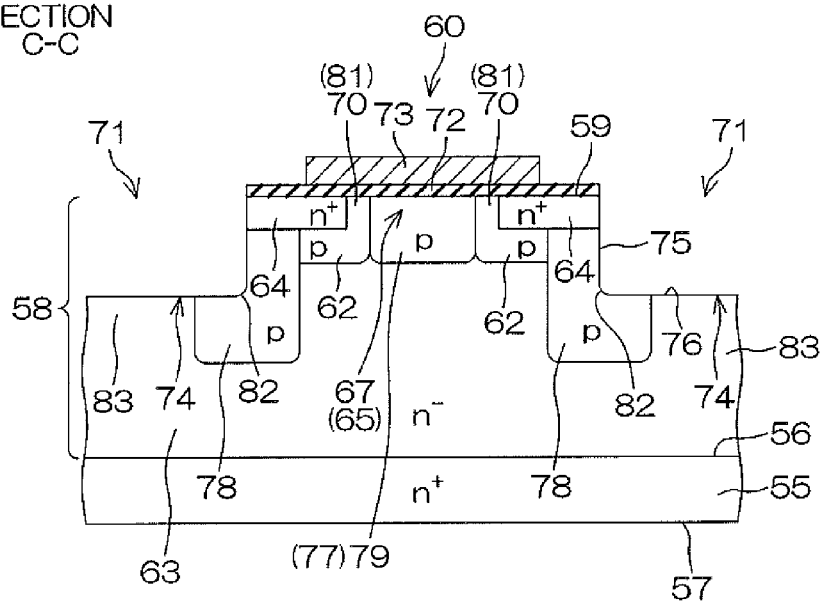
FIG. 7E CROSS SECTION C-C
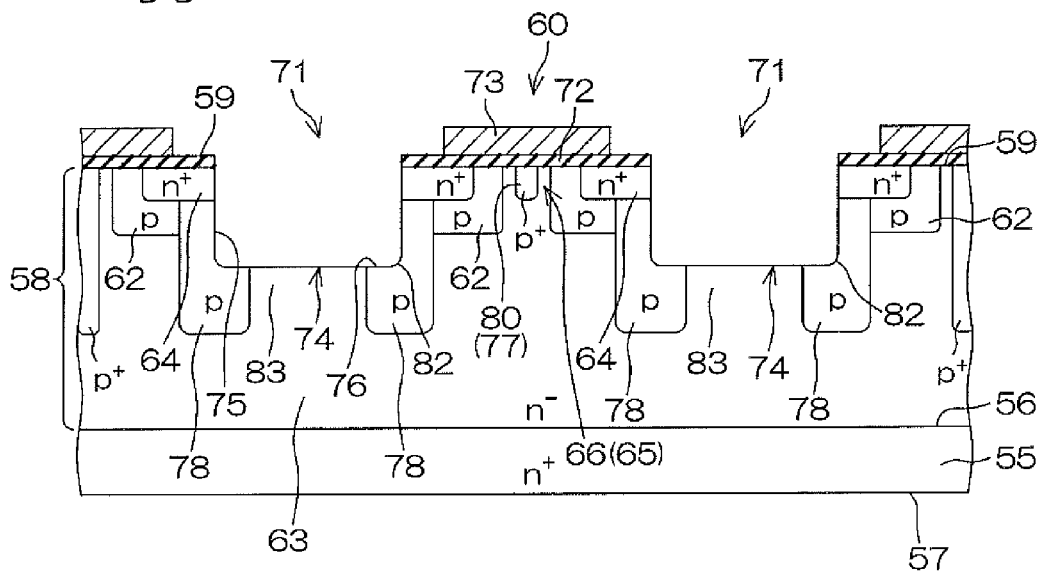
CROSS SECTION D-D

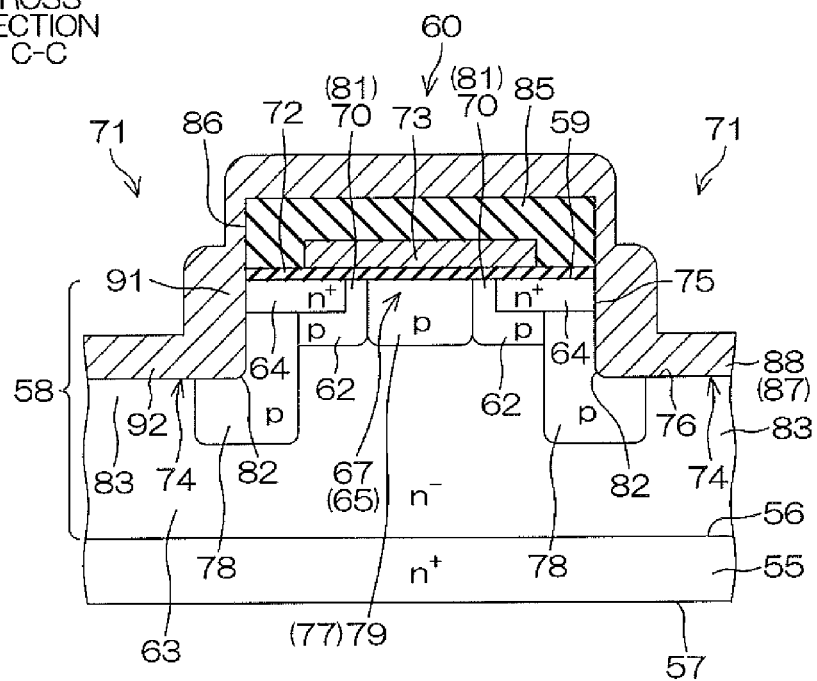
FIG. 7F
CROSS SECTION C-C
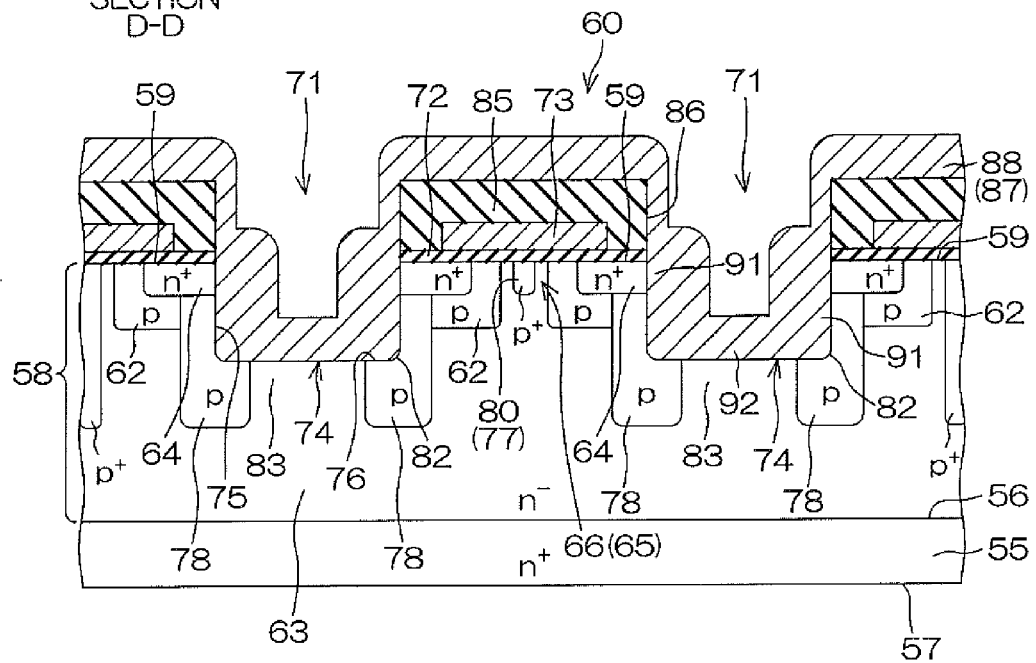
CROSS SECTION D-D

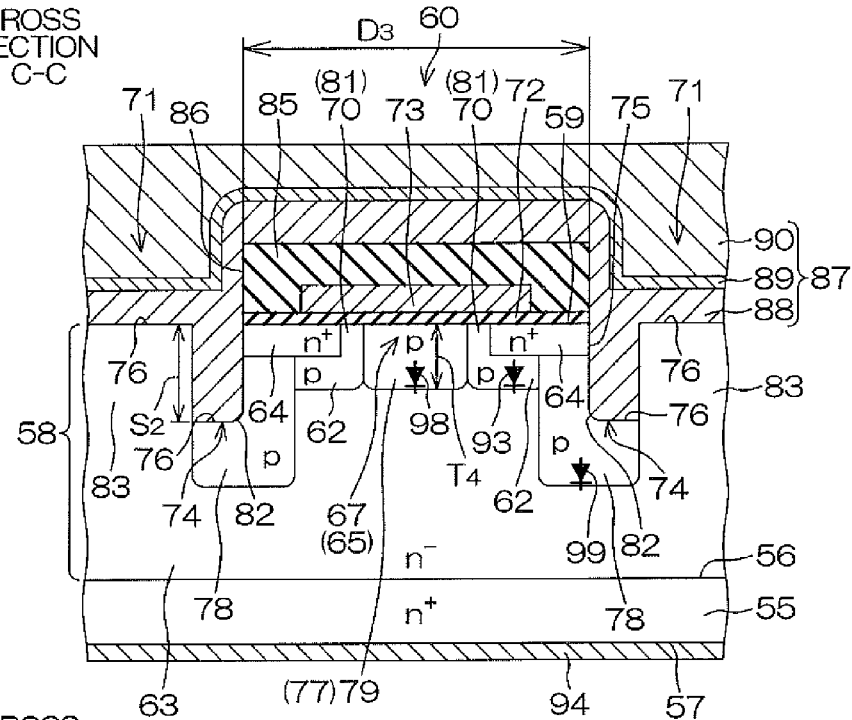
FIG. 8 CROSS SECTION C-C
CROSS SECTION D-D
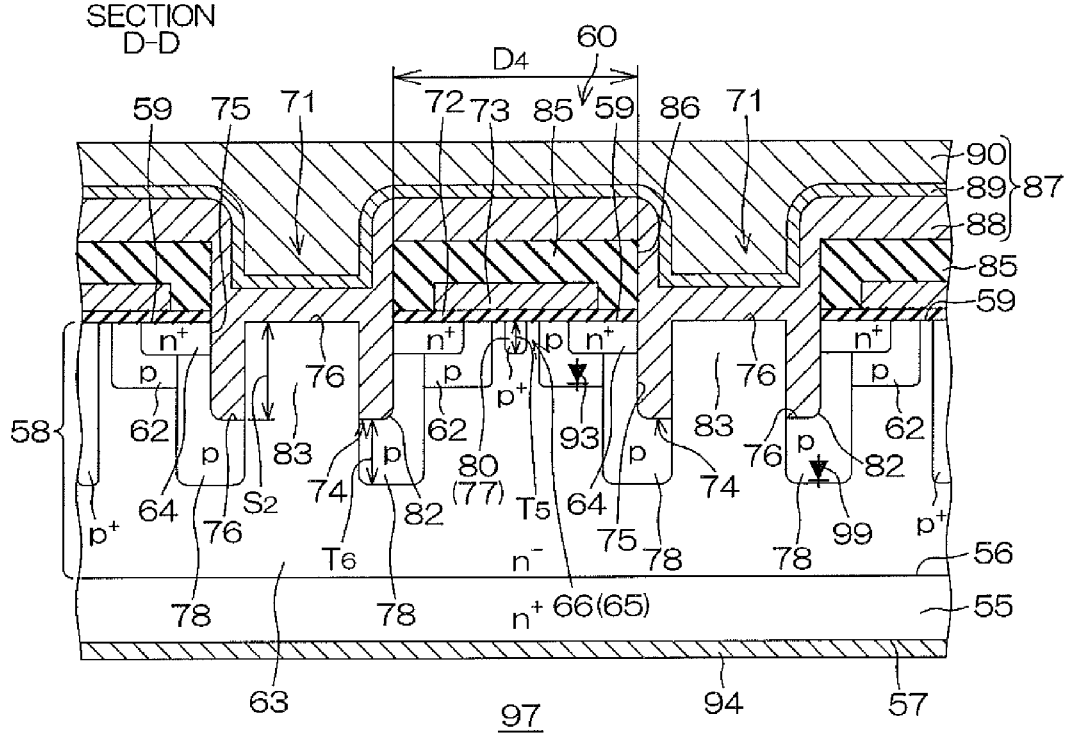

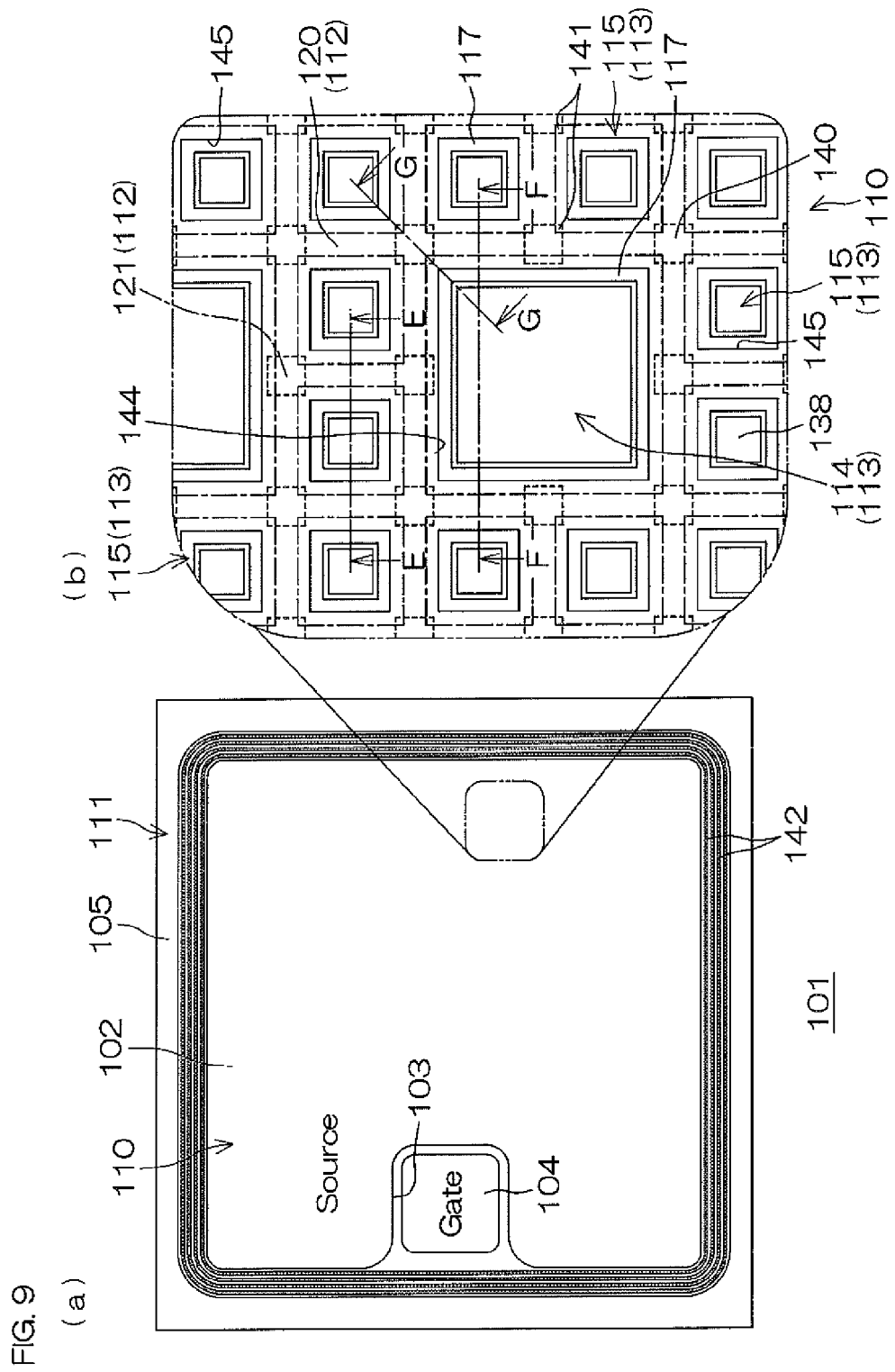

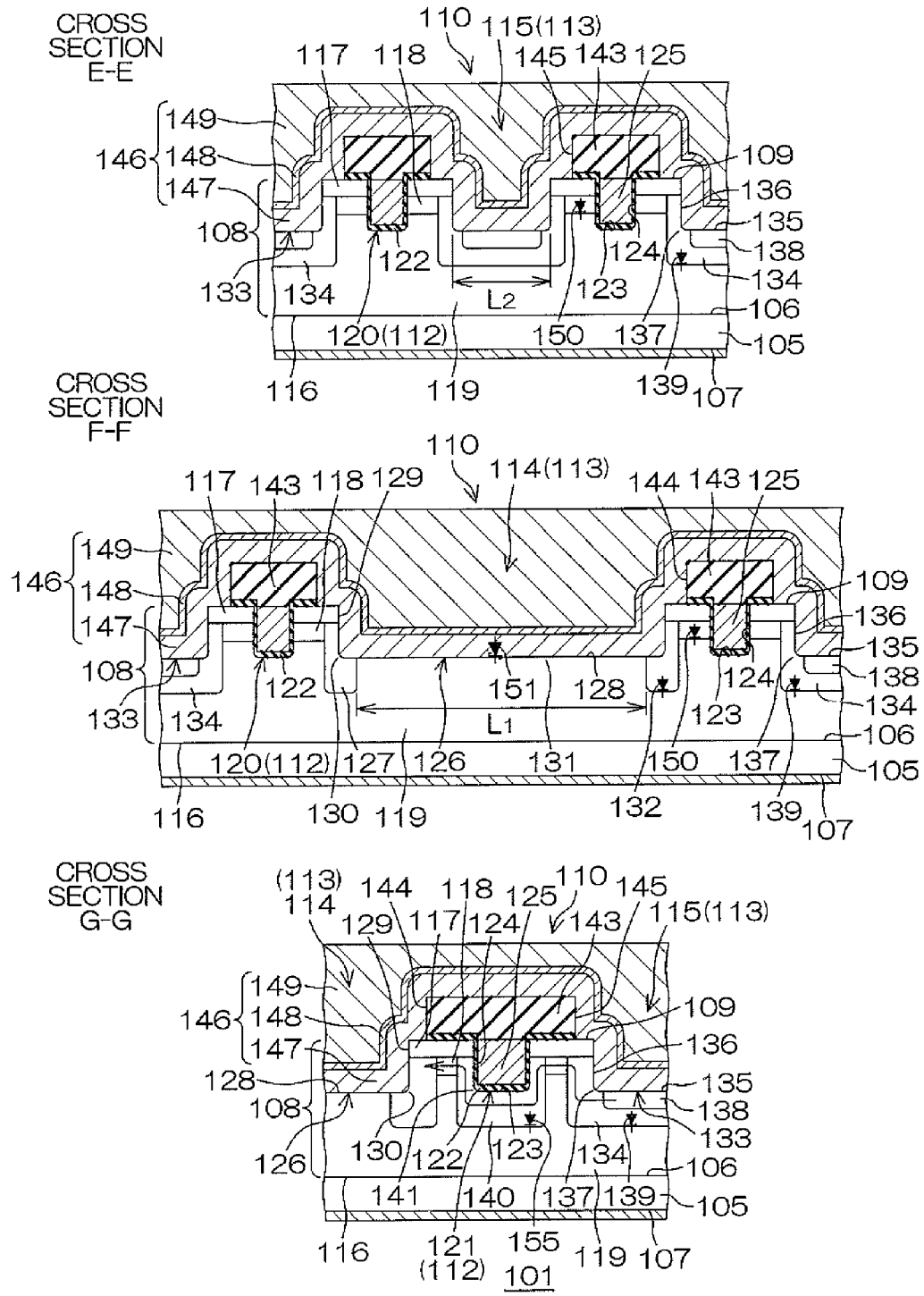

FIG. 11A
CROSS SECTION E-E
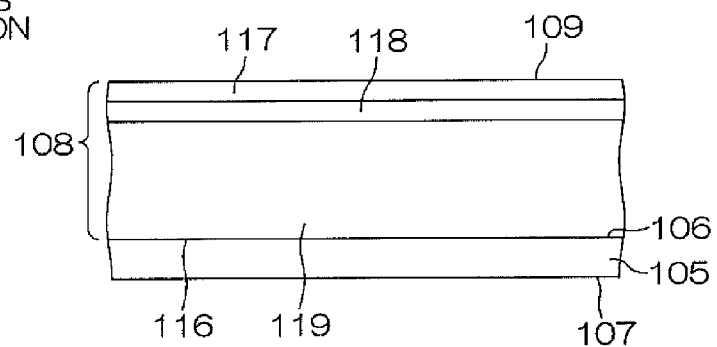
CROSS SECTION F-F
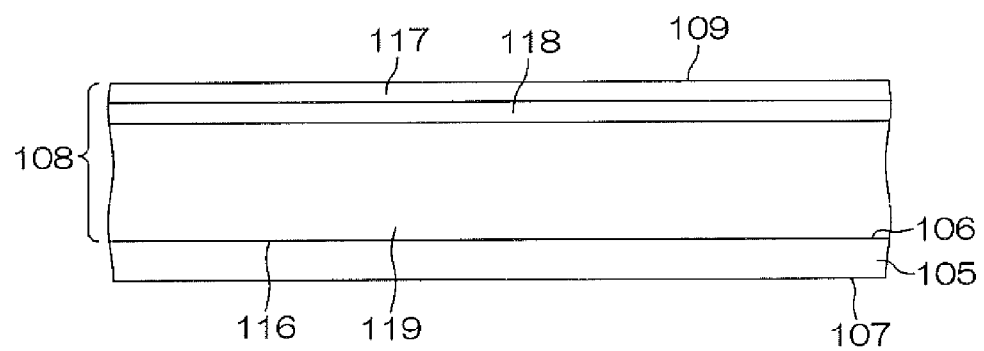
CROSS SECTION G-G
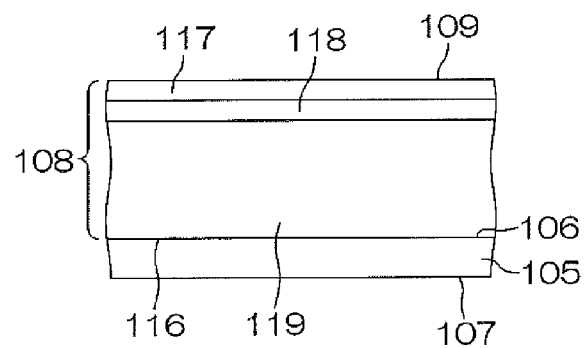

FIG. 11B
CROSS SECTION E-E
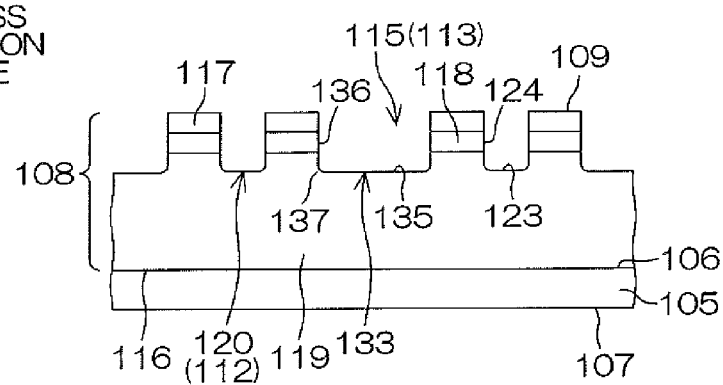
CROSS SECTION F-F
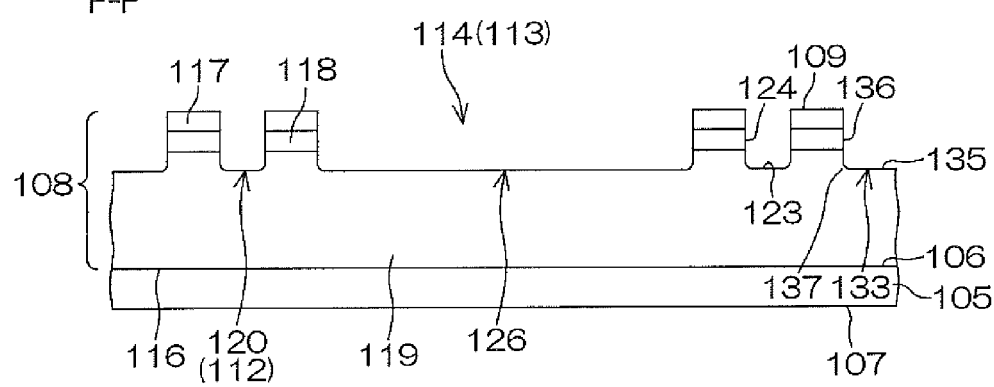
CROSS SECTION G-G
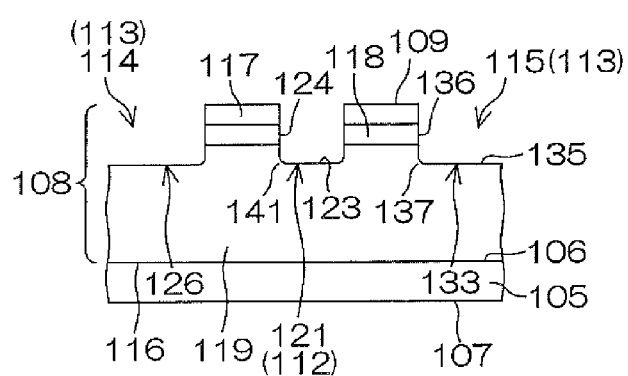

FIG. 11C
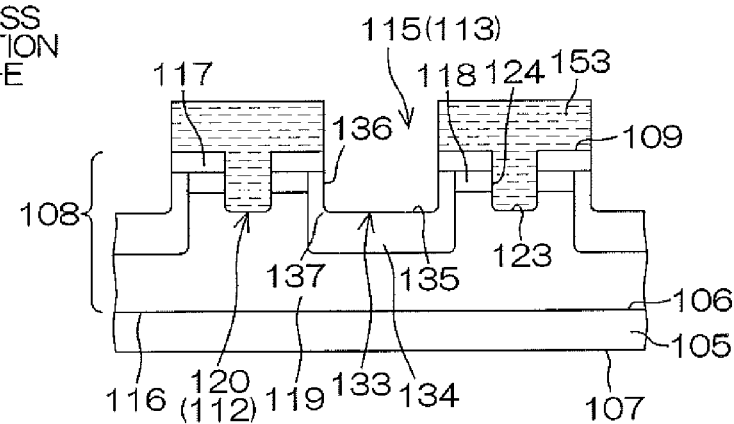
CROSS SECTION E-E
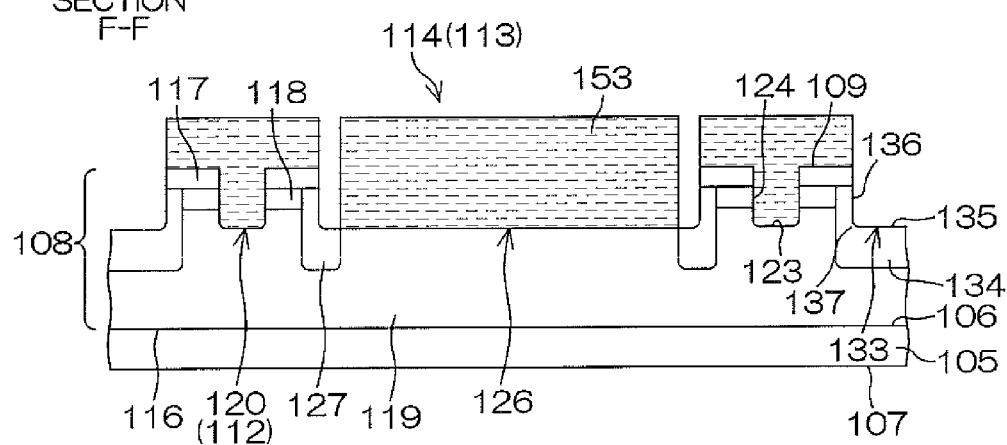
CROSS SECTION F-F
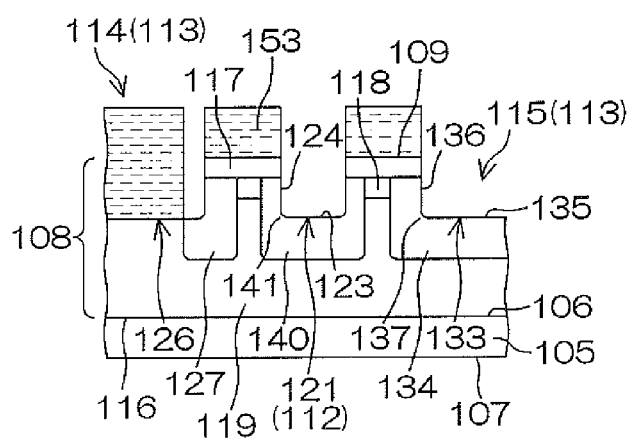
CROSS SECTION G-G FIG. 11D
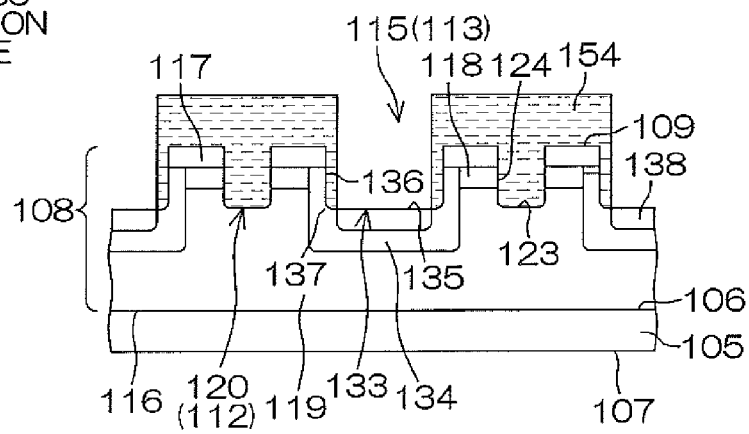
CROSS SECTION E-E
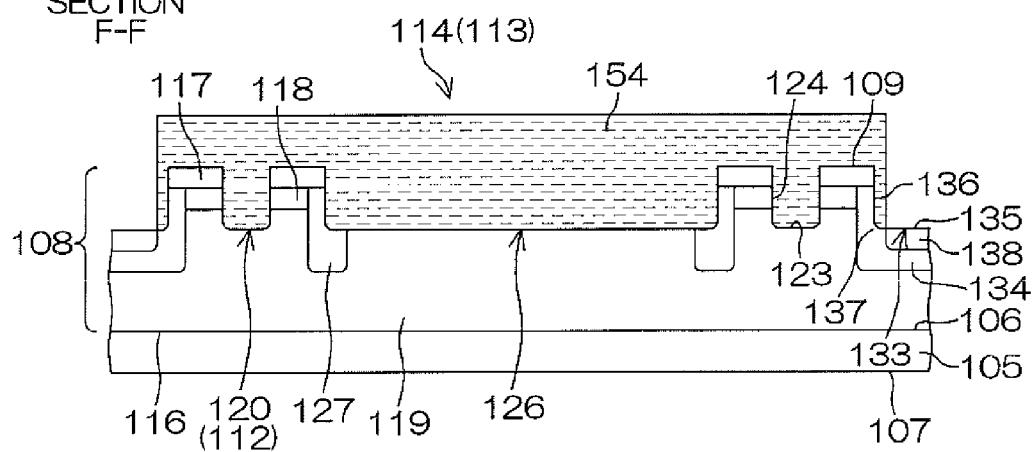
CROSS SECTION F-F
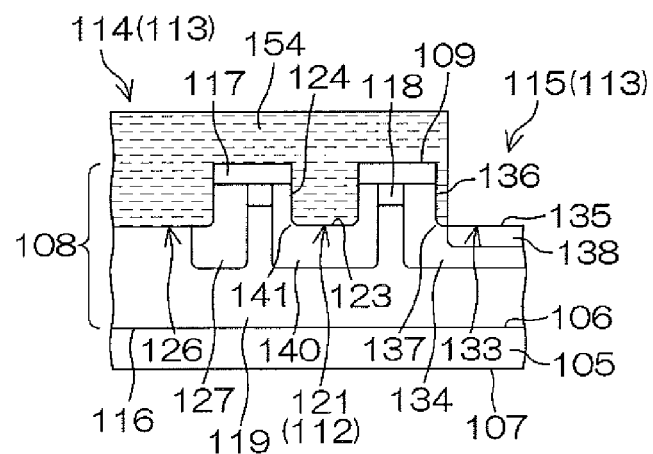
CROSS SECTION G-G FIG. 11E
CROSS SECTION E-E
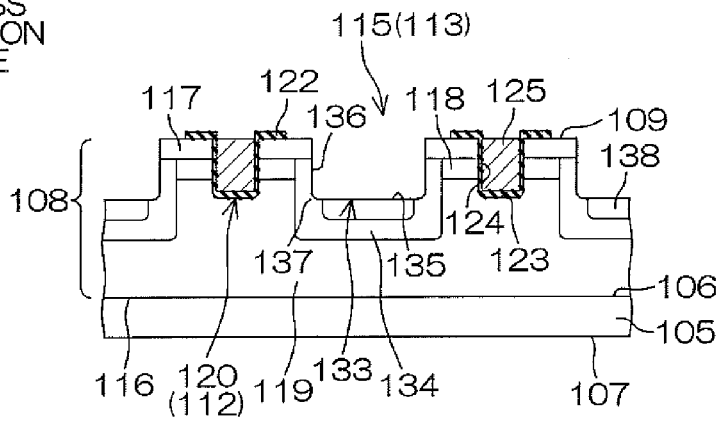
CROSS SECTION F-F
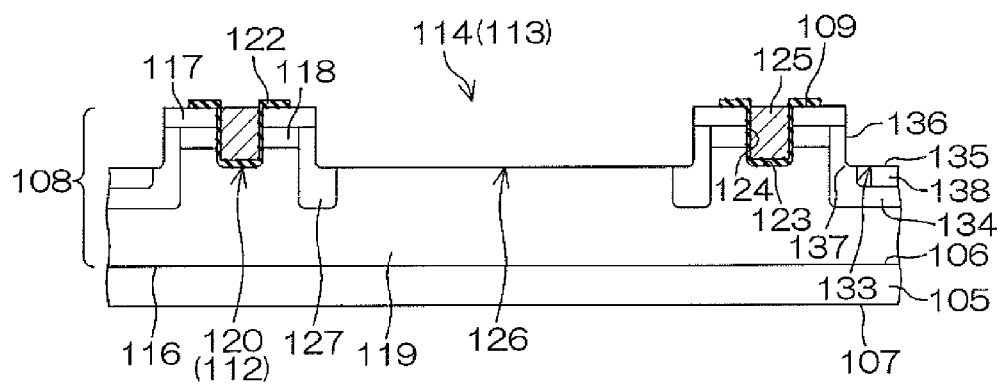
CROSS SECTION G-G
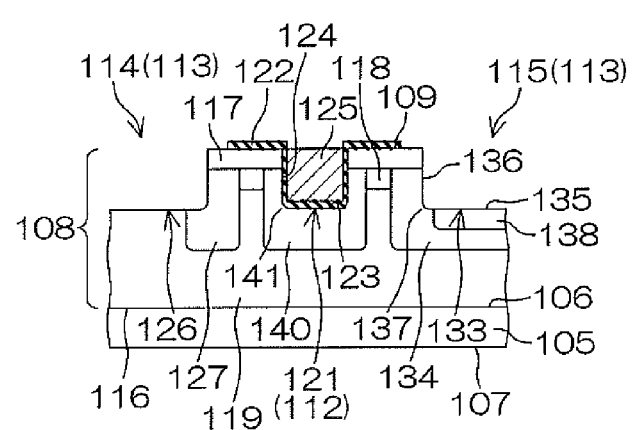

FIG. 11F
CROSS SECTION E-E
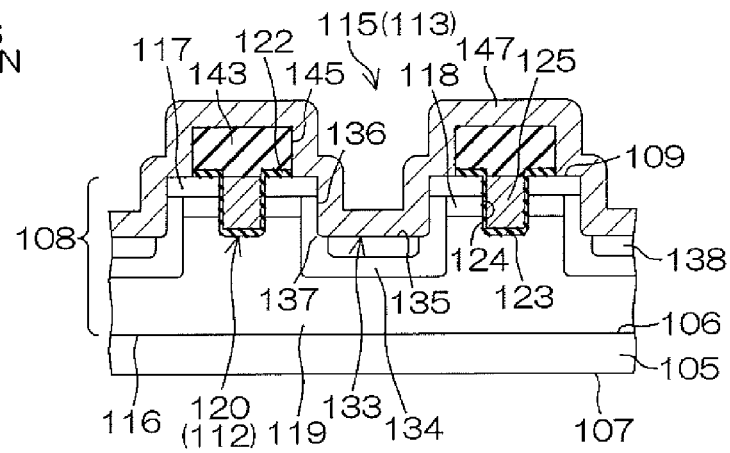
CROSS SECTION F-F
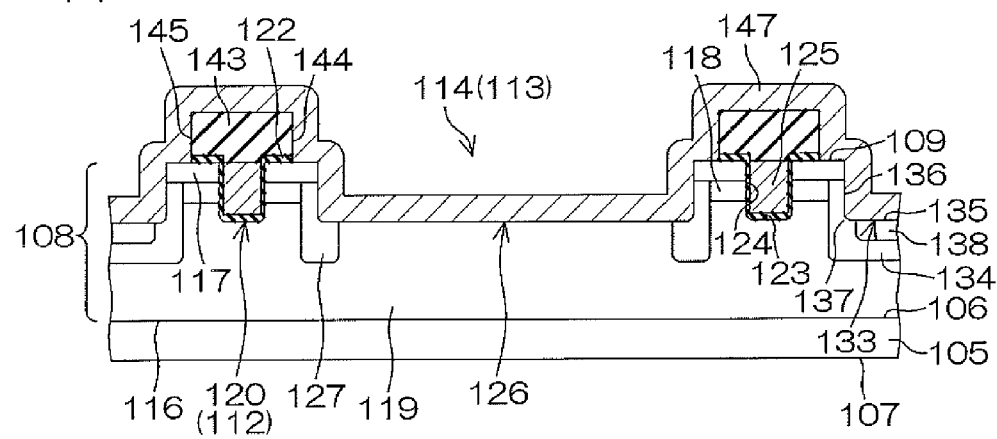
CROSS SECTION G-G
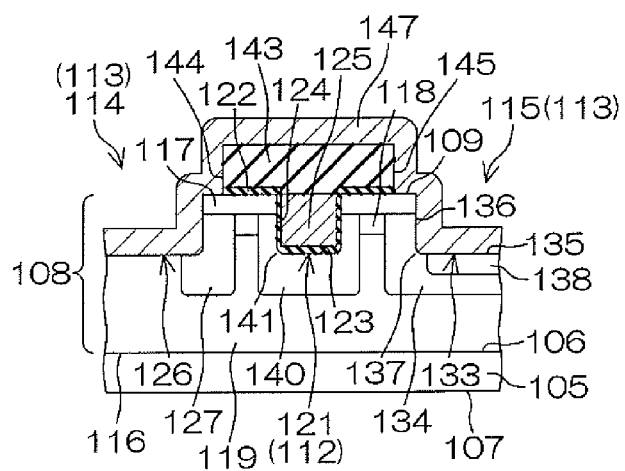

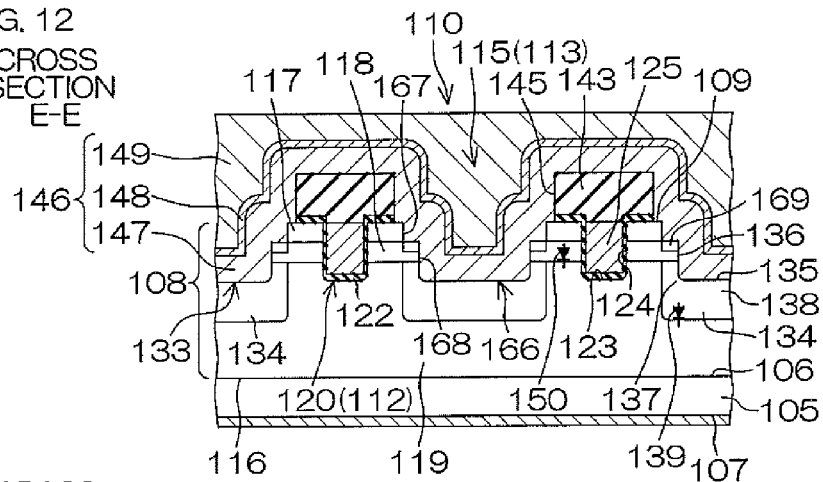
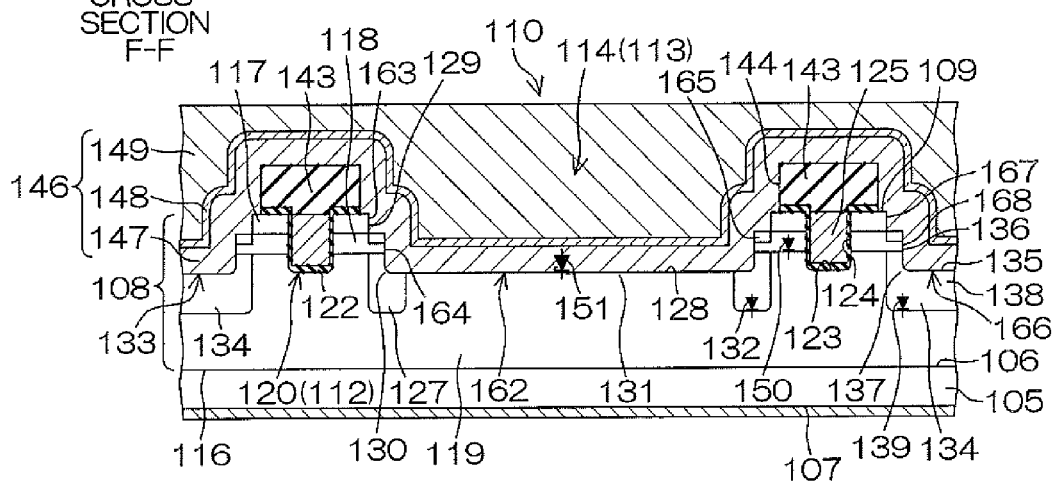
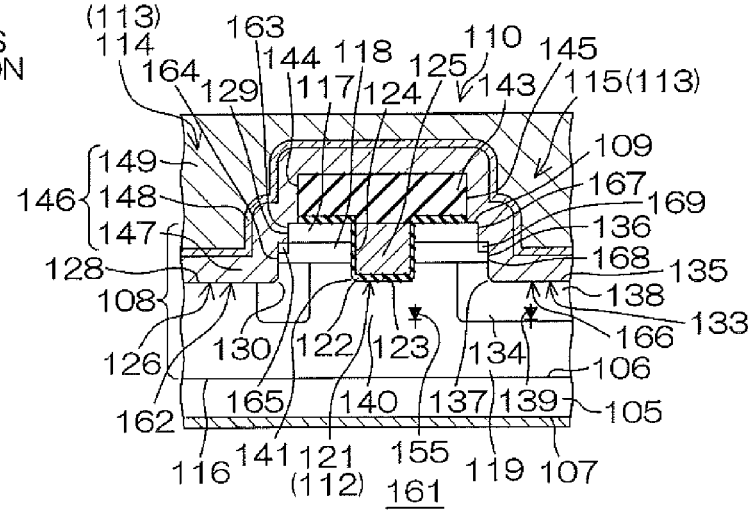
FIG. 12

FIG. 13A
CROSS SECTION E-E
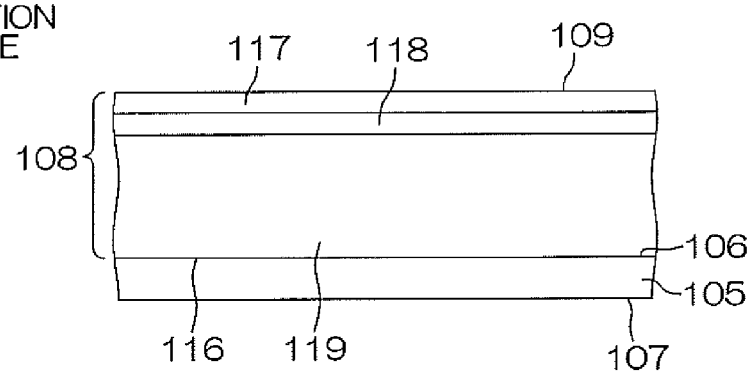
CROSS SECTION F-F
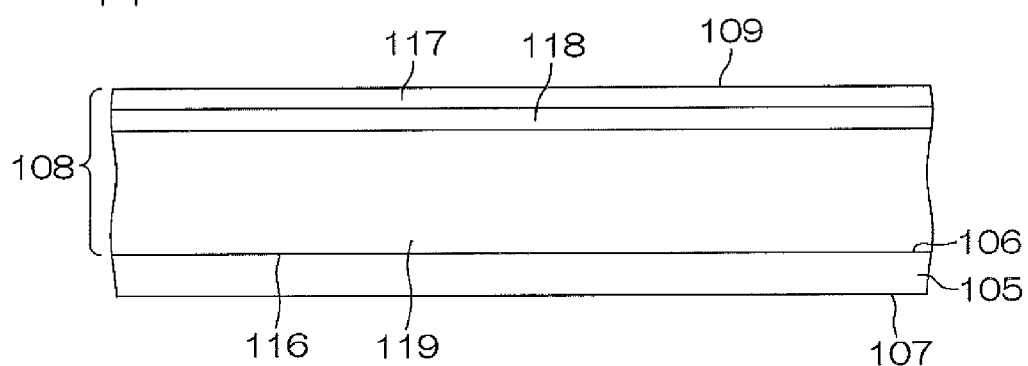
CROSS SECTION G-G
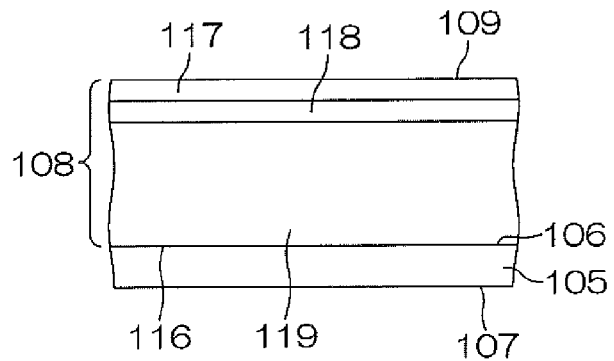

FIG. 13B
CROSS SECTION E-E
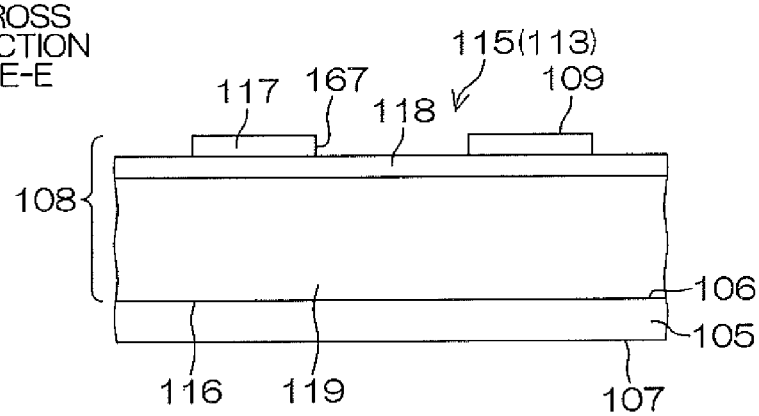
CROSS SECTION F-F
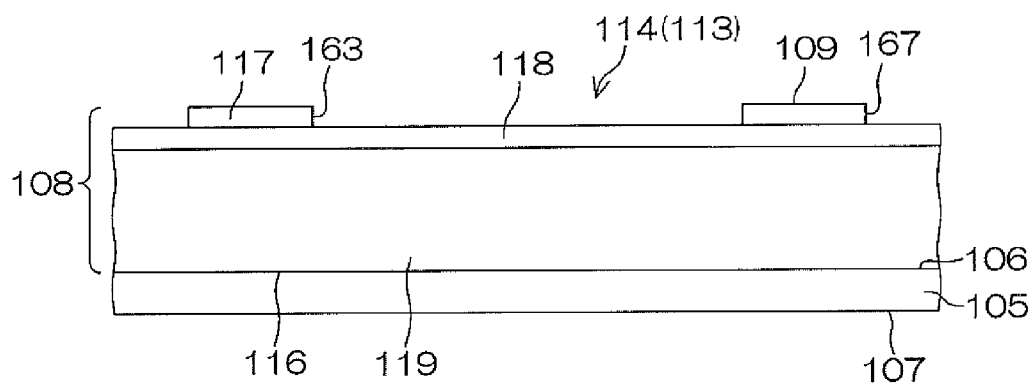
CROSS SECTION G-G
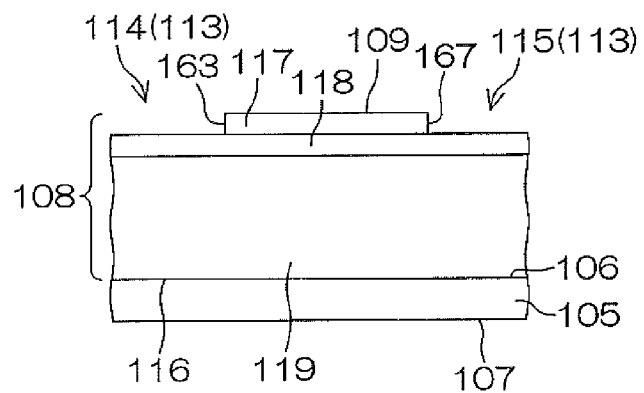

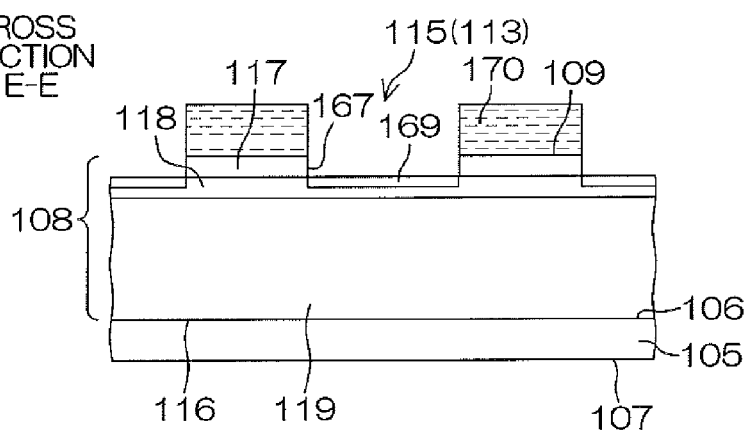
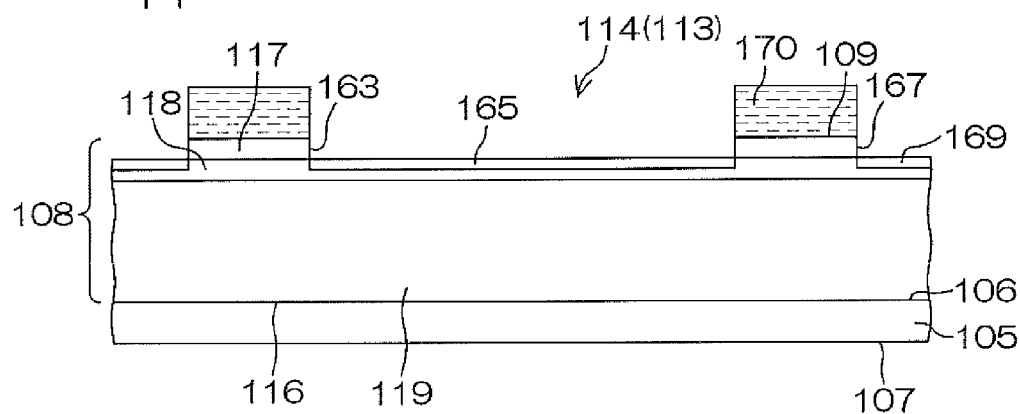
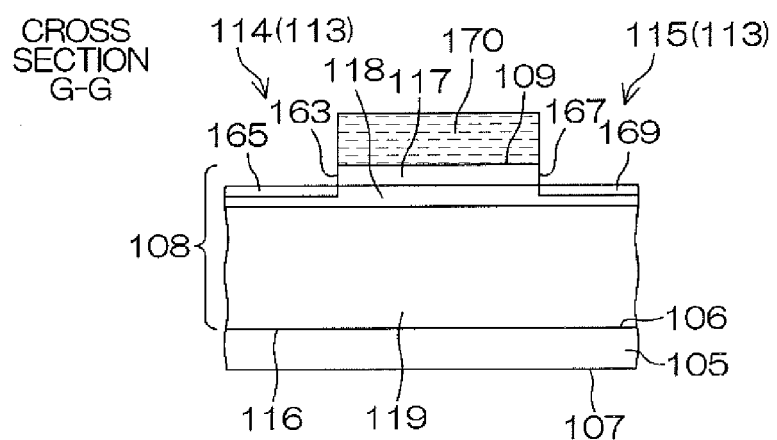
FIG. 13C

FIG. 13D
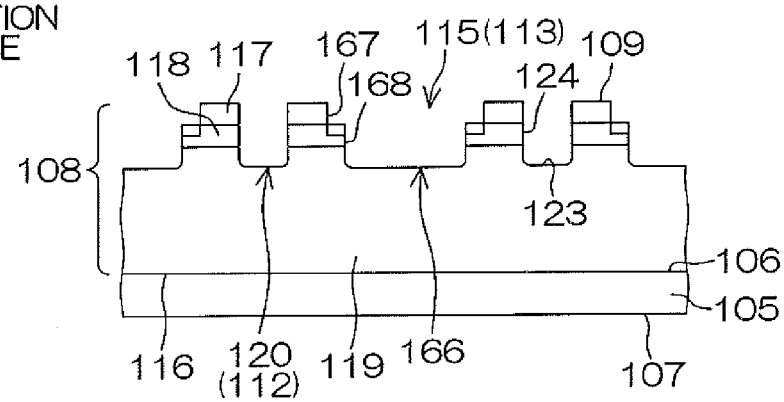
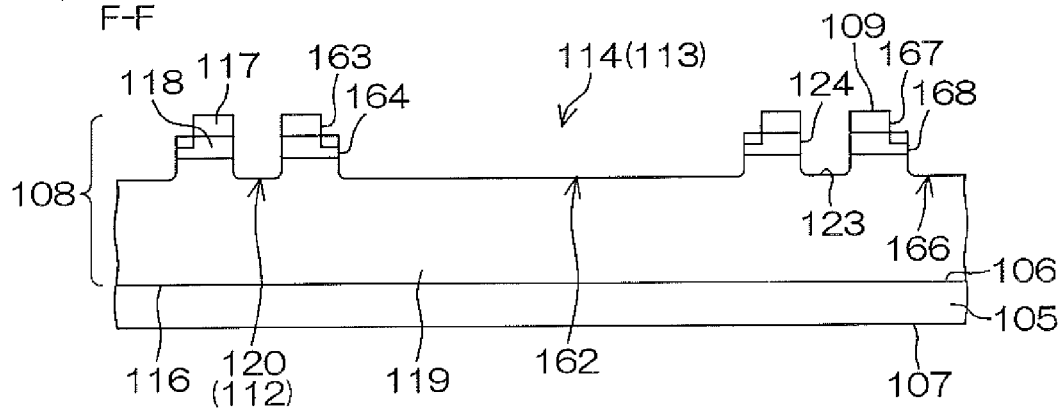
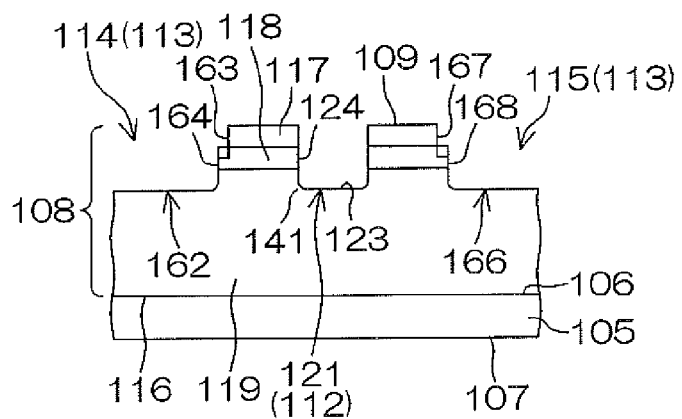

FIG. 13E
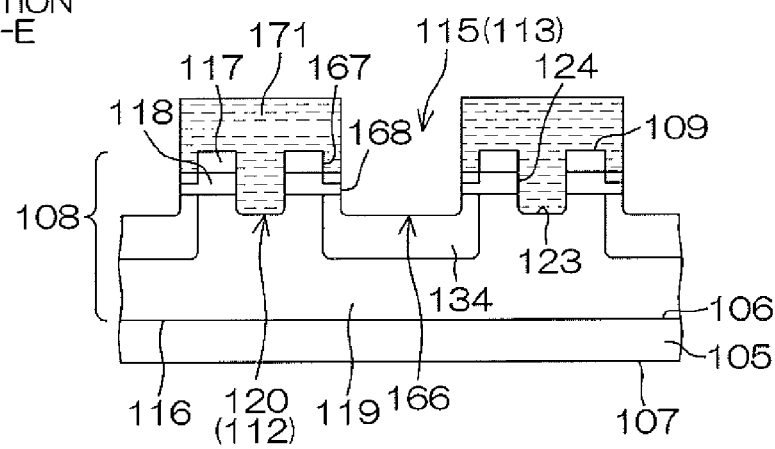
CROSS SECTION E-E
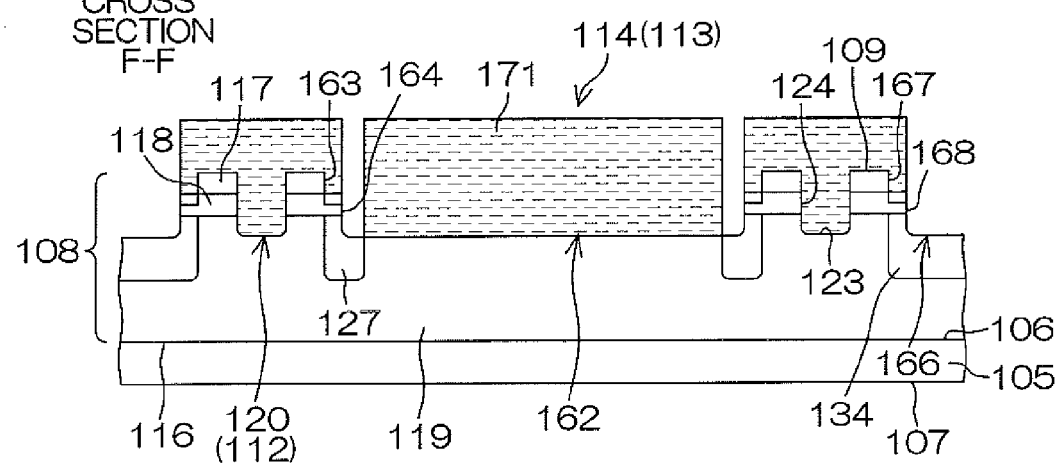
CROSS SECTION F-F
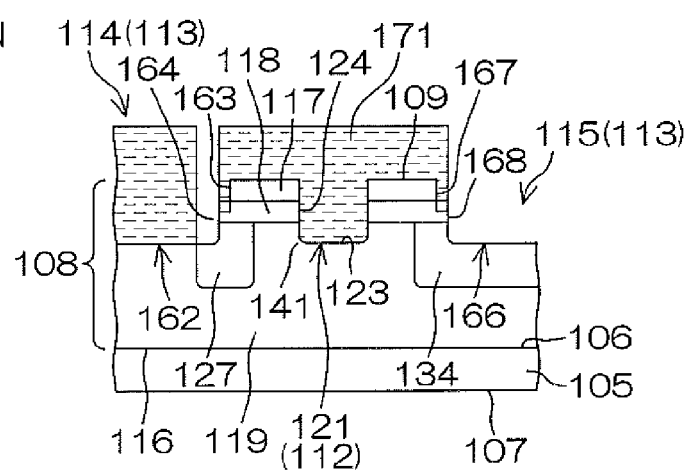
CROSS SECTION G-G FIG. 13F
CROSS SECTION E-E
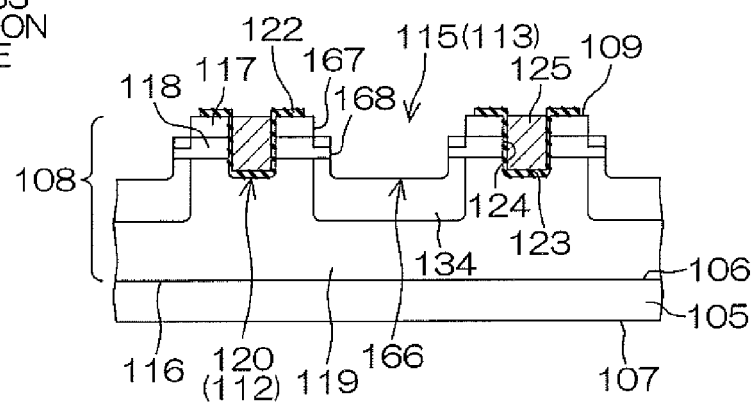
CROSS SECTION F-F
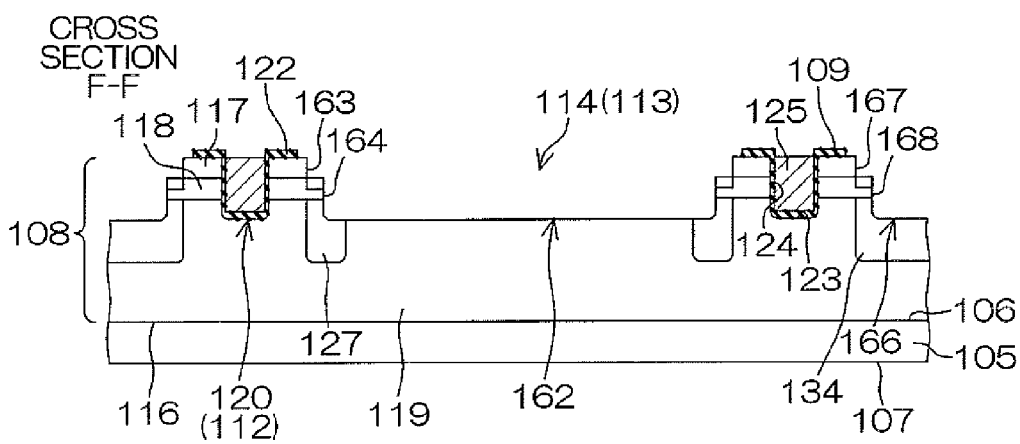
CROSS SECTION G-G
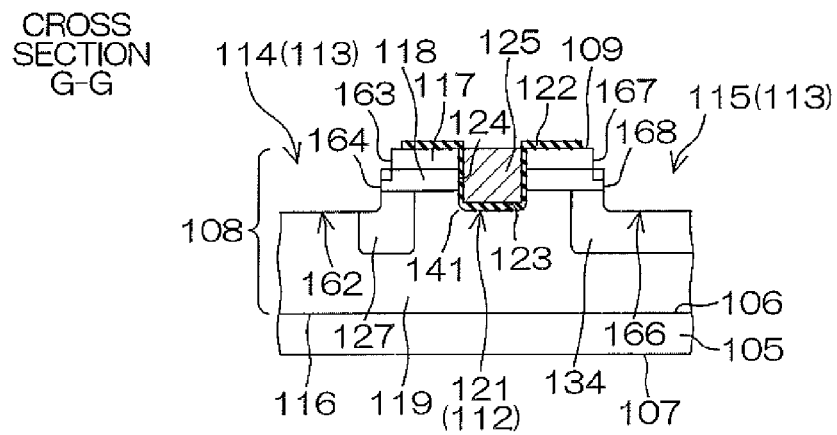

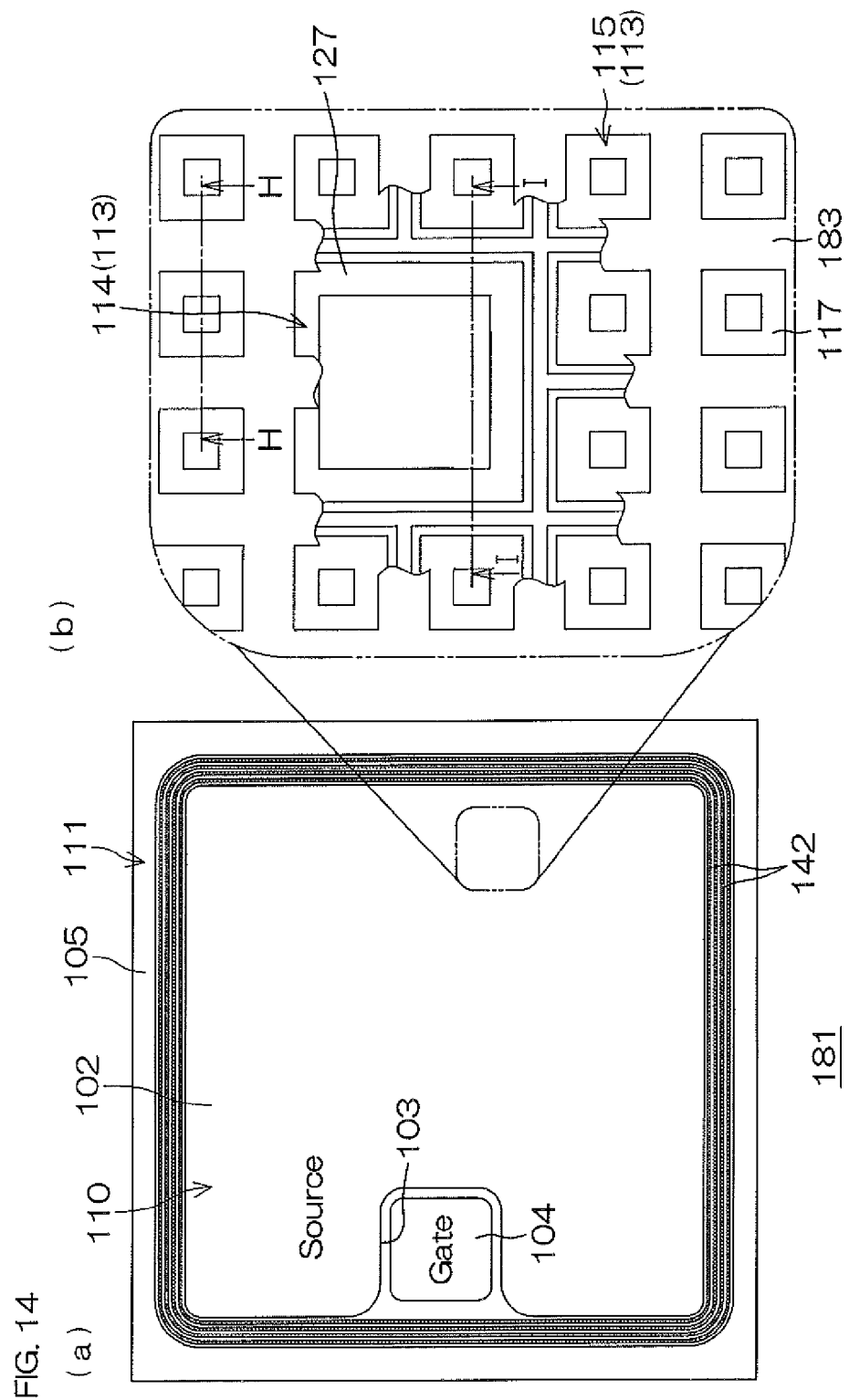

FIG. 15
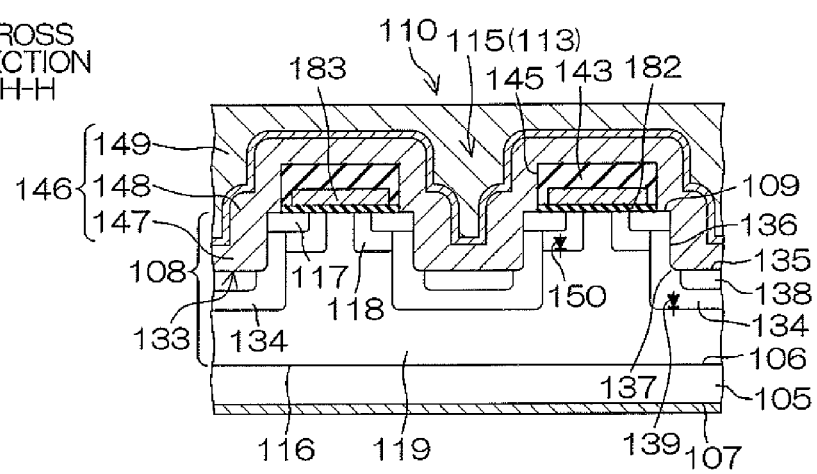
CROSS SECTION H-H
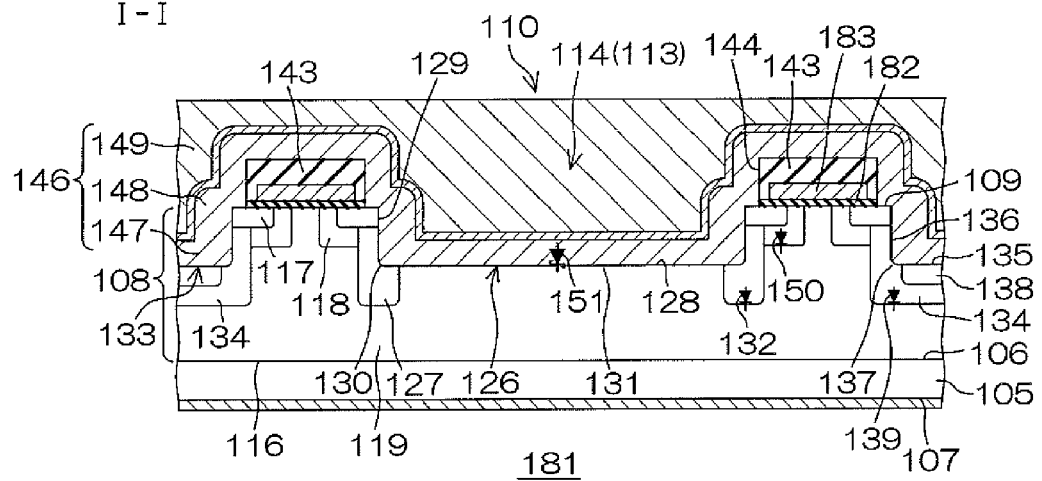
CROSS SECTION I-I

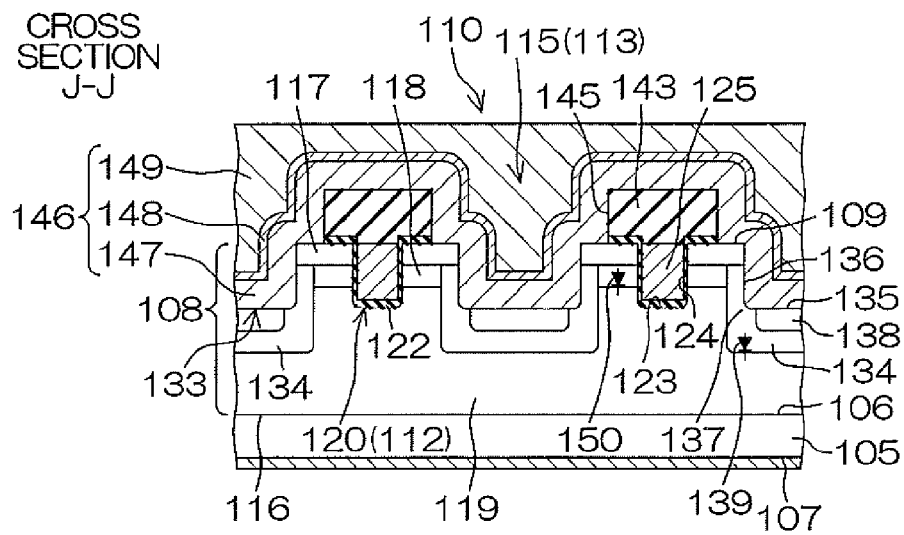
FIG. 17
CROSS SECTION J-J
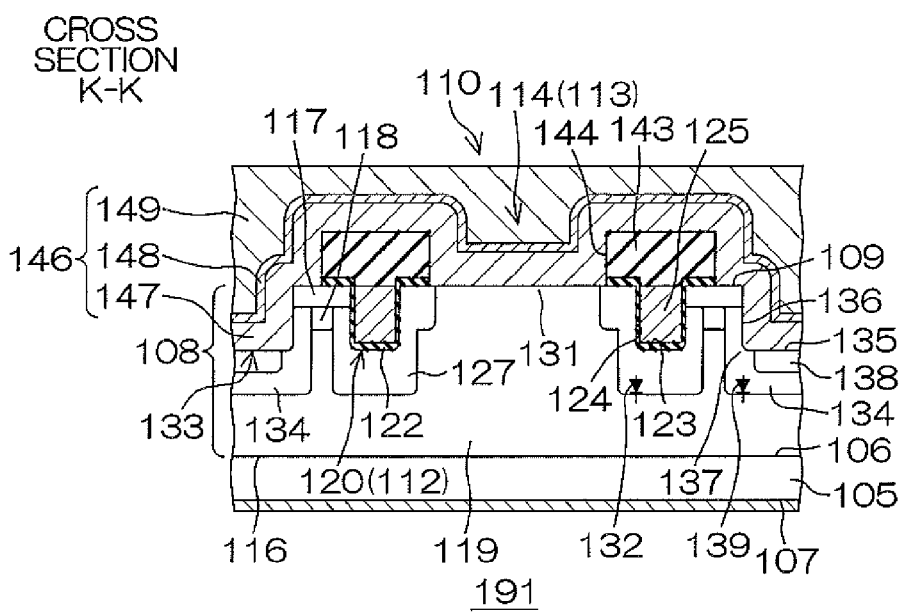
CROSS SECTION K-K

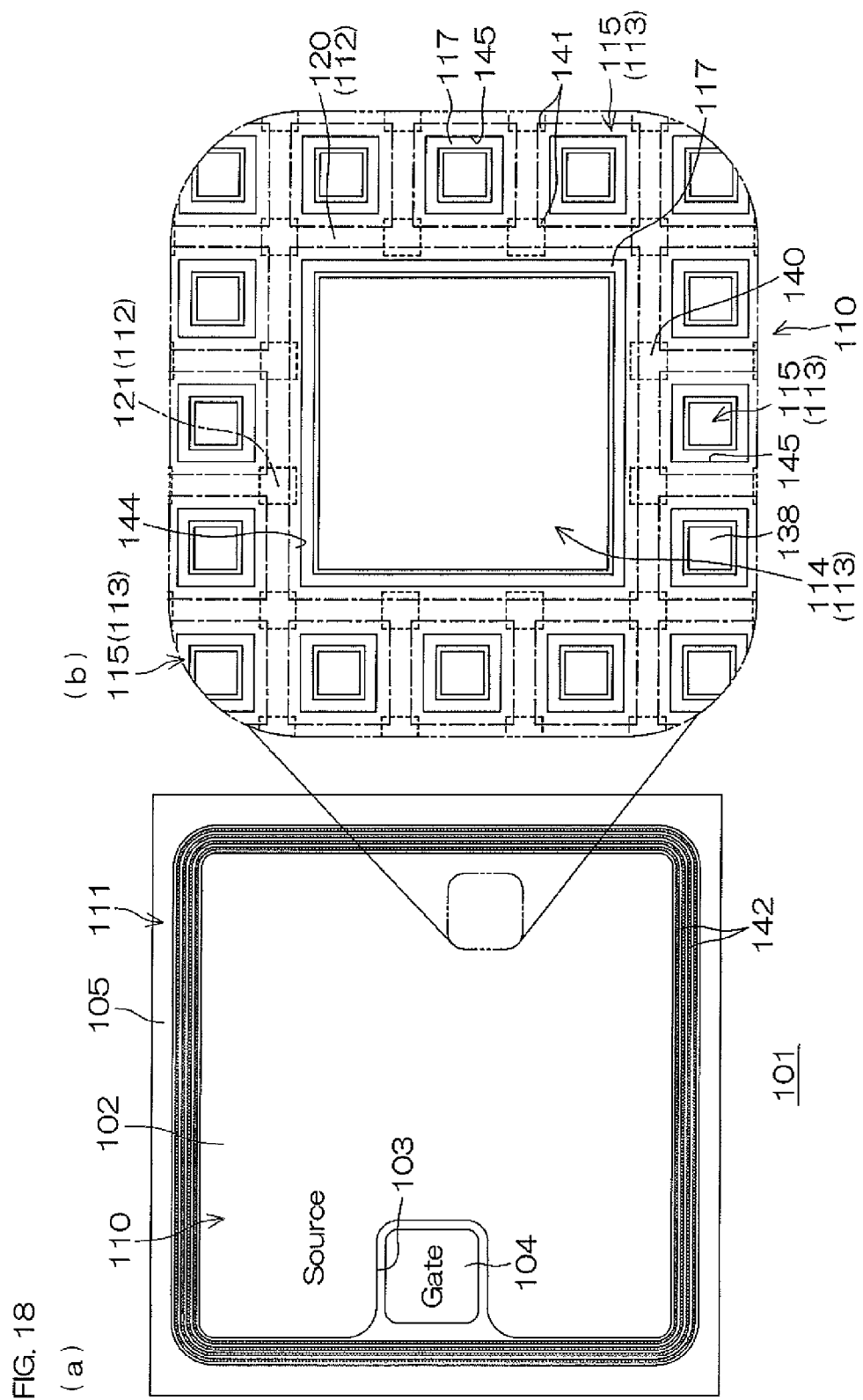

SEMICONDUCTOR DEVICE HAVING A BREAKDOWN VOLTAGE HOLDING REGION

TECHNICAL FIELD

The present invention relates to a semiconductor device.

BACKGROUND ART

As an alternative power device material to a Si semiconductor, a SiC (silicon carbide) semiconductor which can realize higher withstanding voltage, higher current, lower ON resistance and the like than a Si semiconductor has become the focus of attention in recent years (see Patent Document 1, for example).

A SiC power device is utilized as a switching element of various kinds of inverter circuits to be incorporated in, for example, a motor control system, an electricity exchange system or the like.

When a SiC power device (a switching element) in a motor control circuit or the like is turned off to interrupt electric current flowing through a motor coil, electromagnetic induction of the motor coil causes a diode to consume counter electromotive force generated in the motor coil.

In particular, application of high counter electromotive force to a switching element is prevented by causing electric current generated due to the counter electromotive force to flow to a motor coil as reflux current, by virtue of rectification of a parasitic diode (a body diode) by p-n junction between a p-type channel region and an n-type drain region existing in a device.

PRIOR ART DOCUMENTS

Patent Documents

Patent Document 1: Japanese Unexamined Patent Publication No.

BRIEF SUMMARY OF THE INVENTION

Problems to be Solved by the Invention

When a positive hole (a hole) transfers from a p-type channel region to an n-type drain region in a p-n body diode and electric current flows, a majority carrier electron sometimes recombines with a positive hole, which has transferred from the p-type channel region, in the n-type drain region. Energy generated at the time of recombination may possibly cause expansion of a crystal defect of SiC and increase in ON resistance of the SiC power device. Moreover, a p-n body diode of SiC has another problem that Vf (forward voltage) is high, which causes high loss.

Thus, according to a study by the present inventor, a possible countermeasure is to form a trench lying from an n-type source region through a p-type channel region to an n-type drain region at a position different from that of a gate trench, so as to form a Schottky junction between a source electrode and the n-type drain region exposed in the trench. With such a countermeasure, when counter electromotive force is generated, it is possible to cause electric current to flow preferentially to the Schottky junction, and it may be therefore possible to decrease or eliminate electric current flowing to a p-n channel diode.

However, since a contact face of a drain region to contact a source electrode has an electric potential equal to that of a source electrode, the interval between equipotential lines becomes extremely narrow around the contact face. As a result, an electric field may possibly concentrate on a gate insulating film, causing a dielectric breakdown of the gate insulating film.

It is an object of the present invention to provide a semiconductor device which can suppress an increase in ON resistance and enhance withstanding voltage.

Means for Solving the Problems

A semiconductor device according to one aspect of the present invention for achieving the above object is a semiconductor device having a semiconductor layer comprising a wide band gap semiconductor, wherein the semiconductor layer includes: a first conductivity-type source region formed so as to be exposed to the surface side of the semiconductor layer, a second conductivity-type channel region formed at the reverse face side of the semiconductor layer with respect to the source region so as to contact the source region, a first conductivity-type drain region formed at the reverse face side of the semiconductor layer with respect to the channel region so as to contact the channel region, a source trench which lies from the surface of the semiconductor layer through the source region and the channel region to the drain region and has a side face and a bottom face, a gate insulating film formed so as to contact the channel region, a gate electrode facing the channel region with the gate insulating film interposed therebetween, and a first breakdown voltage holding region of a second conductivity type formed selectively on the side face or the bottom face of the source trench, and the semiconductor device includes a barrier formation layer, which is joined with the drain region in the source trench, for forming, by junction with the drain region, a junction barrier lower than a diffusion potential of a body diode formed by p-n junction between the channel region and the drain region.

Such a semiconductor device in which a wide band gap semiconductor (having a band gap Eg equal to or higher than 2 eV, or preferably 2.5 eV to 7 eV, for example) is employed is utilized as a switching element, for example. In such a case, electric current flowing to a load is turned on/off by turning on/off gate voltage in a state where voltage is applied across the source region and the drain region so that the drain region side becomes positive.

In a case where a load is inductive, counter electromotive force is generated at the load when electric current flowing to the load is interrupted (that is, gate voltage is turned off). Due to the counter electromotive force, voltage is sometimes applied across the source region and the drain region so that the source region side becomes positive.

In such a case, electric current flows preferentially to a junction part of a barrier formation layer and a drain region, and it is therefore possible to decrease or eliminate electric current flowing to a body diode. In such a manner, it is possible to cause electric current, which has flown through a semiconductor device, to flow to a load as reflux current, for example.

As described above, electric current in an OFF state passes through the barrier formation layer, and therefore carrier transfer between the channel region and the drain region rarely occurs. Accordingly, it is possible to suppress or prevent recombination of a positive hole and an electron in the drain region. As a result, it is possible to suppress expansion of a crystal defect of a wide band gap semiconductor, and it is therefore possible to suppress an increase in the ON resistance of a transistor.

Furthermore, in a semiconductor device according to one aspect of the present invention, a first breakdown voltage holding region is formed selectively in a drain region on a side face or a bottom face of a source trench. This makes it possible to form a body diode, which is formed by junction (p-n junction) between the first breakdown voltage holding region and the drain region, at the reverse face side of the semiconductor layer with respect to a junction part of the barrier formation layer and the drain region. Consequently, it is possible to generate a depletion layer, which is generated in the body diode, around the source trench. Existence of such a depletion layer makes it possible to keep an equipotential surface of a high potential based on a gate electrode away from the gate insulating film. As a result, it is possible to weaken the electric field applied to the gate insulating film, and it is therefore possible to suppress a dielectric breakdown.

The barrier formation layer may be a layer for forming, between the same and the drain region, a junction barrier lower than a diffusion potential of a body diode, by forming a hetero junction or Schottky junction with the drain region comprising a wide band gap semiconductor. For forming a hetero junction, for example, the barrier formation layer is preferably made of Poly-Si. On the other hand, for forming a Schottky junction, the barrier formation layer is preferably made of one compound selected from the group consisting of Ni, Ti, Al and Mo.

Moreover, it is preferable that the semiconductor layer includes a lattice-shaped gate trench which lies from the surface of the semiconductor layer through the source region and the channel region to the drain region and has a side face and a bottom face, and a plurality of polygonal prism-shaped unit cells which are sectioned by the lattice-shaped gate trench and have a plurality of corner parts, each unit cell has the source region, the channel region and the drain region, the gate insulating film is formed on the side face and the bottom face of the gate trench, the gate electrode is buried in the gate trench so as to face the channel region with the gate insulating film interposed therebetween, the first breakdown voltage holding region is formed selectively at an edge part of the source trench where the side face intersects with the bottom face, at a region of a part of the source trench so as to expose the drain region to the bottom face of the source trench, and the barrier formation layer is joined with the drain region exposed to the bottom face of the source trench.

Regarding such a structure, the present inventors have diligently studied the mechanism of a dielectric breakdown of a gate insulating film at the time of turning off at a trench gate-type MIS transistor.

In particular, when voltage is applied across the source region and the drain region functioning as a drain (across a source and a drain) so that the drain region becomes (+) side in a state where the semiconductor device is off (that is, in a state where gate voltage is 0V), electric field is applied to the gate insulating film interposed between the gate electrode and the drain region. Such electric field is generated due to the potential difference between the gate electrode and the drain region. Additionally, at a bottom part of the gate trench, an equipotential surface of an extremely high electric potential based on the gate electrode (0V) is distributed, and extremely strong electric field is generated since the interval between equipotential surfaces is small. Accordingly, the mechanism is that a position on a bottom part of the gate trench at the gate insulating film cannot resist electric field concentration to such a size and a dielectric breakdown occurs when voltage as high as device withstanding voltage continues to be applied across the source and the drain.

In such a semiconductor device, the barrier formation layer is joined with the drain region on the bottom face of the source trench. On the other hand, by forming the first breakdown voltage holding region at an edge part of the source trench, it is possible to form the body diode around the edge part of the source trench. This makes it possible to broaden a depletion layer, which is generated in the body diode, between the gate trench and the source trench, and therefore makes it possible to prevent denseness of equipotential surfaces between the gate trench and the source trench. As a result, it is possible to weaken the electric field applied to the bottom part of the gate trench and to weaken the electric field applied to the gate insulating film. Accordingly, it is possible to suppress a breakdown of the gate insulating film.

Moreover, the semiconductor layer preferably further includes a second breakdown voltage holding region of a second conductivity type, which is formed selectively at a corner edge part of the gate trench formed at the corner part of the unit cell.

When the gate trench is formed in a lattice shape and a unit cell having a polygonal prism shape is located at a window part of the lattice-shaped gate trench, a dielectric breakdown of the gate insulating film tends to occur especially around the corner edge part of the gate trench formed at a corner part of the unit cell. Consequently, when the second breakdown voltage holding region is formed at the corner edge part, it is possible to effectively suppress a dielectric breakdown of the gate insulating film around the corner edge part.

When the second breakdown voltage holding region is formed at a corner edge part of the gate trench, the second breakdown voltage holding region may be formed so as to reach a part of the channel region immediately above the corner edge part.

In a unit cell having a polygonal prism shape, by controlling voltage applied to the gate electrode, a channel is formed along a side face of the unit cell which forms a part of a side face of the gate trench. That is, no channel is formed at the corner part of the unit cell or, even when a channel is formed, only a small amount of electric current flows to the channel. Consequently, by forming the second breakdown voltage holding region so as to reach a part of the channel region immediately above the corner edge part, it is possible to further enhance the breakdown prevention effect of the gate insulating film while having little impact on the performance of the device.

Moreover, when the second breakdown voltage holding region is formed at a corner edge part of the gate trench, the second breakdown voltage holding region may be formed selectively at an intersection part of the lattice-shaped gate trench.

Moreover, it is preferable that the semiconductor layer is formed on a bottom face of a linear part of the lattice-shaped gate trench, and further includes a third breakdown voltage holding region of a second conductivity type having a width smaller than the width of the linear part.

With such a structure, even when an electric field generated along a linear part of the gate trench acts on the gate insulating film, a depletion layer generated by junction (p-n junction) between the third breakdown voltage holding region and the drain region makes it possible to reduce the electric field. As a result, it is possible to reduce the electric field generated at the gate insulating film evenly.

Furthermore, since the third breakdown voltage holding region is not formed on a side face (i.e., a part of a unit cell where a channel is formed) of a linear part of the gate trench, it is also possible to prevent lowering of the performance of the device.

Moreover, an impurity concentration of the third breakdown voltage holding region is preferably higher than the impurity concentration of the second breakdown voltage holding region. Moreover, a thickness of the third breakdown voltage holding region is preferably smaller than the thickness of the second breakdown voltage holding region.

With such a structure, it is possible to suppress an increase in channel resistance. In addition, a thickness of the second and third breakdown voltage holding regions means, for example, a thickness along a direction from the surface of the semiconductor layer to the reverse face side.

Moreover, the semiconductor device may include a planar gate-type MIS transistor. That is, in a semiconductor device according to one aspect of the present invention, the channel region may be formed to have a polygonal planar view having a plurality of corner parts so as to be exposed to the surface of the semiconductor layer, the channel regions may be arranged in a matrix manner, the source region may be formed in a well manner so as to be exposed to the surface of the channel region, the gate insulating film may be formed on the channel region exposed to the surface of the semiconductor layer, the first breakdown voltage holding region may be formed selectively at an edge part of the source trench where the side face intersects with the bottom face, at a region of a part of the source trench so as to expose the drain region to the bottom face of the source trench, and the barrier formation layer may be joined with the drain region exposed to the bottom face of the source trench.

Moreover, the semiconductor layer preferably further includes an interchannel region extended between adjacent channel regions, and a fourth breakdown voltage holding region of a second conductivity type formed selectively at a corner part of the interchannel region formed at the corner part of the channel region.

In a planar gate-type MIS transistor in which channel regions are formed in a matrix manner, a dielectric breakdown of the gate insulating film tends to occur especially around a corner part of the interchannel region. Consequently, when the fourth breakdown voltage holding region is formed at the corner part of the interchannel region, it is possible to effectively suppress a dielectric breakdown of the gate insulating film around the corner part.

Furthermore, at a channel region having a polygonal planar view, a channel is formed along the respective sides of the channel region by controlling voltage applied to the gate electrode. That is, no channel is formed at a corner part of the channel region or, even when a channel is formed, only a small amount of electric current flows through the channel. Consequently, by forming the fourth breakdown voltage holding region at a corner part at the interchannel region, it is possible to further enhance the breakdown prevention effect of the gate insulating film while exerting little impact on the performance of the device.

Moreover, the semiconductor layer preferably further includes a fifth breakdown voltage holding region of a second conductivity type, which is formed at the linear part of the interchannel region and has a width smaller than the width of the linear part.

With such a structure, even when an electric field generated along the linear part of the interchannel region acts on the gate insulating film, a depletion layer generated by junction (p-n junction) between the fifth breakdown voltage holding region and the drain region makes it possible to reduce the electric field. As a result, it is possible to reduce the electric field generated at the gate insulating film evenly.

Furthermore, since the fifth breakdown voltage holding region is not formed on a side face (i.e., a part of a unit cell where a channel is formed) of a linear part of the interchannel region, it is also possible to prevent lowering of the performance of the device.

Moreover, the drain region preferably has a step part formed by projecting the bottom face of the source trench selectively to the surface side of the semiconductor layer.

This makes it possible to increase an area of junction between the barrier formation layer and the drain region, and it is therefore possible to weaken the electric field applied to the barrier formation layer. As a result, it is possible to reduce leakage of electric current between the barrier formation layer and the drain region.

Moreover, a semiconductor device according to another aspect of the present invention includes a semiconductor layer comprising a wide band gap semiconductor, and a gate part which is formed at the semiconductor layer to section the semiconductor layer into a plurality of cells, wherein a cell includes a first MIS transistor structure, which has a first conductivity-type source region, a second conductivity-type channel region and a first conductivity-type drain region formed in this order from the surface side of the semiconductor layer toward the reverse face side and has a first source trench formed so as to lie from the surface of the semiconductor layer through the source region and the channel region to the drain region with a deepest part thereof, a p-n diode cell, which has a first breakdown voltage holding region of a second conductivity type formed selectively on the inner face of the first source trench and includes a p-n diode constructed by p-n junction between the first breakdown voltage holding region and the drain region, and a Schottky cell formed by selectively exposing a first conductivity-type Schottky region united with the drain region, and the semiconductor device further includes a source electrode, which is formed across the p-n diode cell and the Schottky cell, for forming an ohmic contact with the source region and forming a Schottky barrier lower than a diffusion potential of the body diode formed by p-n junction between the channel region and the drain region, with respect to the Schottky region.

A semiconductor device in which such a wide band gap semiconductor (having a band gap Eg equal to or larger than 2 eV, or preferably 2.5 eV to 7 eV, for example) is employed is utilized as a switching element, for example. In such a case, electric current flowing to a load is turned on/off by turning on/off gate voltage in a state where voltage is applied across the source region and the drain region so that the drain region side becomes positive.

In a case where a load is inductive, counter electromotive force is generated at the load when electric current flowing to the load is interrupted (that is, gate voltage is turned off). Due to such counter electromotive force, voltage is sometimes applied across the source region and the drain region so that the source region side becomes positive.

In such a case, electric current flows preferentially to a junction part (a Schottky barrier diode) of the Schottky region and the source electrode, and it is possible to decrease or eliminate electric current flowing to the body diode. In such a manner, electric current which has flown through the semiconductor device can be made to flow to a load as reflux flow, for example.

As described above, since electric current in an OFF state flows through the Schottky barrier diode of the Schottky cell, carrier transfer between the channel region and the drain region rarely occurs. Accordingly, it is possible to suppress or prevent recombination of a positive hole and an electron in the drain region. As a result, it is possible to suppress expansion of a crystal defect of a wide band gap semiconductor, and it is therefore possible to suppress an increase in ON resistance of the transistor. Moreover, it is possible to decrease or eliminate electric current flowing to the body diode, and it is therefore possible to reduce loss during operation of the semiconductor device.

Furthermore, in a semiconductor device of the present invention, the first breakdown voltage holding region is formed selectively on the inner face of the first source trench. This makes it possible to form a body diode to be formed by junction (p-n junction) between the first breakdown voltage holding region and the drain region. Consequently, it is possible to generate a depletion layer, which is generated at the body diode, around the first source trench. Existence of such a depletion layer can keep an equipotential surface of a high potential away from the gate part. As a result, it is possible to prevent a dielectric breakdown at the gate part.

Moreover, in a semiconductor device according to another aspect of the present invention, the source electrode may have a barrier formation layer for forming, between the same and the Schottky region, a junction barrier lower than a diffusion potential of the body diode, by forming a hetero junction or Schottky junction with the Schottky region comprising a wide band gap semiconductor.

That is, regarding a semiconductor device according to another aspect of the present invention, the concept of a source electrode includes both of a metal electrode for forming, between the same and the Schottky region, a Schottky barrier to form a Schottky barrier diode, and a semiconductor electrode which comprises a different kind of a semiconductor having a band gap different from the band gap of a semiconductor layer and is joined with the Schottky region by a hetero junction (junction for forming a potential barrier between the same and the Schottky region using a band gap) to form a hetero junction diode. Moreover, the concept of a Schottky region also includes a region for forming a hetero junction between the same and the source region.

For forming a hetero junction, for example, the barrier formation layer is preferably made of polysilicon. On the other hand, for forming a Schottky junction, the barrier formation layer is preferably made of one compound selected from the group consisting of Ni, Ti, Al and Mo.

Moreover, in a semiconductor device according to another aspect of the present invention, it is preferable that the first breakdown voltage holding region in the p-n diode cell is formed so as to lie from the bottom face of the first source trench along the side face of the source trench to the channel region, and the p-n diode cell is formed on the bottom face of the first source trench and further includes a second conductivity-type channel contact region having an impurity concentration higher than that of the first breakdown voltage holding region.

With such a structure, it is possible to establish contact (connect electrically) with a channel region of a p-n diode cell via the first breakdown voltage holding region.

Moreover, in a semiconductor device according to another aspect of the present invention, it is preferable that the first source trench in the p-n diode cell has a two-step structure including a first upper trench having a depth from the surface of the semiconductor layer to the channel region and a first lower trench having a width smaller than that of the first upper trench and a depth from the channel region to the drain region, and the p-n diode cell further includes a second conductivity-type channel contact region, which is formed at the channel region exposed to a step part of the first upper trench and the first lower trench and has an impurity concentration higher than that of the channel region.

With such a structure, it is possible to establish contact directly with the channel region of the first MIS transistor structure of a p-n diode cell. As a result, it is possible to control the electric potential of the channel region precisely.

Moreover, in a semiconductor device according to another aspect of the present invention, it is preferable that the Schottky cell has a first conductivity-type source region, a second conductivity-type channel region and a first conductivity-type drain region arranged in this order from the surface side of the semiconductor layer toward the reverse face side and further includes a second MIS transistor structure having a second source trench formed so as to lie from the surface of the semiconductor layer through the source region and the channel region to the drain region and a second breakdown voltage holding region formed selectively at an edge part of the second source trench formed by intersection of the side face and the bottom face of the second source trench, and the Schottky region is formed on the bottom face of the second source trench surrounded by the second breakdown voltage holding region.

This makes it possible to form a body diode formed by junction (p-n junction) between the second breakdown voltage holding region and the drain region. Consequently, it is possible to generate a depletion layer, which is generated at the body diode, around the second source trench. Existence of such a depletion layer can keep an equipotential surface of a high electric potential from the gate part. As a result, it is possible to prevent a dielectric breakdown at the gate part.

Moreover, in a semiconductor device according to another aspect of the present invention, the Schottky region is preferably formed to have an area not to link with a depletion layer generated from a junction part of the Schottky region and the second breakdown voltage holding region. For example, the area of the Schottky cell is preferably larger than the area of the p-n diode cell.

With such a structure, it is possible to prevent an electric current path from being closed by the depletion layer when the Schottky barrier diode (a hetero junction diode) operates. As a result, it is possible to lower the ON resistance of the Schottky barrier diode (a hetero junction diode).

Moreover, in a semiconductor device according to another aspect of the present invention, it is preferable that the second source trench in the Schottky cell has a two-step structure including a second upper trench having a depth from the surface of the semiconductor layer to the channel region and a second lower trench having a width smaller than that of the second upper trench and a depth from the channel region to the drain region, the second breakdown voltage holding region is formed so as to reach the channel region along the side face of the second lower trench, and the Schottky cell further includes a second conductivity-type channel contact region which is formed at the channel region exposed to a step part of the second upper trench and the second lower trench and has an impurity concentration higher than that of the channel region.

With such a structure, it is possible to establish contact directly with the channel region of the second MIS transistor structure of the Schottky cell. As a result, it is possible to control the electric potential of the channel region precisely.

Moreover, it is also possible to establish contact with the second breakdown voltage holding region.

Moreover, in a semiconductor device according to another aspect of the present invention, the gate part may include a gate trench formed at the semiconductor layer, a gate insulating film formed on the inner face of the gate trench and a gate electrode formed at the inner side of the gate insulating film at the gate trench, or may include a gate insulating film formed on the semiconductor layer and a gate electrode formed on the gate insulating film.

When the gate trench is formed in a lattice shape, the semiconductor device preferably further includes a second conductivity-type relay region, which is formed across the p-n diode cell and the Schottky cell with an intersection part of the gate trench interposed therebetween, for connecting electrically the first breakdown voltage holding region with the second breakdown voltage holding region.

With such a structure, it is possible to establish contact with the channel region of the Schottky cell via the relay region.

Moreover, in a semiconductor device according to another aspect of the present invention, the Schottky cell is preferably surrounded by the p-n diode cells.

Moreover, when the gate part is formed in a lattice shape wherein the p-n diode cells having the same size are arranged in a matrix manner, each Schottky cell preferably has an area corresponding to that of four or nine p-n diode cells.

Moreover, in a semiconductor device according to another aspect of the present invention, the Schottky cell and the p-n diode cell may include a quadrangular cell formed in a quadrangle, include a hexagonal cell formed in a hexagon, or include a stripe cell formed in a stripe shape.

BRIEF DESCRIPTION OF THE DRAWINGS

FIG. 1(a) illustrates a general view, and FIG. 1(b) illustrates an enlarged view of an inner part.

FIG. 2 are sectional views of the trench gate-type MIS transistor illustrated in FIGS. 1(a) and 1(b), and illustrate cutting planes respectively along cutting plane lines A-A and B-B in FIG. 1(b).

FIG. 3A are schematic sectional views for illustrating a part of the manufacturing process steps of the trench gate-type MIS transistor illustrated in FIG. 2, and illustrate cutting planes at the same positions as FIG. 2.

FIG. 3B are views for illustrating the next process step of FIG. 3A.

FIG. 3C are views for illustrating the next process step of FIG. 3B.

FIG. 3D are views for illustrating the next process step of FIG. 3C.

FIG. 3E are views for illustrating the next process step of FIG. 3D.

FIG. 3F are views for illustrating the next process step of FIG. 3E.

FIG. 5(a) illustrates a general view, and FIG. 5(b) illustrates an enlarged view of an inner part.

FIG. 6 are sectional views of the planar gate-type MIS transistor illustrated in FIGS. 5(a) and 5(b), and illustrate cutting planes respectively along cutting plane lines C-C and D-D in FIG. 5(b).

FIG. 7A are schematic sectional views for illustrating a part of the manufacturing process steps of the planar gate-type MIS transistor illustrated in FIG. 6, and illustrate cutting planes at the same positions as FIG. 6.

FIG. 7B are views for illustrating the next process step of FIG. 7A.

FIG. 7C are views for illustrating the next process step of FIG. 7B.

FIG. 7D are views for illustrating the next process step of FIG. 7C.

FIG. 7E are views for illustrating the next process step of FIG. 7D.

FIG. 7F are views for illustrating the next process step of FIG. 7E.

FIG. 8 are schematic sectional views for illustrating a modification example of the planar gate-type MIS transistor illustrated in FIG. 6.

FIGS. 9(a) and 9(b) are schematic plan views of a trench gate-type MIS transistor according to a Third Preferred Embodiment of the present invention, FIG. 9(a) illustrates a general view, and FIG. 9(b) illustrates an enlarged view of an inner part.

FIG. 10 are sectional views of the trench gate-type MIS transistor in FIGS. 9(a) and 9(b), and illustrate cutting planes respectively along cutting plane lines E-E, F-F and G-G in FIG. 9(b).

FIG. 11A are schematic sectional views for illustrating a part of the manufacturing process steps of the trench gate-type MIS transistor in FIG. 10, and illustrate cutting planes at the same positions as FIG. 10.

FIG. 11B are views for illustrating the next process step of FIG. 11A.

FIG. 11C are views for illustrating the next process step of FIG. 11B.

FIG. 11D are views for illustrating the next process step of FIG. 11C.

FIG. 11E are views for illustrating the next process step of FIG. 11D.

FIG. 11F are views for illustrating the next process step of FIG. 11E.

FIG. 12 are schematic sectional views of a trench gate-type MIS transistor according to a Fourth Preferred Embodiment of the present invention, and illustrate cutting planes at the same positions as FIG. 10.

FIG. 13A are schematic sectional views for illustrating a part of the manufacturing process steps of the trench gate-type MIS transistor in FIG. 12, and illustrate cutting planes at the same positions as FIG. 12.

FIG. 13B are views for illustrating the next process step of FIG. 13A.

FIG. 13C are views for illustrating the next process step of FIG. 13B.

FIG. 13D are views for illustrating the next process step of FIG. 13C.

FIG. 13E are views for illustrating the next process step of FIG. 13D.

FIG. 13F are views for illustrating the next process step of FIG. 13E.

FIGS. 14(a) and 14(b) are schematic plan views of a planar gate-type MIS transistor according to the Third Preferred Embodiment of the present invention, FIG. 14(a) illustrates a general view, and FIG. 14(b) illustrates an enlarged view of an inner part.

FIG. 15 are sectional views of the planar gate-type MIS transistor in FIGS. 14(a) and 14(b), and illustrate cutting planes respectively along cutting plane lines H-H and I-I in FIG. 14(b).

FIG. 16(a) illustrates a general view, and FIG. 16(b) illustrates an enlarged view of an inner part.

FIG. 17 are sectional views of the trench gate-type MIS transistor in FIGS. 16(a) and 16(b), and illustrate cutting planes respectively along cutting plane lines J-J and K-K in FIG. 16(b).

FIGS. 18(a) and 18(b) are views for illustrating a modification example of a layout of the MIS transistor in FIGS. 9(a) and 9(b), FIG. 18(a) illustrates a general view, and FIG. 18(b) illustrates an enlarged view of an inner part.

MODES FOR CARRYING OUT THE INVENTION

The following description will explain preferred embodiments of the present invention in detail with reference to the accompanying drawings.

First Preferred Embodiment

Figure 1:
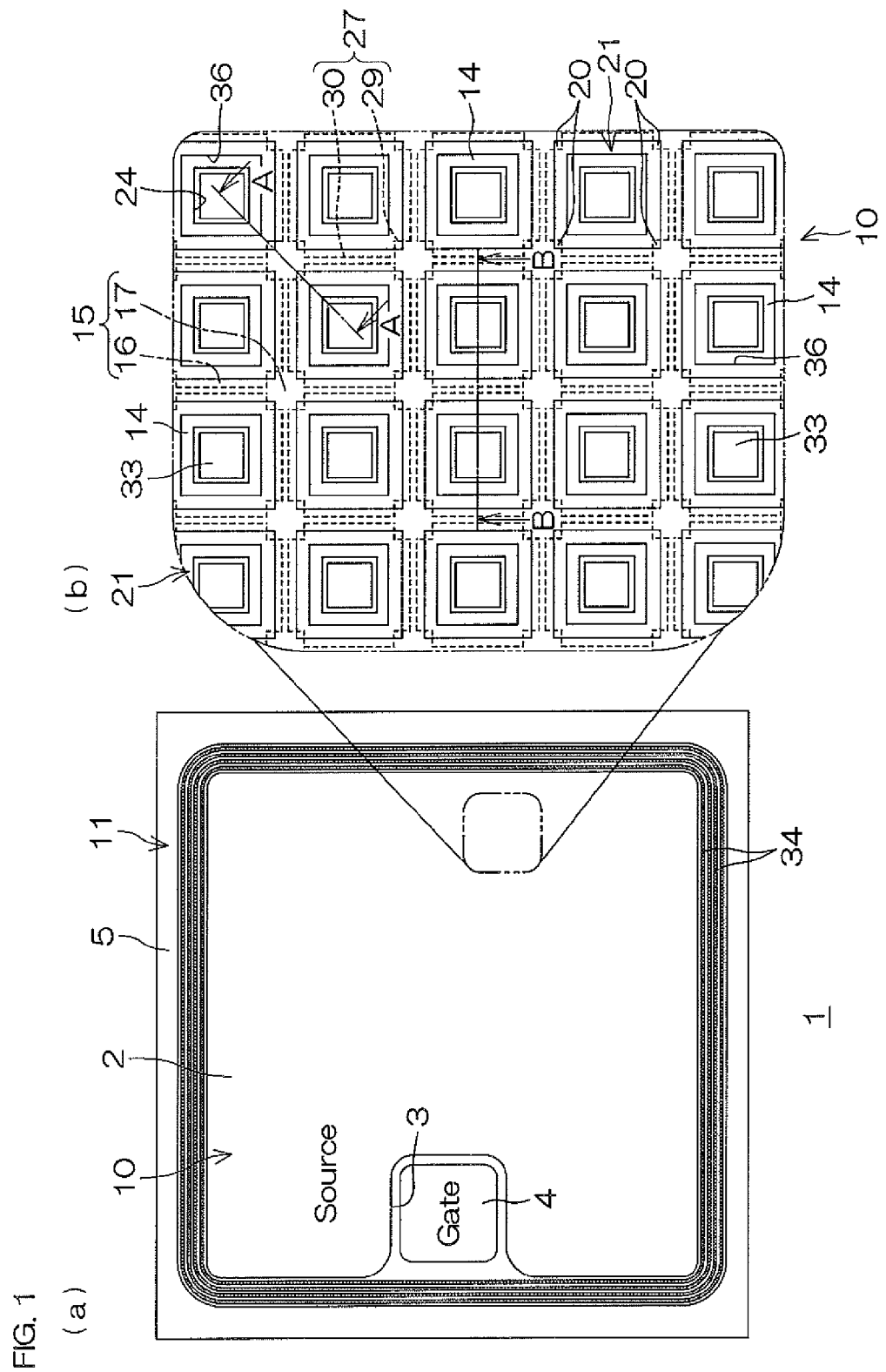
FIGS. 1(a) and 1(b) are schematic plan views of a trench gate-type MIS transistor according to a First Preferred Embodiment of the present invention.

FIGS. 1(a) and 1(b) are schematic plan views of a trench gate-type MIS transistor according to a First Preferred Embodiment of the present invention, FIG. 1(a) illustrates a general view, and FIG. 1(b) illustrates an enlarged view of an inner part. FIG. 2 are sectional views of the trench gate-type MIS transistor illustrated in FIGS. 1(a) and 1(b), and illustrate cutting planes respectively along cutting plane lines A-A and B-B in FIG. 1(b).

An MIS transistor 1 is a trench gate-type DMISFET (Double diffused Metal Insulator Semiconductor Field Effect Transistor) wherein SiC is employed, and is formed, for example, in a chip shape having a square planar view as illustrated in FIG. 1(a). The chip-shaped MIS transistor 1 has a length of approximately several millimeters respectively in the vertical direction and the lateral direction on the plane of paper of FIG. 1(a).

On the surface of the MIS transistor 1, a source pad 2 is formed. The source pad 2 has a substantially square planar view with four corners curved outward and is formed so as to cover substantially the whole area of the surface of the MIS transistor 1. The source pad 2 is provided with a removal region 3 formed around the center of one side thereof. The removal region 3 is a region where the source pad 2 is not formed.

A gate pad 4 is located at the removal region 3. A space is provided between the gate pad 4 and the source pad 2, so that the gate pad 4 and the source pad 2 are insulated from each other.

Next, the inner structure of the MIS transistor 1 will be explained.

The MIS transistor 1 is provided with a substrate 5 made of N$^+$ type (a concentration of $1\times10^{18}$ to $1\times10^{21}$ cm$^{-3}$, for example) SiC. The substrate 5 functions as a drain of the MIS transistor 1 in the First Preferred Embodiment and has a surface 6 (an upper face) which is a Si face and a reverse face 7 (a lower face) which is a C face.

On the surface 6 of the substrate 5, an epitaxial layer 8 made of n$^-$ type SiC having a concentration (a concentration of $1\times10^{15}$ to $1\times10^{17}$ cm$^{-3}$, for example) lower than that of the substrate 5 is laminated. The thickness of the epitaxial layer 8 functioning as a semiconductor layer is, for example, 1 μm to 100 μm. The epitaxial layer 8 is formed on the substrate 5 by so-called epitaxial growth. The epitaxial layer 8 formed on the surface 6 which is a Si face is grown on the Si face functioning as a growth principal face. Consequently, a surface 9 of the epitaxial layer 8 formed by growth is a Si face similar to the surface 6 of the substrate 5.

In the MIS transistor 1, an active region 10 is formed to be located at a central part of the epitaxial layer 8, when viewed planarly, and functions as the MIS transistor 1, and a transistor periphery region 11 is formed to surround the active region 10, as illustrated in FIG. 1(a).

On a surface part of the epitaxial layer 8 of the active region 10, a number of p-type (a concentration of $1.0\times10^{16}$ cm$^{-3}$ to $1.0\times10^{19}$ cm$^{-3}$, for example) channel regions 12 are formed and arranged in a matrix manner with a constant pitch in the longitudinal direction and the transverse direction. Each channel region 12 has a square planar view and has a length of approximately 7.2 μm respectively in the vertical direction and the lateral direction on the plane of paper of FIG. 1(b), for example.

On the other hand, a region of the epitaxial layer 8 at the substrate 5 side with respect to the channel region 12 is an n$^-$ type drain region 13 where the state immediately after epitaxial growth is maintained.

Each channel region 12 is provided with an n$^+$ type (a concentration of $1\times10^{18}$ to $1\times10^{21}$ cm$^{-3}$, for example) source region 14 formed on substantially the whole area at the surface 9 side.

Additionally, a gate trench 15 lying from the surface 9 of the epitaxial layer 8 through each source region 14 and each channel region 12 to the drain region 13 is formed in a lattice shape so as to surround each channel region 12.

In particular, the gate trench 15 includes a linear part 16 extended linearly, respectively in the longitudinal direction and the transverse direction along four side faces of each channel region 12 between adjacent channel regions 12, and an intersection part 17 where a linear part 16 extended in the longitudinal direction intersects with a linear part 16 extended in the transverse direction. When focusing on channel regions 12 arranged in two rows and two columns when viewed planarly, the intersection part 17 is a part having a square planar view, which is surrounded by inner corners of arranged four channel regions 12 and sectioned by extended lines of four sides of the channel regions 12. Moreover, the gate trench 15 has a U-shaped cross section in which a side face 18 and a bottom face 19 facing each other continue with a curved face interposed therebetween.

This forms a plurality of unit cells 21 of a rectangular parallelepiped shape (a square planar view) having four corner parts 20, at each window part of the epitaxial layer 8 surrounded by the lattice-shaped gate trench 15. Regarding each unit cell 21, the depth direction of the gate trench 15 is a gate length direction, and the circumferential direction of each unit cell 21 perpendicular to the gate length direction is a gate width direction.

On the inner face of the gate trench 15, a gate insulating film 22 made of SiO$_2$ is formed so as to cover the whole area thereof.

Additionally, by filling the inner side of the gate insulating film 22 with polysilicon material densely-doped with n-type impurity, a gate electrode 23 is buried in the gate trench 15. In such a manner, a vertical MIS transistor structure is constructed in which the source region 14 and the drain region 13 are arranged to be isolated with the channel region 12 interposed therebetween in a vertical direction perpendicular to the surface 9 of the epitaxial layer 8.

Moreover, at a central part of each unit cell 21, a source trench 24 having a square planar view is formed so as to lie from the surface 9 of the epitaxial layer 8 through each source region 14 and each channel region 12 to the drain region 13. The depth of the source trench 24 is equal to that of the gate trench 15 in the First Preferred Embodiment. Moreover, the source trench 24 also has a U-shaped cross section in which a side face 25 and a bottom face 26 facing each other continue with a curved face interposed therebetween, similar to the gate trench 15.

Moreover, the epitaxial layer 8 is provided with a p-type gate breakdown voltage holding region 27 and a source breakdown voltage holding region 28 functioning as a first breakdown voltage holding region, which are formed by implantation of p-type impurity into the epitaxial layer 8.

The gate breakdown voltage holding region 27 is formed along the lattice-shaped gate trench 15 and includes, as a unit, a first region 29 functioning as a second breakdown voltage holding region formed at the intersection part 17 of the gate trench 15 and a second region 30 functioning as a third breakdown voltage holding region formed at the linear part 16 of the gate trench 15.

The first region 29 is formed so as to lie through the bottom face 19 of the gate trench 15 at the intersection part 17 and a corner edge part 31 of the gate trench 15 formed below each corner part 20 of four unit cells 21 facing the intersection part 17 from the bottom face 19, to the channel region 12 immediately above the corner edge part 31. That is, the first region 29 is formed to have a square planar view slightly larger than the intersection part 17 of the gate trench 15 and each corner thereof goes into each corner part 20 of four unit cells 21 facing the intersection part 17. Moreover, the concentration of the first region 29 is higher than the concentration of the channel region 12 and higher than the concentration of the drain region 13, and is, for example, $1 \times 10^{17}$ to $9 \times 10^{19}$ cm$^{-3}$. Moreover, a thickness $T_1$ of the first region 29 along a direction from the bottom face of the gate trench 15 toward the substrate 5 is, for example, approximately 0.8 μm.

The second region 30 is formed linearly to have a constant width so as to link centers of the respective sides of adjacent intersection parts 17 with each other when viewed planarly and has a width (e.g., 0.8 μm) smaller than the width (the distance (e.g., 1 μm) between side faces of the gate trench 15 facing each other) of the linear part 16. Moreover, the concentration of the second region 30 is higher than the concentration of the channel region 12 and is higher than that of the first region 29, and is, for example, $2 \times 10^{17}$ to $1 \times 10^{20}$ cm$^{-3}$. Moreover, a thickness $T_2$ of the second region 30 along a direction from the bottom face of the gate trench 15 toward the substrate 5 is smaller than the thickness $T_1$ of the first region 29 (i.e., $T_1 > T_2$), and is, for example, approximately 0.7 μm.

The source breakdown voltage holding region 28 is formed to reach an edge part 32 of the source trench 24 where the bottom face 26 intersects with the side face 25, and the channel region 12 forming a part of the side face 25 of the source trench 24 from the edge part 32, so as to expose the bottom face 26 of the source trench 24.

This forms a drain exposed region 33 having a square planar view comprising a part of the drain region 13, at a central part of the bottom face 26 of the source trench 24.

Moreover, the concentration of the source breakdown voltage holding region 28 is equal to that of the first region 29 of the gate breakdown voltage holding region 27 (e.g., $1 \times 10^{17}$ to $9 \times 10^{19}$ cm$^{-3}$. Moreover, a thickness $T_3$ of the source breakdown voltage holding region 28 along a direction from the bottom face of the source trench 24 toward the substrate 5 is equal to the thickness $T_1$ of the first region 29 of the gate breakdown voltage holding region 27 (e.g., approximately 0.8 μm).

Moreover, at a surface part of the epitaxial layer 8 at the transistor periphery region 11, a plurality of (four in the First Preferred Embodiment) p-type guard rings 34 are formed with an interval from the active region 10 so as to surround the unit cells 21 (an active region 10) arranged in a matrix manner. The guard rings 34 can be formed in an ion implantation process step equal to the step of forming the p-type channel region 12.

Each guard ring 34 is formed to have a quadrangular collar planar view along the outer periphery of the MIS transistor 1 when viewed planarly.

On the epitaxial layer 8, an interlayer insulating film 35 made of $SiO_2$ is laminated so as to coat the gate electrode 23.

The interlayer insulating film 35 and the gate insulating film 22 are provided with a contact hole 36 having a diameter larger than that of the source trench 24. This forms a step corresponding to the difference in height between the surface 9 and the bottom face 26, since the whole (i.e., the side face 25 and the bottom face 26 of the source trench 24) of the source trench 24 of each unit cell 21 and a limb part of the source trench 24 at the surface 9 of the epitaxial layer 8 are exposed in the contact hole 36.

On the interlayer insulating film 35, a source electrode 37 is formed. The source electrode 37 goes into the source trench 24 of all unit cells 21 collectively via each contact hole 36, and contacts the drain exposed region 33, the source breakdown voltage holding region 28, the channel region 12 and the source region 14 in this order from the bottom side of the source trench 24 at each unit cell 21. That is, the source electrode 37 is wiring common to all unit cells 21.

Additionally, an interlayer insulating film (not illustrated) is formed on the source electrode 37, and the source electrode 37 is connected electrically with the source pad 2 (see FIG. 1(a)) via the interlayer insulating film (not illustrated). On the other hand, the gate pad 4 (see FIG. 1(a)) is connected electrically with the gate electrode 23 via gate wiring (not illustrated) installed on the interlayer insulating film (not illustrated).

Moreover, the source electrode 37 has a polysilicon layer 38 functioning as a barrier formation layer, an interlayer 39 and a metal layer 40 in this order from a contact side to contact the epitaxial layer 8.

The polysilicon layer 38 is a doped layer formed using doped polysilicon which is doped with impurity, and is a high concentration doped layer which is doped with impurity of a high concentration, for example, equal to or higher than $1 \times 10^{15}$ cm$^{-3}$, or preferably $1 \times 10^{19}$ to $1 \times 10^{21}$ cm$^{-3}$. As impurity to form the polysilicon layer 38 as a doped layer (including a high concentration doped layer), n-type impurity such as N (nitrogen), P (phosphorus) or As (arsenic), or p-type impurity such as Al (aluminum) or B (boron) can be used. Moreover, the thickness of the polysilicon layer 38 is, for example, 5000 Å to 10000 Å.

Moreover, in the First Preferred Embodiment, the polysilicon layer 38 is formed so as to cover the whole surface of the unit cell 21 exposed in the contact hole 36, and contacts all of the drain exposed region 33, the source breakdown voltage holding region 28 and the source region 14 in the source trench 24.

That is, the polysilicon layer 38 contacts the source breakdown voltage holding region 28 at the side face 25 of the source trench 24, and has a first part 41 in contact with the source region 14 at a limb part of the source trench 24 at the surface 9 of the side face 25 and the epitaxial layer 8, and a second part 42 in contact with the drain exposed region 33 at the bottom face 26 of the source trench 24.

Additionally, regarding the polysilicon layer 38, the first part 41 forms an ohmic junction between both of the source breakdown voltage holding region 28 and the source region 14. On the other hand, the second part 42 forms, between the same and the drain exposed region 33, a hetero junction having a junction barrier (height of a junction barrier of 1 eV to 1.5 eV, for example) lower than the diffusion potential (e.g., 2.8 eV to 3.2 eV) of a body diode 43 (a p-n diode formed by junction between the channel region 12 and the drain region 13) existing in the MIS transistor 1.

The interlayer 39 is a metal layer laminated on the polysilicon layer 38, and is composed of a single layer of a layer containing Ti (titanium) or a plurality of layers including a layer containing Ti. A layer containing Ti can be formed using Ti, TiN (titanium nitride) or the like. Moreover, the thickness of the interlayer 39 is, for example, 200 nm to 500 nm.

The metal layer 40 is laminated on the interlayer 39 and can be formed using Al (aluminum), Au (gold), Ag (silver), Cu (copper), Mo (molybdenum), alloy thereof, and a metal material containing the same, for example. The metal layer 40 forms an outermost layer of the source electrode 37. Moreover, the thickness of the metal layer 40 is, for example, 1 μm to 5 μm.

As a combination of the polysilicon layer 38, the interlayer 39 and the metal layer 40 described above, a laminated structure (Poly-Si/Ti/TiN/Al) in which Poly-Si (a polysilicon layer 38), Ti (an interlayer 39), TiN (an interlayer 39) and Al (a metal layer 40) are laminated in this order is used in the First Preferred Embodiment. Moreover, the metal layer 40 preferably further has a Mo layer. Since Mo has a high melting point, it is possible to suppress dissolved loss of the metal layer 40 due to heat generated when a large amount of electric current flows to the source electrode 37, if the metal layer 40 includes a Mo layer.

On the reverse face 7 of the substrate 5, a drain electrode 44 is formed so as to cover the whole area thereof. The drain electrode 44 is an electrode common to all unit cells 21. As the drain electrode 44, a laminated structure (Ti/Ni/Au/Ag) in which Ti, Ni, Au and Ag are laminated in this order from the substrate 5 side can be applied, for example.

FIGS. 3A to 3F are schematic sectional views for illustrating a part of the manufacturing process steps of the trench gate-type MIS transistor illustrated in FIG. 2, and illustrate cutting planes at the same positions as FIG. 2.

For manufacturing the MIS transistor 1, a SiC crystal is grown on the surface 6 (a Si face) of the substrate 5 as illustrated in FIG. 3A by an epitaxial growth method such as a CVD method, an LPE method or an MBE method, while conducting doping with n-type impurity (e.g., N (nitrogen), P (phosphorus), As (arsenic) or the like). This forms the n-type epitaxial layer 8 on the substrate 5.

P-type impurity (e.g., Al (aluminum), B (boron) or the like) is then implanted (injected) from the surface 9 of the epitaxial layer 8 to the inside of the epitaxial layer 8.

N-type impurity is then implanted (injected) from the surface 9 of the epitaxial layer 8 to the inside of the epitaxial layer 8.

The epitaxial layer 8 is then heat-treated at, for example, 1400° C. to 2000° C. This activates ions in p-type impurity and n-type impurity implanted into the surface part of the epitaxial layer 8, and forms the channel region 12, the source region 14 and the guard ring 34 simultaneously in accordance with the position of implantation. Moreover, the drain region 13 where the state immediately after epitaxial growth is maintained is formed at a base layer part of the epitaxial layer 8.

Next, as illustrated in FIG. 3B, etching is applied to the epitaxial layer 8 using a mask having an opening at a region where the gate trench 15 and the source trench 24 are to be formed. This achieves dry etching of the epitaxial layer 8 from the surface 9 (a Si face), and forms the gate trench 15 and the source trench 24 simultaneously. At the same time, a number of unit cells 21 are formed at the epitaxial layer 8. In addition, mixed gas ($SF_6/O_2$ gas) including $SF_6$ (sulfur hexafluoride) and $O_2$ (oxide) or mixed gas ($SF_6/O_2$/HBr gas) including $SF_6$, $O_2$ and HBr (hydrogen bromide) can be used as etching gas, for example.

Next, as illustrated in FIG. 3C, a first resist 45 having an opening to expose the intersection part 17 of the gate trench 15 and the edge part 32 of the source trench 24 is formed on the epitaxial layer 8. This causes the first resist 45 to cover the linear part 16 of the gate trench 15 and a central part (a part where the drain exposed region 33 is to be formed) of the bottom face 26 of the source trench 24.

P-type impurity is then implanted (injected) toward the source trench 24 and the intersection part 17 of the gate trench 15 exposed from the opening of the first resist 45. In this process, p-type impurity is also implanted into the side faces 18 and 25, since the side face 18 of the gate trench 15 (an intersection part 17) and the side face 25 of the source trench 24 are not covered with the first resist 45. On the other hand, since the linear part 16 of the gate trench 15 and a central part (a part where the drain exposed region 33 is to be formed) of the bottom face 26 of the source trench 24 are protected by the first resist 45, it is possible to prevent implantation of p-type impurity into these parts. Thereafter, the epitaxial layer 8 is heat-treated at, for example, 1400° C. to 2000° C. This activates ions in p-type impurity implanted into the drain region 13, and forms the source breakdown voltage holding region 28 and the first region 29 of the gate breakdown voltage holding region 27 simultaneously. Moreover, the drain exposed region 33 is formed at a part, which has been covered with the first resist 45, of the bottom face 26 of the source trench 24.

Next, as illustrated in FIG. 3D, a second resist 46 having an opening at a region where the second region 30 of the gate breakdown voltage holding region 27 is to be formed is formed on the epitaxial layer 8. This causes the second resist 46 to cover the side face 18 and the bottom face 19 of the intersection part 17 of the gate trench 15, and the side face 25 and the bottom face 26 of the source trench 24.

P-type impurity is then implanted (injected) toward the linear part 16 of the gate trench 15 exposed from the opening of the second resist 46. In this process, since the side face 18 and the bottom face 19, and the side face 25 and the bottom face 26 are protected by the second resist 46, it is possible to prevent implantation of p-type impurity into these parts. Thereafter, the epitaxial layer 8 is heat-treated at, for example, 1400° C. to 2000° C. This activates ions in p-type impurity implanted into the drain region 13, and forms the second region 30 of the gate breakdown voltage holding region 27.

Next, as illustrated in FIG. 3E, $SiO_2$ material is laminated from a part above the epitaxial layer 8 by a CVD method. This forms the gate insulating film 22.

Doped polysilicon material is then laminated from a part above the epitaxial layer 8 by a CVD method. Lamination of polysilicon material is continued until at least the gate trench 15 and the source trench 24 are filled. Etch back is then applied to laminated polysilicon material until the etch back face becomes flush with the surface 9 of the epitaxial layer 8. Only polysilicon material remaining in the source trench 24 is then removed by dry etching. This forms the gate electrode 23 made of polysilicon material remaining in the gate trench 15.

Next, as illustrated in FIG. 3F, $SiO_2$ material is laminated from a part above the epitaxial layer 8 by a CVD method. This forms the interlayer insulating film 35. Continuous patterning is then applied to the interlayer insulating film 35 and the gate insulating film 22 by a well-known patterning technique. This forms the contact hole 36 at the interlayer insulating film 35 and the gate insulating film 22.

Polysilicon material is then laminated by a CVD method until the contact hole 36 is filled. Thereafter, n-type or p-type impurity is implanted (injected) into the laminated polysilicon material. Here, implantation conditions vary according to the type of impurity and acceleration energy is, for example, 10 keV to 100 keV.

Thereafter, the MIS transistor 1 illustrated in FIG. 2 is obtained by forming the interlayer 39, the metal layer 40, the drain electrode 44 and the like.

The MIS transistor 1 is utilized, for example, as a switching element of a drive circuit (an inverter circuit) of an electric motor (an example of an inductive load). In such a case, electric current flowing to the electric motor is switched on/off by turning on/off predetermined voltage (voltage equal to or higher than gate threshold voltage) to the gate pad 4 in a state where drain voltage is applied (across a source and a drain) across the source pad 2 (a source electrode 37) and the drain electrode 44 so that the drain side becomes positive.

When electric current flowing to the electric motor is interrupted (that is, the gate voltage is turned off), counter electromotive force is generated at a motor coil of the electric motor. Due to the counter electromotive force, voltage is sometimes applied across the source and the drain so that the source side becomes positive.

In such a case, the following problem occurs when electric current flows to the motor coil as reflux current, for example, by rectification of the body diode 43.

That is, when a positive hole (a hole) transfers from the p-type channel region 12 constituting the body diode 43 to the n-type drain region 13 and electric current flows, a majority carrier electron sometimes recombines with a positive hole which has transferred from the p-type channel region 12, around the gate trench 15 (e.g., a position lateral to the gate trench 15) at the n-type drain region 13. Accordingly, energy generated by combination may possibly cause a crystal defect of SiC in the epitaxial layer 8 to expand in a direction parallel to the lamination direction of the epitaxial layer 8 and reach the path (e.g., a channel) of drain current in an ON state. In such a case, the ON resistance may possibly increase when a channel is formed around the side face 18 of the gate trench 15 at the channel region 12 for the switching operation by the MIS transistor 1.

Thus, in the First Preferred Embodiment, the polysilicon layer 38 forms a hetero junction with the drain region 13 (a drain exposed region 33). Accordingly, electric current flows preferentially to the hetero junction part of the drain region 13 and the second part 42 of the polysilicon layer 38, and it is possible to decrease or eliminate electric current flowing to the body diode 43. In such a manner, electric current which has flown through the MIS transistor 1 can be made to flow to the electric motor as reflux current, for example.

As described above, since electric current in an OFF state flows from the second part 42 of the polysilicon layer 38 formed in the source trench 24 at the center of the unit cell 21 surrounded by the gate trench 15 to the drain region 13, carrier transfer around the gate trench 15 (that is, between the p-type channel region 12 and n-type drain region 13) rarely occurs. Accordingly, it is possible to prevent recombination of a positive hole and an electron in the drain region 13. As a result, it is possible to suppress expansion of a crystal defect of SiC in the epitaxial layer 8, and it is therefore possible to suppress an increase in the ON resistance of the transistor 1.

Moreover, in an OFF state (that is, a state where gate voltage is 0V), an electric field is applied to the gate insulating film 22 interposed between the gate electrode 23 and the epitaxial layer 8.

The electric field is generated due to the potential difference between the gate electrode 23 and the epitaxial layer 8. Additionally, on the bottom face 19 of the gate trench 15, an extremely strong electric field is generated since an equipotential surface of an extremely high electric potential based on the gate electrode 23 (0V) is distributed and furthermore the interval between equipotential surfaces is small. When the drain voltage is 900V, for example, an equipotential surface of 900V is distributed around the reverse face 7 of the substrate 5 in contact with the drain electrode 44, and voltage drop occurs more at a position farther from the reverse face 7 of the substrate 5 and nearer to the surface 9 side of the epitaxial layer 8, and an equipotential surface of approximately several tens of volts is distributed around the bottom face 19 of the gate trench 15. Accordingly, an extremely strong electric field toward the gate electrode 23 side is generated at the bottom face 19 of the gate trench 15. Especially, when the gate trench 15 is formed in a lattice shape and a unit cell 21 having a quadrangular prism shape is arranged at a window part of the lattice-shaped gate trench 15 as is the case with the First Preferred Embodiment, a dielectric breakdown of the gate insulating film 22 tends to occur especially around the corner edge part 31 of the gate trench 15 formed at each corner part 20 of the unit cell 21.

In particular, a distance $D_1$ (see the cross section A-A in FIG. 2) between source trenches 24 adjacent to each other on a diagonal of the intersection part 17 of the gate trench 15 becomes larger than a distance $D_2$ (see the cross section B-B in FIG. 2) between source trenches 24 adjacent to each other with the linear part 16 of the gate trench 15 interposed therebetween (for example, $D_1$ is 1.4 times as large as $D_2$ in the First Preferred Embodiment). Accordingly, an equipotential surface goes into a part immediately below the corner edge part 31 of the gate trench 15 having a relatively large space, causing denseness of equipotential surfaces. As a result, a dielectric breakdown of the gate insulating film 22 tends to occur especially around the corner edge part 31 of the gate trench 15.

Thus, in the MIS transistor 1 of the First Preferred Embodiment, the gate breakdown voltage holding region 27 (a first region 29) is formed at the corner edge part 31 of the gate trench 15. This can form the body diode 48 around the corner edge part 31 of the gate trench 15 by junction (p-n junction) between the first region 29 and the drain region 13. Furthermore, in the MIS transistor 1, the source breakdown voltage holding region 28 is formed at the edge part 32 of the source trench 24 formed at a central part of each unit cell 21. Accordingly, it is possible to form the annular body diode 49 surrounding the edge part 32 of the source trench 24 by junction (p-n junction) between the source breakdown voltage holding region 28 and the drain region 13.

Existence of a depletion layer generated at the body diodes 48 and 49 can prevent an equipotential surface from going into a space between the corner edge part 31 of the gate trench 15 and the edge part 32 of the source trench 24 and keep an equipotential surface away from the gate insulating film 22. As a result, it is possible to prevent denseness of equipotential surfaces around the corner edge part 31 of the gate trench 15. As a result, it is possible to weaken the electric field applied to the gate insulating film 22, and it is therefore possible to suppress a dielectric breakdown. Moreover, since the concentration of the first region 29 is higher than the concentration of the drain region 13, it is possible to prevent a depletion layer generated by junction (p-n junction) between the first region 29 and the drain region 13 from expanding too much in the epitaxial layer 8.

Moreover, in the MIS transistor 1, the first region 29 is formed so as to lie through the corner edge part 31 to the channel region 12 immediately above the corner edge part 31, while no channel is formed at the corner part 20 of the unit cell 21 or, even when a channel is formed, only a small amount of electric current flows to the channel. Consequently, by forming the gate breakdown voltage holding region 27 (a first region 29) so as to reach a part of the channel region 12 immediately above the corner edge part 31, it is possible to further enhance the breakdown prevention effect of the gate insulating film 22 while exerting little impact on the performance of the device.

On the other hand, the gate breakdown voltage holding region 27 (a second region 30) having a width smaller than the width of the linear part 16 is formed at the linear part 16 of the gate trench 15. This can generate a depletion layer, which is generated by junction (p-n junction) between the second region 30 and the drain region 13, along the linear part 16 of the gate trench 15. Accordingly, it is possible to reduce the electric field generated immediately below the linear part 16 of the gate trench 15 by virtue of the depletion layer. As a result, it is possible to reduce the electric field generated at the gate insulating film 22 evenly over all.

Furthermore, the gate breakdown voltage holding region 27 (a second region 30) is not formed at the side face 18 (i.e., a part of the unit cell 21 where a channel is to be formed) of the linear part 16 of the gate trench 15. Hence, it is also possible to control the channel characteristics with a high degree of accuracy.

Moreover, since the concentration of the second region 30 is higher than the concentration of the first region 29 and the thickness $T_2$ of the second region 30 is smaller than the thickness $T_1$ of the first region 29 ($T_1 > T_2$), it is also possible to prevent an increase in the channel resistance.

Moreover, with the manufacturing method described above, it is possible to form the gate breakdown voltage holding region 27 and the source breakdown voltage holding region 28 simultaneously. As a result, it is possible to prepare the structure of the MIS transistor 1 for preventing a dielectric breakdown of the gate insulating film 22 easily.

Figure 4:
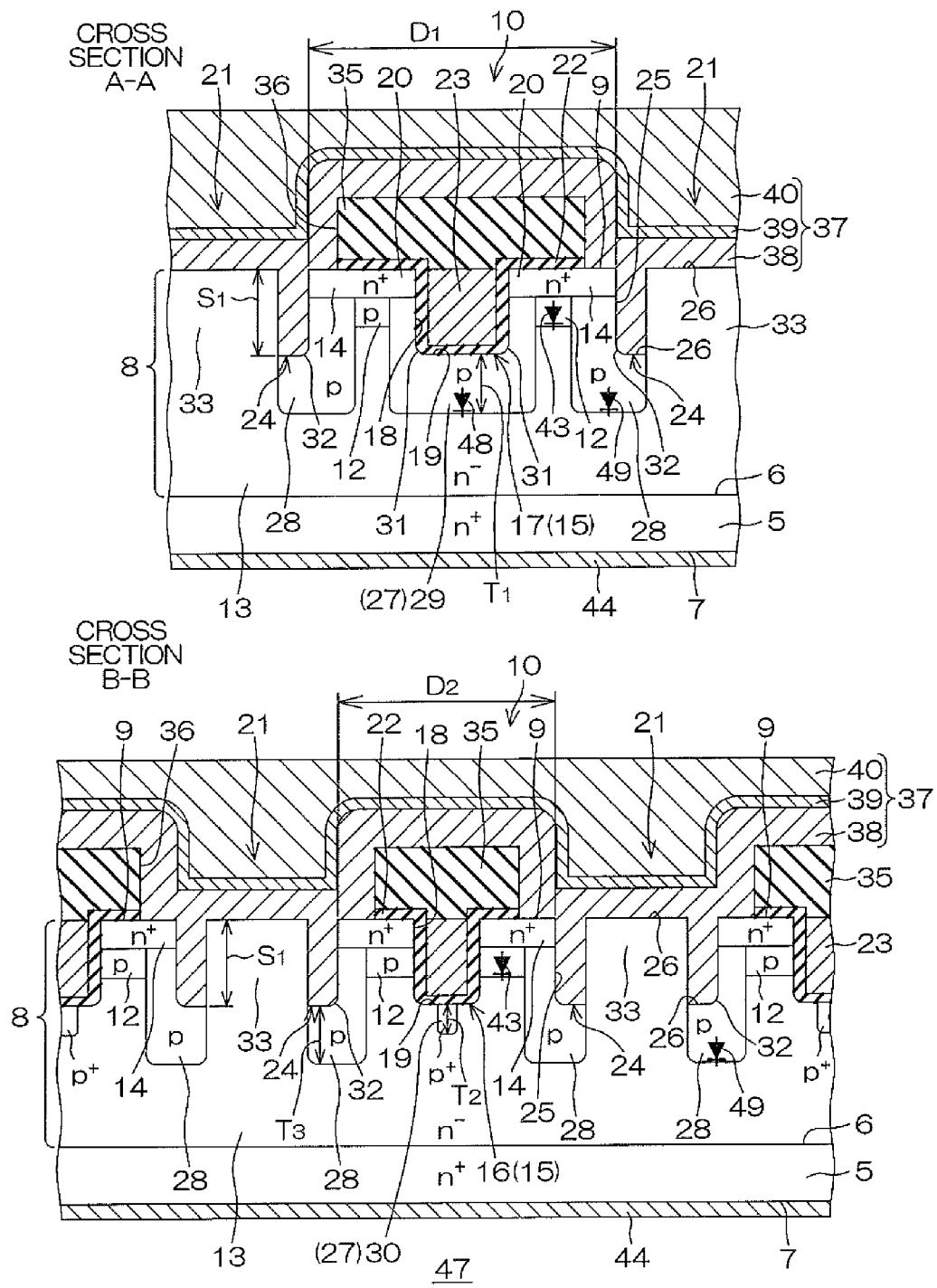
FIG. 4 are schematic sectional views for illustrating a modification example of the trench gate-type MIS transistor illustrated in FIG. 2.

In addition, the drain exposed region 33 may have a step $S_1$ between the same and a limb part (a part other than a central part) of the bottom face 26, by projecting a central part of the bottom face 26 of the source trench 24 to a position flush with the surface 9 of the epitaxial layer 8 as is the case with the MIS transistor 47 in FIG. 4. Such a structure can be obtained by, for example, forming the annular source trench 24 in the process step illustrated in FIG. 3B.

In such a case, since an area of junction between the polysilicon layer 38 and the drain exposed region 33 can be increased, it is possible to weaken the electric field applied to the polysilicon layer 38. As a result, it is possible to decrease leakage of electric current between the polysilicon layer 38 and the drain exposed region 33.

Second Preferred Embodiment

Figure 5:
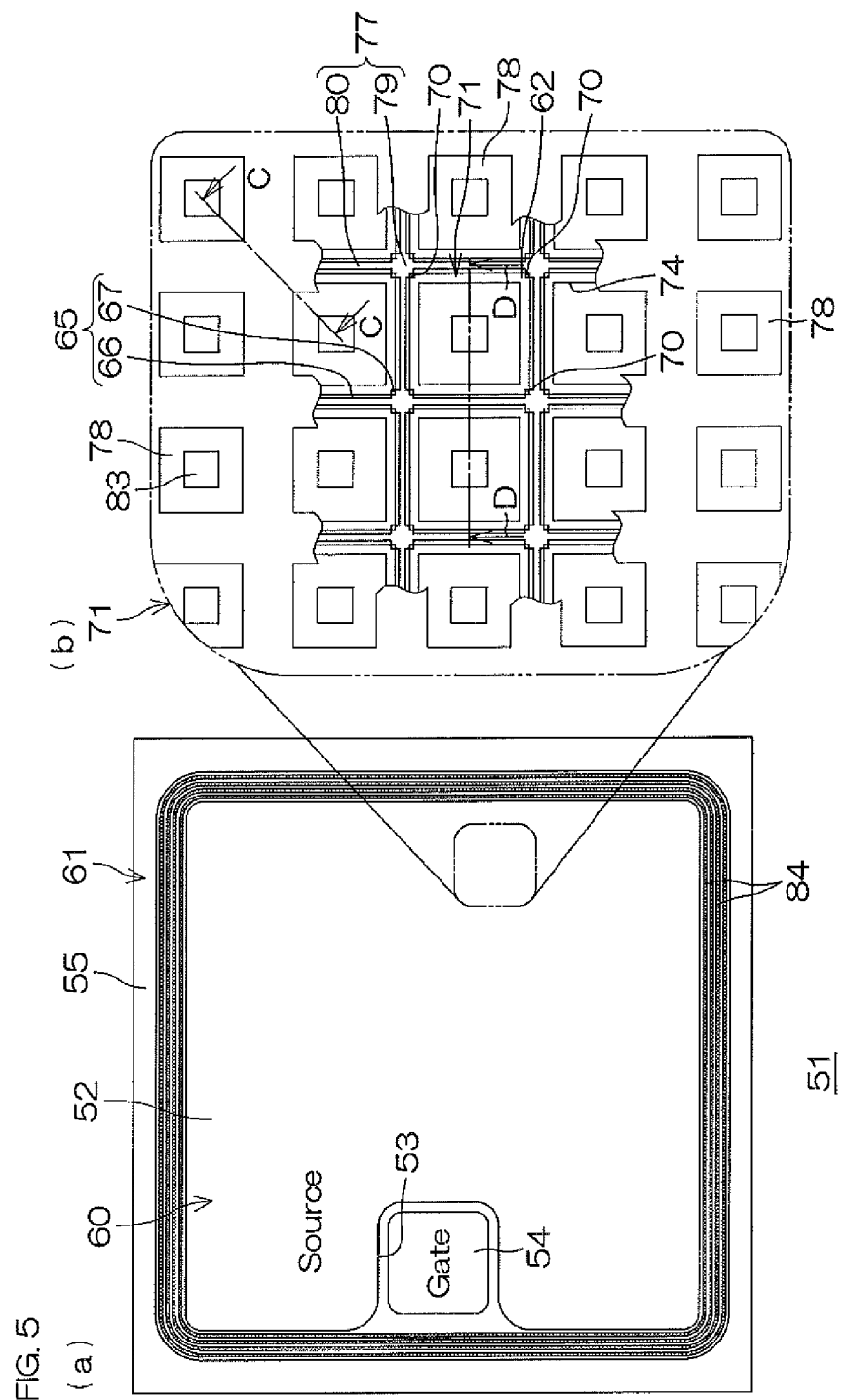
FIGS. 5(a) and 5(b) are schematic plan views of a planar gate-type MIS transistor according to a Second Preferred Embodiment of the present invention.

FIGS. 5(a) and 5(b) are schematic plan views of a planar gate-type MIS transistor according to a Second Preferred Embodiment of the present invention, FIG. 5(a) illustrates a general view, and FIG. 5(b) illustrates an enlarged view of an inner part. FIG. 6 are sectional views of the planar gate-type MIS transistor illustrated in FIGS. 5(a) and 5(b), and illustrate cutting planes respectively along cutting plane lines C-C and D-D in FIG. 5(b).

An MIS transistor 51 is a planar gate-type DMISFET wherein SiC is employed, and is formed, for example, in a chip shape having a square planar view as illustrated in FIG. 5(a). The chip-shaped MIS transistor 51 has a length of approximately several millimeters respectively in the vertical direction and the lateral direction on the plane of paper of FIG. 5(a).

On the surface of the MIS transistor 51, a source pad 52 is formed. The source pad 52 has a substantially square planar view with four corners curved outward and is formed so as to cover substantially the whole area of the surface of the MIS transistor 51. The source pad 52 is provided with a removal region 53 formed around the center of one side thereof. The removal region 53 is a region where the source pad 52 is not formed.

A gate pad 54 is located at the removal region 53. A space is provided between the gate pad 54 and the source pad 52, so that the gate pad 54 and the source pad 52 are insulated from each other.

Next, the inner structure of the MIS transistor 51 will be explained.

The MIS transistor 51 is provided with a substrate 55 made of $N^+$ type (a concentration of $1 \times 10^{18}$ to $1 \times 10^{21}$ cm$^{-3}$, for example) SiC. The substrate 55 functions as a drain of the MIS transistor 51 in the Second Preferred Embodiment and has a surface 56 (an upper face) which is a Si face and a reverse face 57 (a lower face) which is a C face.

On the surface 56 of the substrate 55, an epitaxial layer 58 made of $n^-$ type SiC having a concentration (e.g., a concentration of $1 \times 10^{15}$ to $1 \times 10^{17}$ cm$^{-3}$) lower than that of the substrate 55 is laminated. The thickness of the epitaxial layer 58 functioning as a semiconductor layer is, for example, 1 μm to 100 μm. The epitaxial layer 58 is formed on the substrate 55 by so-called epitaxial growth. The epitaxial layer 58 formed on the surface 56 which is a Si face is grown on the Si face functioning as a growth principal face. Consequently, a surface 59 of the epitaxial layer 58 formed by growth is a Si face similar to the surface 56 of the substrate 55.

In the MIS transistor 51, an active region 60 is formed to be located at a central part of the epitaxial layer 58, when viewed planarly, and functions as the MIS transistor 51, and a transistor periphery region 61 is formed to surround the active region 60, as illustrated in FIG. 5(a).

On a surface part of the epitaxial layer 58 of the active region 60, a number of p-type (a concentration of $1.0 \times 10^{16}$ cm$^{-3}$ to $1.0 \times 10^{19}$ cm$^{-3}$, for example) channel regions 62 are formed and arranged in a matrix manner with a constant pitch in the longitudinal direction and the transverse direction. Each channel region 62 has a square planar view and has a length of approximately 7.2 μm respectively in the vertical direction and the lateral direction on the plane of paper of FIG. 5(b), for example.

On the other hand, a region of the epitaxial layer 58 at the substrate 55 side with respect to the channel regions 62 is an $n^-$ type drain region 63 where the state immediately after epitaxial growth is maintained.

Each channel region 62 is provided with an $n^+$ type (a concentration of $1 \times 10^{18}$ to $1 \times 10^{21}$ cm$^{-3}$, for example) source region 64 formed on substantially the whole area at the surface 59 side.

Moreover, at the active region 60, a region (an interchannel region 65) between channel regions 62 arranged in a matrix manner having a constant pitch has a lattice shape having a constant width (e.g., 2.8 μm).

In particular, the interchannel region 65 includes a linear part 66 extended linearly, respectively in the longitudinal direction and the transverse direction along four side faces of each channel region 62 between adjacent channel regions 62, and an intersection part 67 where a linear part 66 extended in the longitudinal direction intersects with a linear part 66 extended in the transverse direction. When focusing on channel regions 62 arranged in two rows and two columns when viewed planarly, the intersection part 67 is a part having a square planar view, which is surrounded by inner corners of arranged four channel regions 62 and sectioned by extended lines of four sides of the channel regions 62.

This forms a plurality of unit cells 71 of a square planar view having four corner parts 70, at each window part surrounded by the lattice-shaped interchannel region 65 of the epitaxial layer 58. That is, a boundary between unit cells 71 is set at the center in the width direction of the interchannel region 65. Each unit cell has a length of approximately 10 μm respectively in the vertical direction and the lateral direction on the plane of paper of FIG. 5(b). Regarding each unit cell 71, the depth direction of the channel region 62 is a gate length direction, and the circumferential direction of the channel region 62 perpendicular to the gate length direction is a gate width direction.

On the interchannel region 65, a gate insulating film 72 having a lattice shape is formed along the interchannel region 65. The gate insulating film 72 is formed across adjacent channel regions 62 and covers a part of the channel region 62 (a limb part of the channel region 62) surrounding the source region 64 and an outer periphery of the source region 64. The gate insulating film 72 is made of $SiO_2$ and has a substantially uniform thickness of approximately 400 Å.

On the gate insulating film 72, a gate electrode 73 is formed. The gate electrode 73 is formed in a lattice shape along the lattice-shaped gate insulating film 72, and faces the limb part of each channel region 62 with the gate insulating film 72 interposed therebetween. The gate electrode 73 is made of polysilicon and is densely doped with, for example, n-type impurity. Moreover, the thickness of the gate electrode 73 is, for example, approximately 6000 Å.

At a central part of each unit cell 71, a source trench 74 having a square planar view is formed so as to lie from the surface 59 of the epitaxial layer 58 through each source region 64 and each channel region 62 to the drain region 63. The source trench 74 has a U-shaped cross section in which a side face 75 and a bottom face 76 facing each other continue with a curved face interposed therebetween.

Moreover, the epitaxial layer 58 is provided with a p-type gate breakdown voltage holding region 77 and a source breakdown voltage holding region 78 functioning as a first breakdown voltage holding region, which are formed by implantation of p-type impurity into the epitaxial layer 58.

The gate breakdown voltage holding region 77 is formed along the lattice-shaped interchannel region 65 and includes, as a unit, a first region 79 functioning as a fourth breakdown voltage holding region formed at the intersection part 67 of the interchannel region 65 and a second region 80 functioning as a fifth breakdown voltage holding region formed at the linear part 66 of the interchannel region 65.

The first region 79 is formed to reach a corner part 81 of a channel region 62 formed at each corner part 70 of four unit cells 71 facing the intersection part 67. That is, the first region 79 is formed in a square slightly larger than the intersection part 67 of the interchannel region 65 when viewed planarly, and each corner thereof goes into each corner part 70 of four unit cells 71 facing the intersection part 67. Moreover, the concentration of the first region 79 is higher than the concentration of the channel region 62 and is higher than the concentration of the drain region 63, and is, for example, $1\times10^{18}$ to $1\times10^{19}\,cm^{-3}$. Moreover, a thickness $T_4$ of the first region 79 along a direction from the surface 59 of the epitaxial layer 58 toward the substrate 55 is, for example, approximately 0.8 μm.

The second region 80 is formed linearly to have a constant width so as to link centers of the respective sides of adjacent intersection parts 67 with each other when viewed planarly and has a width (e.g., 1.5 μm) smaller than the width (e.g., 3.0 μm) of the linear part 66. Moreover, the concentration of the second region 80 is higher than the concentration of the channel region 62 and is higher than the concentration of the first region 79, and is, for example, $2\times10^{18}$ to $2\times10^{19}\,cm^{-3}$. Moreover, a thickness $T_5$ of the second region 80 along a direction from the surface 59 of the epitaxial layer 58 toward the substrate 55 is equal to or smaller than the thickness $T_4$ of the first region 79 (i.e., $T_4 \geq T_5$).

The source breakdown voltage holding region 78 is formed to reach an edge part 82 of the source trench 74 where the bottom face 76 intersects with the side face 75, and the channel region 62 forming a part of the side face 75 of the source trench 74 from the edge part 82 so as to expose the bottom face 76 of the source trench 74.

This forms a drain exposed region 83 having a square planar view comprising a part of the drain region 63 at a central part of the bottom face 76 of the source trench 74.

Moreover, the concentration of the source breakdown voltage holding region 78 is equal to that of the first region 79 of the gate breakdown voltage holding region 77 (e.g., $1\times10^{18}$ to $1\times10^{19}\,cm^{-3}$). Moreover, a thickness $T_6$ of the source breakdown voltage holding region 78 along a direction from the bottom face of the source trench 74 toward the substrate 55 is, for example, approximately 0.8 μm, and the deepest part of the source breakdown voltage holding region 78 is at a position deeper than the deepest part of the gate breakdown voltage holding region 77 (a first region 79 and a second region 80).

Moreover, at a surface part of the epitaxial layer 58 at the transistor periphery region 61, a plurality of (four in the Second Preferred Embodiment) p-type guard rings 84 are formed with an interval from the active region 60 so as to surround the unit cells 71 (an active region 60) arranged in a matrix manner. The guard rings 84 can be formed in an ion implantation process step equal to the step of forming the p-type channel region 62.

Each guard ring 84 is formed to have a quadrangular collar planar view along the outer periphery of the MIS transistor 51 when viewed planarly.

On the epitaxial layer 58, an interlayer insulating film 85 made of $SiO_2$ is laminated so as to coat the gate electrode 73.

The interlayer insulating film 85 and the gate insulating film 72 are provided with a contact hole 86 having a diameter larger than that of the source trench 74. This forms a step corresponding to the difference in height between the surface 59 and the bottom face 76 since the whole (i.e., the side face 75 and the bottom face 76 of the source trench 74) of the source trench 74 of each unit cell 71 and a limb part of the source trench 74 at the surface 59 of the epitaxial layer 58 are exposed in the contact hole 86.

On the interlayer insulating film 85, a source electrode 87 is formed. The source electrode 87 goes into the source trench 74 of all unit cells 71 collectively via each contact hole 86, and contacts the drain exposed region 83, the source breakdown voltage holding region 78, the channel region 62 and the source region 64 in this order from the bottom side of the source trench 74 at each unit cell 71. That is, the source electrode 87 is wiring common to all unit cells 71.

Additionally, an interlayer insulating film (not illustrated) is formed on the source electrode 87, and the source electrode 87 is connected electrically with the source pad 52 (see FIG. 5(a)) via the interlayer insulating film (not illustrated). On the other hand, the gate pad 54 (see FIG. 5(a)) is connected electrically with the gate electrode 73 via gate wiring (not illustrated) installed on the interlayer insulating film (not illustrated).

Moreover, the source electrode 87 has a polysilicon layer 88 functioning as a barrier formation layer, an interlayer 89 and a metal layer 90 in this order from a contact side to contact the epitaxial layer 58.

The polysilicon layer 88 is a doped layer formed using doped polysilicon which is doped with impurity, and is a high concentration doped layer which is doped with impurity of a high concentration, for example, equal to or higher than $1 \times 10^{15}$ cm$^{-3}$, or preferably $1 \times 10^{19}$ to $1 \times 10^{21}$ cm$^{-3}$. As impurity to form the polysilicon layer 88 as a doped layer (including a high concentration doped layer), n-type impurity such as N (nitrogen), P (phosphorus) or As (arsenic), or p-type impurity such as Al (aluminum) or B (boron) can be used. Moreover, the thickness of the polysilicon layer 88 is, for example, 5000 Å to 10000 Å.

Moreover, in the Second Preferred Embodiment, the polysilicon layer 88 is formed so as to cover the whole surface of the unit cell 71 exposed in the contact hole 86, and contacts all of the drain exposed region 83, the source breakdown voltage holding region 78 and the source region 64 in the source trench 74.

That is, the polysilicon layer 88 contacts the source breakdown voltage holding region 78 at the side face 75 of the source trench 74, and has a first part 91 in contact with the source region 64 at a limb part of the source trench 74 at the surface 59 of the side face 75 and the epitaxial layer 58, and a second part 92 in contact with the drain exposed region 83 at the bottom face 76 of the source trench 74.

Additionally, regarding the polysilicon layer 88, the first part 91 forms an ohmic junction between both of the source breakdown voltage holding region 78 and the source region 64. On the other hand, the second part 92 forms, between the same and the drain exposed region 83, a hetero junction having a junction barrier (height of a junction barrier of 1 eV to 1.5 eV, for example) lower than the diffusion potential (e.g., 2.8 eV to 3.2 eV) of a body diode 93 (a p-n diode formed by junction between the source breakdown voltage holding region 78 and the drain region 63) existing in the MIS transistor 51.

The interlayer 89 is a metal layer laminated on the polysilicon layer 88, and is composed of a single layer of a layer containing Ti (titanium) or a plurality of layers including a layer containing Ti. A layer containing Ti can be formed using Ti, TiN (titanium nitride) or the like. Moreover, the thickness of the interlayer 89 is, for example, 200 nm to 500 nm.

The metal layer 90 is laminated on the interlayer 89 and can be formed using Al (aluminum), Au (gold), Ag (silver), Cu (copper), Mo (molybdenum), alloy thereof, and a metal material containing the same, for example. The metal layer 90 forms an outermost layer of the source electrode 87. Moreover, the thickness of the metal layer 90 is, for example, 1 μm to 5 μm.

As a combination of the polysilicon layer 88, the interlayer 89 and the metal layer 90 described above, a laminated structure (Poly-Si/Ti/TiN/Al) in which Poly-Si (a polysilicon layer 88), Ti (an interlayer 89), TiN (an interlayer 89) and Al (a metal layer 90) are laminated in this order is used in the Second Preferred Embodiment. Moreover, the metal layer 90 preferably further has a Mo layer. Since Mo has a high melting point, it is possible to suppress dissolved loss of the metal layer 90 due to heat generated when a large amount of electric current flows to the source electrode 87, if the metal layer 90 includes a Mo layer.

On the reverse face 57 of the substrate 55, a drain electrode 94 is formed so as to cover the whole area thereof. The drain electrode 94 is an electrode common to all unit cells 71. As the drain electrode 94, a laminated structure (Ti/Ni/Au/Ag) in which Ti, Ni, Au and Ag are laminated in this order from the substrate 55 side can be applied, for example.

FIGS. 7A to 7F are schematic sectional views for illustrating a part of the manufacturing process steps of the planar gate-type MIS transistor illustrated in FIG. 6, and illustrate cutting planes at the same positions as FIG. 6.

For manufacturing the MIS transistor 51, a SiC crystal is grown on the surface 56 (a Si face) of the substrate 55 as illustrated in FIG. 7A by an epitaxial growth method such as a CVD method, an LPE method or an MBE method, while conducting doping with n-type impurity (e.g., N (nitrogen), P (phosphorus), As (arsenic) or the like). This forms the n-type epitaxial layer 58 on the substrate 55.

P-type impurity (e.g., Al (aluminum), B (boron) or the like) is then implanted (injected) from the surface 59 of the epitaxial layer 58 to the inside of the epitaxial layer 58.

N-type impurity is then implanted (injected) from the surface 59 of the epitaxial layer 58 to the inside of the epitaxial layer 58.

The epitaxial layer 58 is then heat-treated at, for example, 1400° C. to 2000° C. This activates ions in p-type impurity and n-type impurity implanted into the surface part of the epitaxial layer 58, and forms the channel region 62, the source region 64 and the guard ring 84 simultaneously in accordance with the position of implantation. Moreover, the drain region 63 where the state immediately after epitaxial growth is maintained is formed at a base layer part of the epitaxial layer 58. Moreover, the interchannel region 65 is formed simultaneously, and a number of unit cells 71 are formed at the epitaxial layer 58.

Next, as illustrated in FIG. 7B, etching is applied to the epitaxial layer 58 using a mask having an opening at a region where the source trench 74 is to be formed. This achieves dry etching of the epitaxial layer 58 from the surface 59 (a Si face), and forms the source trench 74. In addition, mixed gas (SF$_6$/O$_2$ gas) including SF$_6$ (sulfur hexafluoride) and O$_2$ (oxide) or mixed gas (SF$_6$/O$_2$/HBr gas) including SF$_6$, O$_2$ and HBr (hydrogen bromide) can be used as etching gas, for example.

Next, as illustrated in FIG. 7C, a first resist 95 having an opening to expose the intersection part 67 of the interchannel region 65 and the edge part 82 of the source trench 74 is formed on the epitaxial layer 58. This causes the first resist 95 to cover the linear part 66 of the interchannel region 65 and a central part (a part where the drain exposed region 83 is to be formed) of the bottom face 76 of the source trench 74.

P-type impurity is then implanted (injected) toward the source trench 74 and the intersection part 67 of the interchannel region 65 exposed from the opening of the first resist 95. In this process, p-type impurity is also implanted into the side face 75 since the side face 75 of the source trench 74 is not covered with the first resist 95. On the other hand, since the linear part 66 of the interchannel region 65 and a central part (a part where the drain exposed region 83 is to be formed) of the bottom face 76 of the source trench 74 are protected by the first resist 95, it is possible to prevent implantation of p-type impurity into these parts. Thereafter, the epitaxial layer 58 is heat-treated at, for example, 1400° C. to 2000° C. This activates ions in p-type impurity implanted into the drain region 63, and forms the source breakdown voltage holding region 78 and the first region 79 of the gate breakdown voltage holding region 77 simultaneously. Moreover, the drain exposed region 83 is formed at a part, which has been covered with the first resist 95, of the bottom face 76 of the source trench 74.

Next, as illustrated in FIG. 7D, a second resist 96 having an opening at a region where the second region 80 of the gate breakdown voltage holding region 77 is to be formed is formed on the epitaxial layer 58. This causes the second resist 96 to cover the intersection part 67 of the interchannel region 65, and the side face 75 and the bottom face 76 of the source trench 74.

P-type impurity is then implanted (injected) toward the linear part 66 of the interchannel region 65 exposed from the opening of the second resist 96. In this process, since the intersection part 67 of the interchannel region 65, and the side face 75 and the bottom face 76 are protected by the second resist 96, it is possible to prevent implantation of p-type impurity into these parts. Thereafter, the epitaxial layer 58 is heat-treated at, for example, 1400° C. to 2000° C. This activates ions in p-type impurity implanted into the drain region 63, and forms the second region 80 of the gate breakdown voltage holding region 77.

Next, as illustrated in FIG. 7E, SiO$_2$ material is laminated from a part above the epitaxial layer 58 by a CVD method. This forms the gate insulating film 72.

Doped polysilicon material is then laminated from a part above the epitaxial layer 58 by a CVD method. Thereafter, the gate electrode 73 is formed by applying a well-known patterning technique to the laminated polysilicon material.

Next, as illustrated in FIG. 7F, SiO$_2$ material is laminated from a part above the epitaxial layer 58 by a CVD method. This forms the interlayer insulating film 85. Continuous patterning is then applied to the interlayer insulating film 85 and the gate insulating film 72 by a well-known patterning technique. This forms the contact hole 86 at the interlayer insulating film 85 and the gate insulating film 72.

Polysilicon material is then laminated by a CVD method until the contact hole 86 is filled. Thereafter, n-type or p-type impurity is implanted (injected) into the laminated polysilicon material. Here, implantation conditions vary according to the type of impurity and acceleration energy is, for example, 10 keV to 100 keV.

Thereafter, the MIS transistor 51 illustrated in FIG. 6 is obtained by forming the interlayer 89, the metal layer 90, the drain electrode 94 and the like.

With the structure of such an MIS transistor 51, it is also possible to provide effects similar to those of the MIS transistor 1 of the First Preferred Embodiment. That is, in the Second Preferred Embodiment, the polysilicon layer 88 forms a hetero junction with the drain region 63 (a drain exposed region 83). Accordingly, when counter electromotive force is applied across the source and the drain, electric current flows preferentially to the hetero junction part of the drain region 63 and the second part 92 of the polysilicon layer 88, and it is possible to decrease or eliminate electric current flowing to the body diode 93. In such a manner, electric current which has flown through the MIS transistor 51 can be made to flow to the electric motor as reflux current, for example.

As described above, since electric current in an OFF state flows from the second part 92 of the polysilicon layer 88 formed in the source trench 74 at the center of the unit cell 71 surrounded by the interchannel region 65 to the drain region 63, carrier transfer around the interchannel region 65 (that is, between the p-type channel region 62 and the n-type drain region 63) rarely occurs. Accordingly, it is possible to prevent recombination of a positive hole and an electron in the drain region 63. As a result, it is possible to suppress expansion of a crystal defect of SiC in the epitaxial layer 58, and it is therefore possible to suppress an increase in the ON resistance of the transistor 51.

Moreover, in an OFF state (i.e., a state where gate voltage is 0V), a dielectric breakdown of the gate insulating film 72 tends to occur especially around the corner part 81 of the channel region 62 formed at each corner part 70 of the unit cell 71, when the interchannel region 65 is formed in a lattice shape as is the case with the Second Preferred Embodiment and unit cells 71 having a square planar view are arranged at window parts of the lattice-shaped interchannel region 65.

In particular, a distance $D_3$ (see the cross section C-C in FIG. 6) between source trenches 74 adjacent to each other on a diagonal of the intersection part 67 of the interchannel region 65 becomes larger than a distance $D_4$ (see the cross section D-D in FIG. 6) between source trenches 74 adjacent to each other with the linear part 66 of the interchannel region 65 interposed therebetween (for example, $D_3$ is 1.4 times as large as $D_4$ in the Second Preferred Embodiment). Accordingly, an equipotential surface goes into a part immediately below the corner part 81 of the channel region 62 having a relatively wide space, causing denseness of equipotential surfaces. As a result, a dielectric breakdown of the gate insulating film 72 tends to occur especially around the corner part 81 of the channel region 62.

Thus, in the MIS transistor 51 of the Second Preferred Embodiment, the gate breakdown voltage holding region 77 (a first region 79) is formed at the corner part 81 of the channel region 62. This can form the body diode 98 around the corner part 81 of the channel region 62 by junction (p-n junction) between the first region 79 and the drain region 63. Furthermore, in the MIS transistor 51, the source breakdown voltage holding region 78 is formed at the edge part 82 of the source trench 74 formed at a central part of each unit cell 71. Accordingly, it is possible to form the annular body diode 99 surrounding the edge part 82 of the source trench 74 by junction (p-n junction) between the source breakdown voltage holding region 78 and the drain region 63.

Existence of a depletion layer generated at the body diodes 98 and 99 can prevent an equipotential surface from going into a space between the corner part 81 of the channel region 62 and the edge part 82 of the source trench 74 and keep an equipotential surface away from the gate insulating film 72. As a result, it is possible to prevent denseness of equipotential surfaces around the corner part 81 of the channel region 62. As a result, it is possible to weaken the electric field applied to the gate insulating film 72, and it is therefore possible to suppress a dielectric breakdown. Moreover, since the concentration of the first region 79 is higher than the concentration of the drain region 63, it is possible to prevent a depletion layer generated by junction (p-n junction) between the first region 79 and the drain region 63 from expanding too much in the epitaxial layer 58.

On the other hand, the gate breakdown voltage holding region 77 (a second region 80) having a width smaller than the width of the linear part 66 is formed at the linear part 66 of the interchannel region 65. This can generate a depletion layer, which is generated by junction (p-n junction) between the second region 80 and the drain region 63, along the linear part 66 of the interchannel region 65. Accordingly, it is possible to reduce the electric field generated immediately below the linear part 66 of the interchannel region 65 by virtue of the depletion layer. As a result, it is possible to reduce the electric field generated at the gate insulating film 72 evenly over all.

Furthermore, the gate breakdown voltage holding region 77 (a second region 80) is not formed at a limb part (i.e., a part of the unit cell 71 where a channel is to be formed) of the channel region 62. Hence, it is also possible to control the channel characteristics with a high degree of accuracy.

In addition, the drain exposed region 83 may have, between the same and a limb part (a part other than a central part) of the bottom face 76, a step $S_2$ by projecting a central part of the bottom face 76 of the source trench 74 to a position flush with the surface 59 of the epitaxial layer 58 as is the case with the MIS transistor 97 in FIG. 8.

Such a structure can be obtained by, for example, forming the annular source trench 74 in the process step illustrated in FIG. 7B.

In such a case, since an area of junction between the polysilicon layer 88 and the drain exposed region 83 can be increased, it is possible to weaken the electric field applied to the polysilicon layer 88. As a result, it is possible to decrease leakage of electric current between the polysilicon layer 88 and the drain exposed region 83.

Third Preferred Embodiment

FIGS. 9(a) and 9(b) are schematic plan views of a trench gate-type MIS transistor 101 according to a Third Preferred Embodiment of the present invention, FIG. 9(a) illustrates a general view, and FIG. 9(b) illustrates an enlarged view of an inner part. FIG. 10 are sectional views of the trench gate-type MIS transistor 101 in FIGS. 9(a) and 9(b), and illustrate cutting planes respectively along cutting plane lines E-E, F-F and G-G in FIG. 9(b).

The MIS transistor 101 is a trench gate-type DMISFET (Double Diffused Metal Insulator Semiconductor Field Effect Transistor) in which SiC is employed, and has, for example, a chip shape having a square planar view as illustrated in FIG. 9(a). The chip-shaped MIS transistor 101 has a length of approximately several millimeters respectively in the vertical direction and the lateral direction on the plane of paper of FIG. 9(a).

On the surface of the MIS transistor 101, a source pad 102 is formed. The source pad 102 has a substantially square planar view with four corners curved outward and is formed so as to cover substantially the whole area of the surface of the MIS transistor 101. The source pad 102 is provided with a removal region 103 formed around the center of one side thereof. The removal region 103 is a region where the source pad 102 is not formed.

A gate pad 104 is located at the removal region 103. A space is provided between the gate pad 104 and the source pad 102, so that the gate pad 104 and the source pad 102 are insulated from each other.

Next, the inner structure of the MIS transistor 101 will be explained.

The MIS transistor 101 is provided with a substrate 105 made of n⁺ type (a concentration of $1\times10^{18}$ to $1\times10^{21}$ cm$^{-3}$, for example) SiC. The substrate 105 functions as a drain of the MIS transistor 101 in the Third Preferred Embodiment and has a surface 106 (an upper face) which is a Si face and a reverse face 107 (a lower face) which is a C face.

On the surface 106 of the substrate 105, an epitaxial layer 108 made of n⁻ type SiC having a concentration (e.g., a concentration of $1\times10^{15}$ to $1\times10^{17}$ cm$^{-3}$) lower than that of the substrate 105 is laminated. The thickness of the epitaxial layer 108 functioning as a semiconductor layer is, for example, 1 μm to 100 μm. The epitaxial layer 108 is formed on the substrate 105 by so-called epitaxial growth. The epitaxial layer 108 formed on the surface which is a Si face is grown on the Si face functioning as a growth principal face. Consequently, a surface 109 of the epitaxial layer 108 formed by growth is a Si face similar to the surface 106 of the substrate 105.

In the MIS transistor 101, an active region 110 is formed to be located at a central part of the epitaxial layer 108, when viewed planarly, and functions as the MIS transistor 101, and a transistor periphery region 111 is formed to surround the active region 110, as illustrated in FIG. 9(a).

At the active region 110, a gate trench 112 is formed in a lattice shape on the epitaxial layer 108 (see FIG. 9(b)). The epitaxial layer 108 is sectioned by the gate trench 112 into a plurality of cells 113 respectively having a quadrangular (square) shape.

The cells 113 include a Schottky cell 114 and a p-n diode cell 115 having a plane area relatively smaller than that of the Schottky cell 114. For example, a Schottky cell 114 has an area corresponding to that of four p-n diode cells 115, and the length of one side of the Schottky cell 114 corresponds to twice as long as the length of one side of the p-n diode cell 115. In particular, the size of the p-n diode cell 115 has a length of approximately 6 μm respectively in the vertical direction and the lateral direction on the plane of paper of FIG. 9(b), while the size of the Schottky cell 114 has a length of approximately 12 μm respectively in the same directions.

Additionally, one Schottky cell 114 and a plurality of p-n diode cells 115 (twelve p-n diode cells 115 in this preferred embodiment) surrounding the Schottky cell 114 constitute one cell group, and such cell groups are further arranged in a matrix manner. In cell groups adjacent to each other share p-n diode cells 115. That is, a p-n diode cell 115 surrounding a Schottky cell 114 of one cell group is also used as a p-n diode cell 115 surrounding a Schottky cell 114 of another cell group adjacent to the one cell group.

As elements common to a Schottky cell 114 and a p-n diode cell 115, the epitaxial layer 108 has an n⁺ type (a concentration of $1\times10^{18}$ to $1\times10^{21}$ cm$^{-3}$, for example) source region 117, a p-type (a concentration of $1.0\times10^{16}$ cm$^{-3}$ to $1.0\times10^{19}$ cm$^{-3}$, for example) channel region 118 and a drain region 119 in this order from the surface 109 side toward a reverse face 116 side.

The drain region 119 is an n⁻ type region where the state immediately after epitaxial growth is maintained, and is linked as a unit at a bottom part of all cells 113 and shared thereby. That is, the gate trench 112 exposes the source region 117 and the channel region 118 to a side face 124 and sections each cell 113 so that the deepest part thereof is positioned at a middle part of the drain region 119.

Such a gate trench 112 includes a linear part 120 extended linearly respectively in the longitudinal direction and the transverse direction along four side faces of each cell 113 between adjacent cells 113, and an intersection part 121 where a linear part 120 extended in the longitudinal direction intersects with a linear part 120 extended in the transverse direction.

On the inner face of the gate trench 112, a gate insulating film 122 is formed so as to cover the whole area thereof. Regarding the gate insulating film 122, the thickness of a part on a bottom face 123 of the gate trench 112 is larger than the thickness of a part on the side face 124 of the gate trench 112.

Additionally, by filling the inner side of the gate insulating film 122 at the gate trench 112 with polysilicon, a gate electrode 125 is buried in the gate trench 112. In such a manner, a vertical MIS transistor structure 101 (first and second MIS transistor structures) is constructed in which the source region 117 and the drain region 119 are arranged at each Schottky cell 114 and each p-n diode cell 115 so as to be isolated with the channel region 118 interposed therebetween in a vertical direction perpendicular to the surface 109 of the epitaxial layer 108.

At a central part of a Schottky cell 114, an HD source trench 126 functioning as a second source trench having a square planar view is formed so as to lie from the surface 109 of the epitaxial layer 108 through the source region 117 and the channel region 118 to the drain region 119 (see the cross section F-F and the cross section G-G in FIGS. 9(b) and 10). The depth of the HD source trench 126 is equal to that of the gate trench 112.

The HD source trench 126 is provided with a p-type (a concentration of $1 \times 10^{17}$ to $9 \times 10^{19}$ cm$^{-3}$, for example) HD breakdown voltage holding region 127 (a second breakdown voltage holding region). The HD breakdown voltage holding region 127 is formed by intersection of a bottom face 128 of the HD source trench 126 and the side face 129, and is formed in an annular shape to reach an annular edge part 130 surrounding the periphery of the bottom face 128 and the channel region 118 exposed from the edge part 130 to the side face 129 of the HD source trench 126. This forms a Schottky region 131 having a square planar view comprising a part of the drain region 119, at a central part of the bottom face 128 of the HD source trench 126 surrounded by the HD breakdown voltage holding region 127.

The Schottky region 131 is formed to have an area not to link with a depletion layer generated at a p-n junction part (a body diode 132) of the Schottky region 131 and the HD breakdown voltage holding region 127, and a length $L_1$ of one side thereof is, for example, equal to or larger than 4 μm.

On the other hand, at a central part of the p-n diode cell 115, a Di source trench 133 functioning as a first source trench having a square planar view is formed so as to lie from the surface 109 of the epitaxial layer 108 through the source region 117 and the channel region 118 to the drain region 119 (see the cross section E-E and the cross section G-G in FIGS. 9(b) and 10). The depth of the Di source trench 133 is equal to that of the gate trench 112. Moreover, the area of the Di source trench 133 is smaller than that of the Schottky region 131, and a length $L_2$ of one side thereof is approximately 3 μm.

The Di source trench 133 is provided with a p-type (a concentration of $1 \times 10^{17}$ to $9 \times 10^{19}$ cm$^{-3}$, for example) Di breakdown voltage holding region 134 (a first breakdown voltage holding region). The Di breakdown voltage holding region 134 is formed on the whole area of a bottom face 135 of the Di source trench 133, is further formed by intersection of the bottom face 135 and the side face 136, and is formed in a bowl shape to reach an annular edge part 137 surrounding the periphery of the bottom face 135 and the channel region 118 exposed from the edge part 137 to the side face 136 of the Di source trench 133.

Moreover, the Di source trench 133 is provided with a p$^+$ type (a concentration of $1.0 \times 10^{18}$ cm to $2.0 \times 10^{21}$ cm$^{-3}$, for example) bottom channel contact region 138 formed at a surface part of the Di breakdown voltage holding region 134 at a central part of the bottom face 135 thereof. By ohmic contact between the bottom channel contact region 138 and an electrode, it is possible to establish contact (connect electrically) with the channel region 118 of the p-n diode cell 115 via the Di breakdown voltage holding region 134.

Additionally, since the Di breakdown voltage holding region 134 is formed at the Di source trench 133, the p-n diode cell 115 is constructed by p-n junction between the Di breakdown voltage holding region 134 and the drain region 119, has a bottom channel contact region 138 functioning as a contact at the anode side, and incorporates therein the body diode 139 having the substrate 105 functioning as a contact at the cathode side.

Moreover, a G breakdown voltage holding region 140 (a relay region) is formed at each intersection part 121 of the gate trench 112 sectioning a plurality of cells 113.

The G breakdown voltage holding region 140 is formed at the whole area of the bottom face 123 of the gate trench 112 at the intersection part 121, and is further formed so as to lie from the bottom face 123 to the corner edge part 141 of the gate trench 112 formed below each corner part of each cell 113 facing the intersection part 121 and the channel region 118 immediately above the corner edge part 141.

That is, the G breakdown voltage holding region 140 is formed in a square slightly larger than the intersection part 121 of the gate trench 112 when viewed planarly, and each corner thereof goes into each corner part of each cell 113 facing the intersection part 121. Moreover, the concentration of the G breakdown voltage holding region 140 is higher than the concentration of the channel region 118 and is higher than the concentration of the drain region 119, and is, for example, $1 \times 10^{17}$ to $9 \times 10^{19}$ cm$^{-3}$.

With relay of the G breakdown voltage holding region 140, it is possible to establish contact with the HD breakdown voltage holding region 127 of the Schottky cell 114 via the bottom channel contact region 138→the Di breakdown voltage holding region 134→the channel region 118 of the p-n diode cell 115→the G breakdown voltage holding region 140→the channel region 118 of the Schottky cell 114, as indicated by a solid arrow in the cross section G-G in FIG. 10.

At the transistor periphery region 111, a plurality of (four in the Third Preferred Embodiment) p-type guard rings 142 are formed with an interval from the active region 110 so as to surround the active region 110 at a surface part of the epitaxial layer 108. The guard rings 142 can be formed in an ion implantation process step equal to the step of forming the p-type channel region 118. Each guard ring 142 is formed to have a quadrangular collar planar view along the outer periphery of the MIS transistor 101 when viewed planarly.

On the epitaxial layer 108, an interlayer insulating film 143 made of SiO$_2$ is laminated so as to coat the gate electrode 125.

The interlayer insulating film 143 and the gate insulating film 122 are provided with contact holes 144 and 145 having a diameter larger than that of the HD source trench 126 and the Di source trench 133.

On the interlayer insulating film 143, a source electrode 146 is formed. The source electrode 146 goes into all HD source trenches 126 and all Di source trenches 133 collectively via each contact hole 144 or, 145.

The source electrode 146 contacts the Schottky region 131, the HD breakdown voltage holding region 127 and the source region 117 in this order from the bottom side of the HD source trench 126 at the Schottky cell 114. Moreover, the source electrode 146 contacts the bottom channel contact region 138, the Di breakdown voltage holding region 134 and the source region 117 in this order from the bottom side of the Di source trench 133 at the p-n diode cell 115. That is, the source electrode 146 is wiring common to all cells 113.

Additionally, an interlayer insulating film 143 (not illustrated) is formed on the source electrode 146, and the source electrode 146 is connected electrically with the source pad 102 (see FIG. 9(a)) via the interlayer insulating film 143 (not illustrated). On the other hand, the gate pad 104 (see FIG. 9(a)) is connected electrically with the gate electrode 125 via gate wiring (not illustrated) installed on the interlayer insulating film 143 (not illustrated).

Moreover, the source electrode 146 has a polysilicon layer 147 functioning as a barrier formation layer, an interlayer 148 and a metal layer 149 in this order from a contact side to contact the epitaxial layer 108.

The polysilicon layer 147 is a doped layer formed using doped polysilicon which is doped with impurity, and is a high concentration doped layer which is doped with impurity of a high concentration, for example, equal to or higher than $1 \times 10^{15}$ cm$^{-3}$, or preferably $1 \times 10^{19}$ to $1 \times 10^{21}$ cm$^{-3}$. As impurity to form the polysilicon layer 147 as a doped layer (including a high concentration doped layer), n-type impurity such as N (nitrogen), P (phosphorus) or As (arsenic), or p-type impurity such as Al (aluminum) or B (boron) can be used. Moreover, the thickness of the polysilicon layer 147 is, for example, 5000 Å to 10000 Å.

Moreover, in the Third Preferred Embodiment, the polysilicon layer 147 is formed so as to cover the whole surface of the cell 113 exposed in the contact holes 144 and 145 and contacts all of the Schottky region 131, the HD breakdown voltage holding region 127 and the source region 117 in the HD source trench 126, and all of the bottom channel contact region 138, the Di breakdown voltage holding region 134 and the source region 117 in the Di source trench 133.

Additionally, the polysilicon layer 147 forms a Schottky junction with the source region 117 at the Schottky cell 114. This forms a hetero junction having a junction barrier (height of a junction barrier of 1 eV to 1.5 eV, for example) lower than the diffusion potential (e.g., 2.8 eV to 3.2 eV) of a body diode 150 (a diode formed by p-n junction between the channel region 118 and the drain region 119) incorporated respectively in the Schottky cell 114 and the p-n diode cell 115, between the polysilicon layer 147 and the Schottky region 131. This forms a hetero junction diode 151 (HD) between the source electrode 146 and the Schottky region 131, at the Schottky cell 114.

Moreover, the polysilicon layer 147 forms an ohmic contact with the source region 117 and the bottom channel contact region 138 at the p-n diode cell 115.

The interlayer 148 is a metal layer 149 laminated on the polysilicon layer 147, and is composed of a single layer of a layer containing Ti (titanium) or a plurality of layers including a layer containing Ti. A layer containing Ti can be formed using Ti, TiN (titanium nitride) or the like. Moreover, the thickness of the interlayer 148 is, for example, 200 nm to 500 nm.

The metal layer 149 is laminated on the interlayer 148 and can be formed using Al (aluminum), Au (gold), Ag (silver), Cu (copper), Mo (molybdenum), alloy thereof, and a metal material containing the same, for example. The metal layer 149 forms an outermost layer of the source electrode 146. Moreover, the thickness of the metal layer 149 is, for example, 1 µm to 5 µm.

As a combination of the polysilicon layer 147, the interlayer 148 and the metal layer 149 described above, a laminated structure (polysilicon/Ti/TiN/Al) in which polysilicon (a polysilicon layer 147), Ti (an interlayer 148), TiN (an interlayer 148) and Al (a metal layer 149) are laminated in this order is used in the Third Preferred Embodiment. Moreover, the metal layer 149 preferably further has a Mo layer. Since Mo has a high melting point, it is possible to suppress dissolved loss of the metal layer 149 due to heat generated when a large amount of electric current flows to the source electrode 146, if the metal layer 149 includes a Mo layer.

On the reverse face 107 of the substrate 105, a drain electrode 152 is formed so as to cover the whole area thereof. The drain electrode 152 is an electrode common to all cells 113. As the drain electrode 152, a laminated structure (Ti/Ni/Au/Ag) in which Ti, Ni, Au and Ag are laminated in this order from the substrate 105 side can be applied, for example.

FIGS. 11A to 11F are schematic sectional views for illustrating a part of the manufacturing process steps of the trench gate-type MIS transistor 101 in FIG. 10 in the order of processing, and illustrate cutting planes at the same positions as FIG. 10.

For manufacturing the MIS transistor 101, a SiC crystal is grown on the surface 106 (a Si face) of the substrate 105 as illustrated in FIG. 11A by an epitaxial growth method such as a CVD method, an LPE method or an MBE method, while conducting doping with n-type impurity (e.g., N (nitrogen), P (phosphorus), As (arsenic) or the like). This forms the n$^-$ type epitaxial layer 108 on the substrate 105.

P-type impurity (e.g., Al (aluminum), B (boron) or the like) is then implanted (injected) from the surface 109 of the epitaxial layer 108 to the inside of the epitaxial layer 108.

N-type impurity is then implanted (injected) from the surface 109 of the epitaxial layer 108 to the inside of the epitaxial layer 108.

The epitaxial layer 108 is then heat-treated at, for example, 1400° C. to 2000° C. This activates ions in p-type impurity and n-type impurity implanted into the surface part of the epitaxial layer 108, and forms the channel region 118, the source region 117 and the guard ring 142 simultaneously in accordance with the position of implantation. Moreover, the drain region 119 where the state immediately after epitaxial growth is maintained is formed at a base layer part of the epitaxial layer 108.

Next, as illustrated in FIG. 11B, etching is applied to the epitaxial layer 108 using a mask having an opening at a region where the gate trench 112, the HD source trench 126 and the Di source trench 133 are to be formed. This achieves dry etching of the epitaxial layer 108 from the surface 109 (a Si face), and forms the gate trench 112, the HD source trench 126 and the Di source trench 133 simultaneously.

Moreover, at the same time, a number of cells 113 sectioned by the gate trench 112 are formed at the epitaxial layer 108. In addition, mixed gas (SF$_6$/O$_2$ gas) including SF$_6$ (sulfur hexafluoride) and O$_2$ (oxide) or mixed gas (SF$_6$/O$_2$/HBr gas) including SF$_6$, O$_2$ and HBr (hydrogen bromide) can be used as etching gas, for example.

Next, as illustrated in FIG. 11C, a resist 153 having an opening to expose the intersection part 121 of the gate trench 112, the edge part 130 of the HD source trench 126, and the bottom face 135 and the edge part 137 of the Di source trench 133 is formed on the epitaxial layer 108.

P-type impurity is then implanted (injected) toward the intersection part 121 of the gate trench 112, the HD source trench 126 and the Di source trench 133 exposed from the opening of the resist 153. In this process, p-type impurity is also implanted into the side faces 124, 129 and 136, since the side face 124 of the gate trench 112 (an intersection part 121), the side face 129 of the HD source trench 126 and the side face 136 of the Di source trench 133 are not covered with the resist 153. Thereafter, the epitaxial layer 108 is heat-treated at, for example, 1400° C. to 2000° C. This activates ions in p-type impurity implanted into the drain region 119, and forms the G breakdown voltage holding region 140, the HD breakdown voltage holding region 127 and the Di breakdown voltage holding region 134 simultaneously. Moreover, at the same time, the Schottky region 131 is formed at a part, which has been covered with the resist 153, of the bottom face 128 of the HD source trench 126.

Next, as illustrated in FIG. 11D, a resist 154 having an opening formed at a region where the bottom channel contact region 138 of the Di source trench 133 is to be formed is formed on the epitaxial layer 108.

P-type impurity is then implanted (injected) toward the central part (a Di breakdown voltage holding region 134) of the bottom face 135 of the Di source trench 133 exposed from the opening of the resist 154. Thereafter, the epitaxial layer 108 is heat-treated at, for example, 1400° C. to 2000° C. This activates ions in p-type impurity implanted into the Di breakdown voltage holding region 134, and forms the bottom channel contact region 138.

Next, as illustrated in FIG. 11E, $SiO_2$ material is laminated from a part above the epitaxial layer 108 by a CVD method. This forms the gate insulating film 122.

Doped polysilicon material is then laminated from a part above the epitaxial layer 108 by a CVD method. After lamination, etch back is applied to polysilicon material until the etch back face becomes flush with the surface 109 of the epitaxial layer 108. Only polysilicon material remaining in the HD source trench 126 and the Di source trench 133 is then removed by dry etching. This forms the gate electrode 125 made of polysilicon material remaining in the gate trench 112.

Next, as illustrated in FIG. 11F, $SiO_2$ material is laminated from a part above the epitaxial layer 108 by a CVD method. This forms the interlayer insulating film 143. Continuous patterning is then applied to the interlayer insulating film 143 and the gate insulating film 122 by a well-known patterning technique. This forms the contact holes 144 and 145 at the interlayer insulating film 143 and the gate insulating film 122.

Polysilicon material is then laminated by a CVD method until the contact holes 144 and 145 are filled. Thereafter, n-type or p-type impurity is implanted (injected) into the laminated polysilicon material. Here, implantation conditions vary according to the type of impurity and acceleration energy is, for example, 10 keV to 100 keV. This forms the polysilicon layer 147.

Thereafter, the MIS transistor 101 in FIG. 10 is obtained by forming the interlayer 148, the metal layer 149, the drain electrode 152 and the like.

The MIS transistor 101 is utilized, for example, as a switching element of a drive circuit (an inverter circuit) of an electric motor (an example of an inductive load). In such a case, electric current flowing to the electric motor is switched on/off by turning on/off predetermined voltage (voltage equal to or higher than gate threshold voltage) to the gate pad 104 in a state where drain voltage is applied (across a source and a drain) across the source pad 102 (a source electrode 146) and the drain electrode 152 so that the drain side becomes positive.

When electric current flowing to the electric motor is interrupted (that is, the gate voltage is turned off), counter electromotive force is generated at a motor coil of the electric motor. Due to the counter electromotive force, voltage is sometimes applied across the source and the drain so that the source side becomes positive.

In such a case, the following problem occurs when electric current flows to the motor coil as reflux current, for example, by rectification of the body diode 150.

That is, when a positive hole (a hole) transfers from the p-type channel region 118 constituting the body diode 150 to the n-type drain region 119 and electric current flows, a majority carrier electron sometimes recombines with a positive hole which has transferred from the p-type channel region 118 around the gate trench 112 (e.g., a position lateral to the gate trench 112) at the n-type drain region 119. Accordingly, energy generated by combination may possibly cause a crystal defect of SiC in the epitaxial layer 108 to expand in a direction parallel to the lamination direction of the epitaxial layer 108 and reach the path (e.g., a channel) of drain current in an ON state. Thereby, the ON resistance may possibly increase when a channel is formed around the side face 124 of the gate trench 112 at the channel region 118 for the switching operation by the MIS transistor 101.

Thus, in the MIS transistor 101, the polysilicon layer 147 forms a hetero junction with the drain region 119 (a Schottky region 131) and incorporates therein the hetero junction diode 151. Accordingly, electric current flows preferentially to the hetero junction diode 151, and it is possible to decrease or eliminate electric current flowing to the body diode 150. In such a manner, electric current which has flown through the MIS transistor 101 can be made to flow to the electric motor as reflux current, for example.

As described above, since electric current in an OFF state flows to the hetero junction diode 151 formed in the HD source trench 126 at the center of the Schottky cell 114, carrier transfer around the gate trench 112 (that is, between the p-type channel region 118 and the n-type drain region 119) rarely occurs. Accordingly, it is possible to prevent recombination of a positive hole and an electron in the drain region 119. As a result, it is possible to suppress expansion of a crystal defect of SiC at the epitaxial layer 108, and it is therefore possible to suppress an increase in the ON resistance of the transistor. Moreover, it is possible to decrease or eliminate electric current flowing to the body diode 150, and it is therefore possible to reduce loss in operation of the MIS transistor 101.

Furthermore, in the MIS transistor 101, a length $L_1$ of one side of the Schottky region 131 constituting the hetero junction diode 151 is set not to link with a depletion layer generated at the body diode 132. Accordingly, it is possible to prevent an electric current path from being closed by the depletion layer while the hetero junction diode 151 operates. As a result, it is possible to lower the ON resistance of the hetero junction diode 151.

Moreover, in an OFF state (that is, in a state where gate voltage is 0V), electric field is applied to the gate insulating film 122 interposed between the gate electrode 125 and the epitaxial layer 108.

The electric field is generated due to the potential difference between the gate electrode 125 and the epitaxial layer 108. Additionally, on the bottom face 123 of the gate trench 112, an extremely strong electric field is generated, since an equipotential surface of an extremely high electric potential based on the gate electrode 125 (0V) is distributed and furthermore the interval between equipotential surfaces is small. When the drain voltage is 900V, for example, an equipotential surface of 900V is distributed around the reverse face 107 of the substrate 105 in contact with the drain electrode 152, voltage drop occurs more at a position farther from the reverse face 107 of the substrate 105 and nearer to the surface 109 side of the epitaxial layer 108, and an equipotential surface of approximately several tens of volts is distributed around the bottom face 123 of the gate trench 112. Accordingly, an extremely strong electric field toward the gate electrode 125 side is generated at the bottom face 123 of the gate trench 112. Especially, when the gate trench 112 is formed in a lattice shape and cells 113 having a quadrangular prism shape are arranged at window parts of the lattice-shaped gate trench 112 as is the case with the MIS transistor 101, a dielectric breakdown of the gate insulating film 122 tends to occur especially around the corner edge part 141 of the gate trench 112 formed at each corner part of the cell 113.

Thus, in the MIS transistor 101, the G breakdown voltage holding region 140 is formed at the corner edge part 141 of the gate trench 112. This can form the body diode 155 around the corner edge part 141 of the gate trench 112 by p-n junction between the G breakdown voltage holding region 140 and the drain region 119. In the MIS transistor 101, the HD breakdown voltage holding region 127 is further formed at the edge part 130 of the HD source trench 126 of the Schottky cell 114, and the Di breakdown voltage holding region 134 is formed at the bottom face 135 and the edge part 137 of the Di source trench 133 of the p-n diode cell 115. Accordingly, it is possible to form an annular body diode 132 surrounding the edge part 130 of the HD source trench 126 by p-n junction between the HD breakdown voltage holding region 127 and the drain region 119, and p-n junction between the Di breakdown voltage holding region 134 and the drain region 119. Moreover, it is possible to form the body diode 139 having a bowl shape covering the bottom part of the Di source trench 133.

Existence of a depletion layer generated at the body diodes 132 and 139 can prevent an equipotential surface from going into a space between the gate trench 112 and the HD source trench 126 and into a space between the gate trench 112 and the Di source trench 133, and keep an equipotential surface away from the gate insulating film 122. As a result, it is possible to prevent denseness of equipotential surfaces around the corner edge part 141 of the gate trench 112. As a result, it is possible to weaken the electric field applied to the gate insulating film 122, and it is therefore possible to prevent a dielectric breakdown.

Moreover, in the MIS transistor 101, the G breakdown voltage holding region 140 is formed to reach the channel region 118 immediately above the corner edge part 141, while no channel is formed at the corner part of the cell 113 or, even when a channel is formed, only a small amount of electric current flows to the channel. Consequently, by forming the G gate breakdown voltage holding region 140 so as to reach a part of the channel region 118 immediately above the corner edge part 141, it is possible to further enhance the breakdown prevention effect of the gate insulating film 122 while exerting little impact on the performance of the device.

Fourth Preferred Embodiment

FIG. 12 are schematic sectional views of a trench gate-type MIS transistor 161 according to a Fourth Preferred Embodiment of the present invention, and illustrate cutting planes at the same positions as FIG. 10. In FIG. 12, parts corresponding to the respective parts illustrated in FIG. 10 are attached with reference signs identical to those attached to the respective parts and explanation of the parts will be omitted.

Although the HD source trench 126 in the Third Preferred Embodiment has a planar shape having no step formed on a side face thereof, an HD source trench 162 of the MIS transistor 161 according to the Fourth Preferred Embodiment includes an HD upper trench 163 (a second upper trench) having a depth from a surface 109 of an epitaxial layer 108 to a channel region 118 and an HD lower trench 164 (a second lower trench) having a width smaller than that of the HD upper trench 163 and a depth from the channel region 118 to a drain region 119. This causes the HD source trench 162 to have a two-step structure in which a side face of the HD upper trench 163 spreads having one step lateral to a side face of the HD lower trench 164.

Additionally, at a step part between the HD upper trench 163 and the HD lower trench 164, the channel region 118 is exposed annularly, and a $p^+$ type HD channel contact region 165 is formed at the exposed part.

Similarly, a Di source trench 166 of the MIS transistor 161 includes a Di upper trench 167 (a first upper trench) having a depth from the surface 109 of the epitaxial layer 108 to the channel region 118 and a Di lower trench 168 (a first lower trench) having a width smaller than that of the Di upper trench 167 and a depth from the channel region 118 to the drain region 119. This causes the Di source trench 166 to have a two-step in which a side face of the Di upper trench 167 spreads having one step lateral to a side face of the Di lower trench 168.

Additionally, at a step part between the Di upper trench 167 and the Di lower trench 168, the channel region 118 is exposed annularly, and a $p^+$ type Di channel contact region 169 is formed at the exposed part.

FIGS. 13A to 13G are schematic sectional views for illustrating a part of the manufacturing process steps of the trench gate-type MIS transistor 161 in FIG. 12 in the order of processing, and illustrate cutting planes at the same positions as FIG. 12.

For manufacturing the MIS transistor 161, as illustrated in FIG. 13A, the n⁻ type epitaxial layer 108 is formed on a substrate 105 and then the channel region 118, a source region 117, the drain region 119 and the guard ring 142 are formed simultaneously on the epitaxial layer 108 by a method similar to FIG. 11A.

Next, as illustrated in FIG. 13B, etching is applied to the epitaxial layer 108 using a mask having an opening at a region where the HD upper trench 163 and the Di upper trench 167 are to be formed. This achieves dry etching of the epitaxial layer 108 from the surface 109 (a Si face), and forms the HD upper trench 163 and the Di upper trench 167 simultaneously.

Next, as illustrated in FIG. 13C, a resist 170 having an opening formed to expose the whole area of the bottom face of the HD upper trench 163 and the Di upper trench 167 is formed on the epitaxial layer 108.

P-type impurity is then implanted (injected) toward the HD upper trench 163 and the Di upper trench 167 exposed from the opening of the resist 170. Thereafter, the epitaxial layer 108 is heat-treated at, for example, 1400° C. to 2000° C. This activates ions in p-type impurity implanted into the channel region 118 through the HD upper trench 163 and the Di upper trench 167, and forms the HD channel contact region 165 and the Di channel contact region 169 simultaneously.

Next, as illustrated in FIG. 13D, etching is applied to the epitaxial layer 108 using a mask having an opening at a region where a gate trench 112, the HD lower trench 164 and the Di lower trench 168 are to be formed. This achieves dry etching of the epitaxial layer 108 from the bottom face of the HD upper trench 163 and the Di upper trench 167, and forms the HD lower trench 164 and the Di lower trench 168 simultaneously. Moreover, at the same time, dry etching is applied to the epitaxial layer 108 from the surface 109, so that the gate trench 112 is formed.

Next, as illustrated in FIG. 13E, a resist 171 having an opening formed to expose an edge part 130 of the HD source trench 162, and a bottom face 135 and an edge part 137 of the Di source trench 166 is formed on the epitaxial layer 108.

P-type impurity is then implanted (injected) toward the HD source trench 162 and the Di source trench 166 exposed from the opening of the resist 171. Thereafter, the epitaxial layer 108 is heat-treated at, for example, 1400° C. to 2000° C. This activates ions in p-type impurity implanted into the drain region 119, and forms the HD breakdown voltage holding region 127 and the Di breakdown voltage holding region 134 simultaneously. Moreover, at the same time, the Schottky region 131 is formed at a part, which has been covered with the resist 171, of the bottom face 128 of the HD source trench 162.

Next, as illustrated in FIG. 13F, SiO$_2$ material is laminated from a part above the epitaxial layer 108 by a CVD method. This forms the gate insulating film 122. Thereafter, the gate electrode 125 is formed at the inner side of the gate insulating film 122 by the same method as that of FIG. 11E.

Figure 13G:
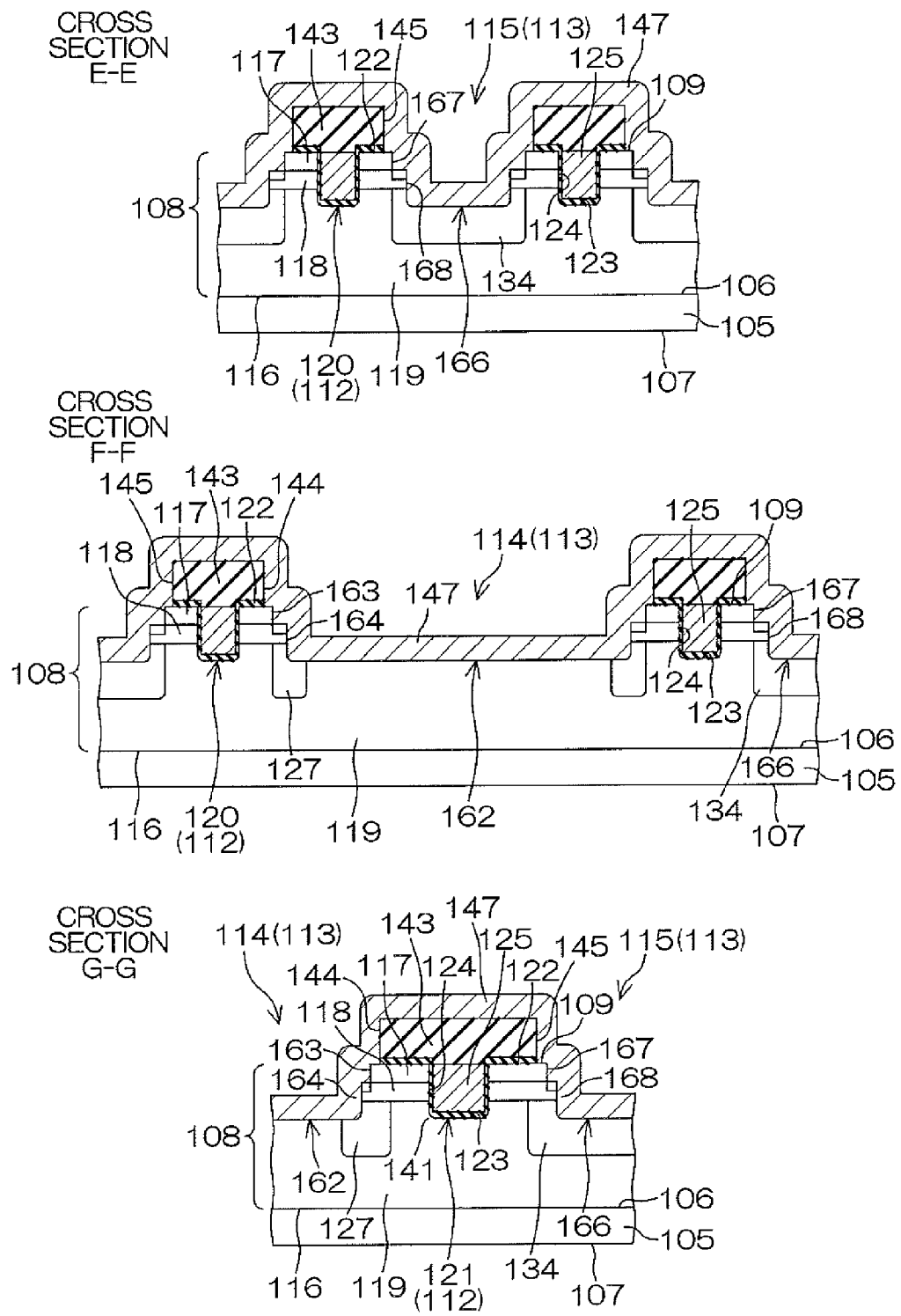
FIG. 13G are views for illustrating the next process step of FIG. 13F.

Next, as illustrated in FIG. 13G, the interlayer insulating film 143 is formed by a method similar to that of FIG. 11F and then the polysilicon layer 147 is formed. Thereafter, the MIS transistor 161 in FIG. 12 is obtained by forming the interlayer 148, the metal layer 149, the drain electrode 152 and the like.

As described above, with the MIS transistor 161, it is also possible to achieve the effects similar to those of the MIS transistor 101.

In addition, with the MIS transistor 161 in which each of the trenches 162 and 166 has a two-step structure having the HD channel connect region 165 and the Di channel contact region 169, it is possible to establish direct contact with the channel region 118 of each of the Schottky cell 114 and the p-n diode cell 115. As a result, it is possible to control the electric potential of the channel region 118 precisely.

Moreover, it is possible to omit the bottom channel contact region 138 of the p-n diode cell 115 or the G breakdown voltage holding region 140 of the intersection part 121 of the gate trench 112.

Fifth Preferred Embodiment

FIGS. 14(a) and 14(b) are schematic plan views of a planar gate-type MIS transistor 181 according to a Fifth Preferred Embodiment of the present invention, FIG. 14(a) illustrates a general view, and FIG. 14(b) illustrates an enlarged view of an inner part. FIG. 15 are sectional views of the planar gate-type MIS transistor 181 in FIGS. 14(a) and 14(b), and illustrate cutting planes respectively along cutting plane lines H-H and I-I in FIG. 14(b). In FIGS. 14 and 15, parts corresponding to the respective parts illustrated in FIGS. 9 and 10 are attached with reference signs identical to those attached to the respective parts and explanation of the parts will be omitted.

Although examples of a trench gate-type MIS transistor 101 and 161 are described in the Third Preferred Embodiment and Fourth Preferred Embodiment, the present invention can also be employed in a planar gate-type transistor as is the case with the MIS transistor 181 according to the Fifth Preferred Embodiment.

In the planar-type MIS transistor 181, the gate insulating film 182 is not formed on the inner face of the gate trench 112 but formed on the surface 109 of the epitaxial layer 108, and the gate electrode 183 is formed thereon.

As described above, with the MIS transistor 181, it is also possible to achieve effects similar to those of the MIS transistor 101 described above.

Sixth Preferred Embodiment

Figure 16:
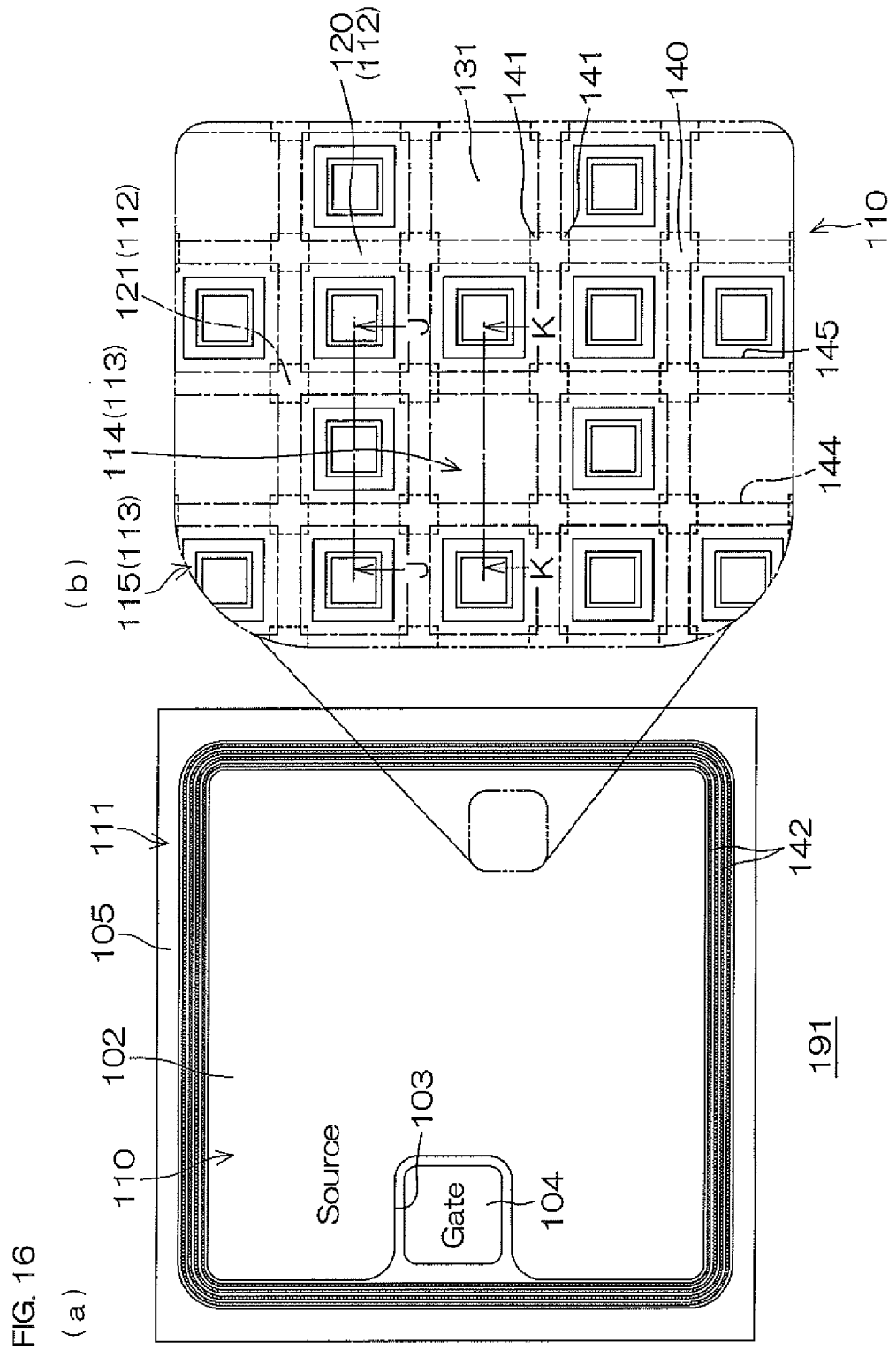
FIGS. 16(a) and 16(b) are schematic plan views of a trench gate-type MIS transistor according to the Fourth Preferred Embodiment of the present invention.

FIGS. 16(a) and 16(b) are schematic plan views of a trench gate-type MIS transistor 191 according to a Sixth Preferred Embodiment of the present invention, FIG. 16(a) illustrates a general view, and FIG. 16(b) illustrates an enlarged view of an inner part. FIG. 17 are sectional views of the trench gate-type MIS transistor 191 in FIGS. 16(a) and 16(b), and illustrate cutting planes respectively along cutting plane lines J-J and K-K in FIG. 16(b). In FIGS. 16 and 17, parts corresponding to the respective parts illustrated in FIGS. 9 and 10 are attached with reference signs identical to those attached to the respective parts and explanation of the parts will be omitted.

Although the Schottky cell 114 in the examples described in the Third Preferred Embodiment to Fifth Preferred Embodiment has an area larger than that of the p-n diode cell 115, the Schottky cell 114 may have the same area as that of the p-n diode cell 115.

In the MIS transistor 191 according to the Sixth Preferred Embodiment, a Schottky cell 114 and a p-n diode cell 115 having the same area and a quadrangular planar view are arranged in a matrix manner and the Schottky cell 114 is surrounded by the p-n diode cells 115.

Moreover, the Schottky cell 114 has the source region 117, the channel region 118 and the drain region 119, and is not provided with the MIS transistor 101 structure in which the HD source trench 126 is formed. The Schottky region 131 appears on a plane equal to that of the surface 109 of the epitaxial layer 108.

As described above, with the MIS transistor 191, it is also possible to achieve effects similar to those of the MIS transistor 101 described above.

In addition, with the MIS transistor 191 which does not need a space for forming the MIS transistor structure, it is possible to expose a sufficient area of the Schottky region 131 even if the cell 113 is not large, and it is therefore possible to lower the resistance of the hetero junction diode 151.

Although preferred embodiments of the present invention have been described above, the present invention can also be implemented with other preferred embodiments.

For example, the source electrode 37 or 87 does not need to have a laminated structure including the polysilicon layer 38 or 88, the interlayer 39 or 89, and the metal layer 40 or 90, but may comprise only a metal layer. In such a case, material of the metal layer is preferably made of one compound selected from the group consisting of Ni, Ti, Al and Mo, for example.

For example, it is also possible to employ a structure in which the conductivity type of the respective semiconductor parts of the MIS transistors 1, 47, 51, 97, 101, 161, 181 and 191 are inverted. For example, in the MIS transistor 1, p-type parts may be of n-type, and n-type parts may be of p-type.

Moreover, in the MIS transistors 1, 47, 51, 97, 101, 161, 181 and 191, a layer consisting of a semiconductor layer is not limited to an epitaxial layer made of SiC, but may be a layer comprising a wide band gap semiconductor or the like other than SiC, for example, GaN (band gap $Eg_{GaN}$=approximately 3.4 eV) or diamond (band gap $Eg_{dia}$=approximately 5.5 eV).

Moreover, the shape of each unit cell 21 is not limited to a rectangular parallelepiped (a quadrangular prism), but may be another polygonal prism such as a triangular column, a pentagonal column or a hexagonal prism, for example.

Moreover, the planar view of each unit cell 71 is not limited to a square (a quadrangle), but may be another polygon such as a triangle, a pentagon or a hexagon, for example.

Moreover, the planar view of each cell 113 is not limited to a square (a quadrangle), but may be other polygons such as a triangle, a pentagon or a hexagon, or may further be a stripe shape, for example.

Moreover, the Schottky cell 114 may have an area corresponding to that of, for example, nine p-n diode cells 115 as illustrated in FIGS. 18(a) and 18(b), and the length of one side of the Schottky cell 114 may correspond to three times as much as the length of one side of the p-n diode cell 115.

Moreover, as the source electrode 146, for example, the polysilicon layer 147 and the interlayer 148 may be omitted so that a monolayer structure of the metal layer 149 is used, so as to form a Schottky junction with the Schottky region 131. This forms a Schottky barrier diode at the Schottky cell 114, instead of the hetero junction diode 151.

A semiconductor power device of the present invention may be incorporated in, for example, a power module to be used in an inverter circuit constituting a drive circuit for driving an electric motor to be utilized as a power source such as an electric vehicle (including a hybrid vehicle), a train or an industrial robot. Moreover, a semiconductor power device of the present invention may also be incorporated in a power module to be used in an inverter circuit for converting power generated by a solar cell, a wind power generator or another power-generating unit (especially, a private electric generator) so as to fit with electric power of a commercial power supply.

Since the preferred embodiments of the present invention are mere specific examples used for demonstrating technical content of the present invention, the present invention should not be interpreted to be limited to the specific examples, and the spirit and scope of the present invention are limited only by accompanying claims.

Moreover, the constituent elements described in each preferred embodiment of the present invention can be combined with each other in the scope of the present invention.

The present application corresponds to Japanese Patent Application No. 2011-020731 filed with the Japan Patent Office on Feb. 2, 2011, and Japanese Patent Application No. 2011-224119 filed with the Japan Patent Office on Oct. 11, 2011, and the entire disclosure of the applications is incorporated herein by reference.

DESCRIPTION OF SIGNS

1 MIS transistor
5 Substrate
8 Epitaxial layer
9 Surface (of epitaxial layer)
12 Channel region
13 Drain region
14 Source region
15 Gate trench
16 Linear part (of gate trench)
17 Intersection part (of gate trench)
18 Side face (of gate trench)
19 Bottom face (of gate trench)
20 Corner part (of unit cell)
21 Unit cell
22 Gate insulating film
23 Gate electrode
24 Source trench
25 Side face (of source trench)
26 Bottom face (of source trench)
27 Gate breakdown voltage holding region
28 Source breakdown voltage holding region
29 First region
30 Second region
31 Corner edge part (of gate trench)
32 Edge part (of source trench)
33 Drain exposed region
37 Source electrode
38 Polysilicon layer
41 First part (of polysilicon layer)
42 Second part (of polysilicon layer)
43 Body diode
47 MIS transistor
51 MIS transistor
55 Substrate
58 Epitaxial layer
59 Surface (of epitaxial layer)
62 Channel region
63 Drain region
64 Source region
65 Interchannel region
66 Linear part (of interchannel region)
67 Intersection part (of interchannel region)
70 Corner part (of unit cell)
71 Unit cell
72 Gate insulating film
73 Gate electrode
74 Source trench
75 Side face (of source trench)
76 Bottom face (of source trench)
77 Gate breakdown voltage holding region
78 Source breakdown voltage holding region
79 First region
80 Second region
81 Corner part (of channel region)
82 Edge part (of source trench)
83 Drain exposed region
87 Source electrode
88 Polysilicon layer
91 First part (of polysilicon layer)
92 Second part (of polysilicon layer)
93 Body diode
97 MIS transistor
101 MIS transistor
105 Substrate
108 Epitaxial layer
109 Surface (of epitaxial layer)
112 Gate trench
113 Cell
114 Schottky cell
115 P-n diode cell
116 Reverse face (of epitaxial layer)
117 Source region
118 Channel region
119 Drain region
122 Gate insulating film
123 Bottom face (of gate trench)
124 Side face (of gate trench)
125 Gate electrode
126 SBD source trench
127 SBD breakdown voltage holding region
128 Bottom face (of SBD source trench)
129 Side face (of SBD source trench)
130 Edge part (of SBD source trench)
131 Schottky region
132 Body diode
133 Di source trench
134 Di breakdown voltage holding region
135 Bottom face (of Di source trench)
136 Side face (of Di source trench)
137 Edge part (of Di source trench)
138 Bottom channel contact region
139 Body diode
140 G breakdown voltage holding region
141 Corner edge part (of gate trench)
150 Body diode
151 Schottky barrier diode
152 Drain electrode
155 Body diode
161 MIS transistor
162 SBD source trench
163 SBD upper trench
164 SBD lower trench
165 SBD channel contact region
166 Di source trench
167 Di upper trench
168 Di lower trench
169 Di channel contact region 181 MIS transistor
182 Gate insulating film
183 Gate electrode
191 MIS transistor

The invention claimed is:

1. A semiconductor device having a semiconductor layer including a wide band gap semiconductor, comprising:
a first conductivity-type source region formed so as to be exposed to a surface side of the semiconductor layer;
a second conductivity-type channel region formed at a reverse face side of the semiconductor layer with respect to the source region so as to contact the source region;
a first conductivity-type drain region formed at the reverse face side of the semiconductor layer with respect to the channel region so as to contact the channel region;
a source trench, which lies from the surface of the semiconductor layer through the source region and the channel region to the drain region, and has a side face and a bottom face;
a gate insulating film formed so as to contact the channel region;
a gate electrode facing the channel region with the gate insulating film interposed therebetween; and
a first breakdown voltage holding region of a second conductivity type formed selectively on the side face or the bottom face of the source trench;
wherein the semiconductor device includes a barrier formation layer, which is joined with the drain region in the source trench, for forming, by junction with the drain region, a junction barrier lower than a diffusion potential of a body diode formed by p-n junction between the channel region and the drain region; and
wherein the first breakdown voltage holding region is formed selectively at an edge part of the source trench where the side face intersects with the bottom face, at a region of a part of the source trench so as to expose the drain region to the bottom face of the source trench.

2. The semiconductor device according to claim 1, wherein the barrier formation layer is made of one compound selected from the group consisting of Ni, Ti, Al, Mo and Poly-Si.

3. The semiconductor device according to claim 1, wherein the semiconductor layer includes:
a lattice-shaped gate trench that lies from the surface of the semiconductor layer through the source region and the channel region to the drain region and has a side face and a bottom face; and
a plurality of polygonal prism-shaped unit cells that are sectioned by the lattice-shaped gate trench and have a plurality of corner parts;
wherein each unit cell has the source region, the channel region and the drain region;
wherein the gate insulating film is formed on the side face and the bottom face of the gate trench;
wherein the gate electrode is buried in the gate trench so as to face the channel region with the gate insulating film interposed therebetween; and
wherein the barrier formation layer is joined with the drain region exposed to the bottom face of the source trench.

4. The semiconductor device according to claim 3, wherein the semiconductor layer further includes a second breakdown voltage holding region of a second conductivity type, which is formed selectively at a corner edge part of the gate trench formed at the corner part of the unit cell.

5. The semiconductor device according to claim 4, wherein the second breakdown voltage holding region is formed so as to reach a part immediately above the corner edge part at the channel region.

6. The semiconductor device according to claim 4, wherein the second breakdown voltage holding region is formed selectively at an intersection part of the lattice-shaped gate trench.

7. The semiconductor device according to claim 3, wherein the semiconductor layer further includes a third breakdown voltage holding region of a second conductivity type, which is formed on a bottom face of a linear part of the lattice-shaped gate trench and has a width smaller than a width of the linear part.

8. The semiconductor device according to claim 7, wherein an impurity concentration of the third breakdown voltage holding region is higher than an impurity concentration of the second breakdown voltage holding region.

9. The semiconductor device according to claim 7, wherein a thickness of the third breakdown voltage holding region is smaller than a thickness of the second breakdown voltage holding region.

10. The semiconductor device according to claim 1, wherein:
the channel region is formed to have a polygonal planar view having a plurality of corner parts;
the channel regions are arranged in a matrix manner;
the source region is formed in a well manner so as to be exposed to a surface of each channel region;
the gate insulating film is formed on the channel region exposed to the surface of the semiconductor layer; and
the barrier formation layer is joined with the drain region exposed to the bottom face of the source trench.

11. The semiconductor device according to claim 10, wherein the semiconductor layer further includes an interchannel region extended between adjacent channel regions, and a fourth breakdown voltage holding region of a second conductivity type formed selectively at a corner part of the interchannel region formed at the corner part of the channel region.

12. The semiconductor device according to claim 11, wherein the semiconductor layer further includes a fifth breakdown voltage holding region of a second conductivity type, which is formed at a linear part of the interchannel region and has a width smaller than a width of the linear part.

13. The semiconductor device according to claim 1, wherein the drain region has a step part formed by projecting the bottom face of the source trench selectively to the surface side of the semiconductor layer.

* * * * *